(12) United States Patent
Chen et al.

(10) Patent No.: US 10,901,815 B2
(45) Date of Patent: Jan. 26, 2021

(54) DATA SHARING SYSTEM AND DATA SHARING METHOD THEREFOR

(71) Applicant: Shanghai Cambricon Information Technology Co., Ltd, Pudong New Area (CN)

(72) Inventors: Tianshi Chen, Pudong New Area (CN); Shengyuan Zhou, Pudong New Area (CN); Shaoli Liu, Pudong New Area (CN)

(73) Assignee: SHANGHAI CAMBRICON INFORMATION TECHNOLOGY CO., LTD, Pudong New Area (CN)

( * ) Notice: Subject to any disclaimer, the term of this patent is extended or adjusted under 35 U.S.C. 154(b) by 0 days.

(21) Appl. No.: 16/693,918

(22) Filed: Nov. 25, 2019

(65) Prior Publication Data
US 2020/0117519 A1    Apr. 16, 2020

Related U.S. Application Data

(63) Continuation-in-part of application No. PCT/CN2018/092829, filed on Jun. 26, 2018.

(30) Foreign Application Priority Data

Jun. 26, 2017   (CN) ........................ 2017 1 0497394
Jun. 29, 2017   (CN) ........................ 2017 1 0515517
(Continued)

(51) Int. Cl.
*G06F 9/54*      (2006.01)
*G06F 9/22*      (2006.01)
(Continued)

(52) U.S. Cl.
CPC .............. *G06F 9/544* (2013.01); *G06F 9/223* (2013.01); *G06F 12/0875* (2013.01);
(Continued)

(58) Field of Classification Search
CPC ................. G06F 12/1081; G06F 13/00; G06F 13/1652–1663; G06F 13/28;
(Continued)

(56) References Cited

U.S. PATENT DOCUMENTS 5,191,649 A * 3/1993 Cadambi ................. G06F 15/17
                                                                              709/225
5,408,629 A * 4/1995 Tsuchiva ................... G06F 9/52
                                                                              711/148
(Continued)

FOREIGN PATENT DOCUMENTS

CN            101013410 A      8/2007
CN            102866912 A      1/2013
(Continued)

OTHER PUBLICATIONS

PCT/CN2018/092829—Search Report, dated Sep. 17, 2018, 10 pages. (no English translation).
(Continued)

*Primary Examiner* — Brendan Y Higa
(74) *Attorney, Agent, or Firm* — Getech Law LLC; Jun Ye

(57) ABSTRACT

A data sharing system may include a storage module and at least two processing modules. The at least two processing modules may share the storage module and the at least two processing modules communicate to implement data sharing. A data sharing method for the data sharing system is provided. According to the disclosure, a storage communication overhead may be reduced, and a data access delay may be effectively reduced.

10 Claims, 21 Drawing Sheets

(30) Foreign Application Priority Data

| | | |
|---|---|---|
| Aug. 21, 2017 | (CN) | 2017 1 0721049 |
| Apr. 28, 2018 | (CN) | 2018 1 0407185 |
| May 16, 2018 | (CN) | 2018 1 0467383 |
| Jun. 20, 2018 | (CN) | 2018 1 0641721 |

(51) Int. Cl.

| | |
|---|---|
| *G06F 12/0875* | (2016.01) |
| *G06F 13/28* | (2006.01) |
| *G06N 3/063* | (2006.01) |
| *G06N 3/04* | (2006.01) |
| *G06N 3/08* | (2006.01) |
| *G06F 30/27* | (2020.01) |
| *G06F 15/163* | (2006.01) |
| *H04L 12/70* | (2013.01) |

(52) U.S. Cl.
CPC ............ *G06F 13/28* (2013.01); *G06F 15/163* (2013.01); *G06F 30/27* (2020.01); *G06N 3/04* (2013.01); *G06N 3/0454* (2013.01); *G06N 3/063* (2013.01); *G06N 3/088* (2013.01); *G06F 2212/452* (2013.01); *H04L 2012/5686* (2013.01)

(58) Field of Classification Search
CPC .......................... G06F 15/163–17393; G06F 15/17306–17337; G06F 30/20; G06F 30/27; G06F 30/30; G06N 3/02–0445; G06N 3/06–3/063; G06N 3/08; H04L 2012/5686
See application file for complete search history.

(56) References Cited

U.S. PATENT DOCUMENTS

| | | | | |
|---|---|---|---|---|
| 5,909,681 | A * | 6/1999 | Passera | G06F 9/5027 |
| 6,078,665 | A * | 6/2000 | Anderson | H04L 9/001 |
| | | | | 380/28 |
| 6,484,240 | B1 * | 11/2002 | Cypher | G06F 12/0831 |
| | | | | 711/141 |
| 6,654,845 | B1 * | 11/2003 | Morris | H04L 45/00 |
| | | | | 710/1 |
| 6,956,579 | B1 * | 10/2005 | Diard | G06F 12/0284 |
| | | | | 345/502 |
| 2003/0140179 | A1 * | 7/2003 | Wilt | G06F 9/3851 |
| | | | | 719/321 |
| 2004/0143559 | A1 * | 7/2004 | Ayala | G05B 13/0265 |
| | | | | 706/13 |
| 2016/0285722 | A1 * | 9/2016 | Min | H04L 47/20 |
| 2016/0342887 | A1 * | 11/2016 | Tieleman | G06N 3/0454 |
| 2018/0012328 | A1 * | 1/2018 | Boles | G06T 1/60 |
| 2018/0300631 | A1 * | 10/2018 | Roy | G06N 3/0454 |
| 2018/0314928 | A1 * | 11/2018 | Li | G06N 3/0454 |

FOREIGN PATENT DOCUMENTS

| | | |
|---|---|---|
| CN | 104021042 A | 9/2014 |
| CN | 105512723 A | 4/2016 |
| CN | 106909971 A | 6/2017 |
| WO | 2015042904 A1 | 4/2015 |

OTHER PUBLICATIONS

CN 201710721049X, Official Action dated Apr. 23, 2020, 12 pages. (No English Translation).

Yu Zijian et a.; "FPGA-based Accelerator for Convolutional Neural Network"; Computer Engineering, Jan. 19, 2017, 7 pages.

Zhang Shijin et al; "Cambricon-X: An accelerator for sparse neural networks", 2016 49Th Annual IEEE/ACM International Symposium on Microarchitecture (MICRO), IEEE, Oct. 15, 2016, 12 pages.

Shaoli Liu et al; "Cambricon: An Instruction Set Architecture for Neural Networks", 2016 ACM/IEEE 43rd Annual International Symposium on Computer Architecture, Aug. 25, 2016, 13 pages.

* cited by examiner

DATA SHARING SYSTEM AND DATA SHARING METHOD THEREFOR

TECHNICAL FIELD

The disclosure relates to a sharing system, and particularly to a data sharing system and a data sharing method.

BACKGROUND

Along with constant development of an artificial intelligence technology, a machine learning technology and a deep neural network technology are widely applied, for example, to voice recognition, image processing, data analysis, an advertisement recommendation system, and automobile automatic drive. In practice, the machine learning technology and the deep neural network have been applied to all aspects of life. These technologies can be applied so widely because of their advantage on processing big data. However, along with the constant increase of data volume, the computation amount is also increased. Therefore, how to effectively organize and store data becomes an inevitable problem for design of a System on Chip (SoC).

As illustrated in FIG. 1, in an existing SoC, data of an Application Specific Integrated Circuit (ASIC) module is usually stored in a private Static Random Access Memory (SRAM) during machine learning (deep learning or other may be may performed), and the data is placed in an off-chip Dynamic Random Access Memory (DRAM) or an on-chip SRAM (like an SRAM cache) through an Advanced eXtensible Interface (AXI) bus for indirect interaction with another module. This may increase a system overhead, prolong a data reading delay and increase energy consumption in data sharing and interaction.

SUMMARY

Based on the above problems, a main purpose of the disclosure is to disclose a data sharing system and a data sharing method, so as to solve at least one of the above technical problems.

In order to achieve the purpose, as an aspect of the disclosure, a data sharing system is provided. The aspect may include a first processing module that includes a first internal storage unit; and a second processing module configured to transmit, to the first processing module, a request signal that includes a data address in the first internal storage unit, wherein the first processing module is configured to retrieve, upon receiving the request signal, data at the data address in the first internal storage unit, and transmit the retrieved data to the second processing module.

In some embodiments, the first processing module may be further configured to transmit an acknowledge signal to the second processing module upon receiving the request signal.

In some embodiments, each of the first processing module and the second processing module may include a physical processor.

In some embodiments, the physical processor may include an artificial neural network processor configured to perform artificial neural network forward computations.

In some embodiments, the artificial neural network processor may include an instruction caching unit configured to read an instruction from a Direct Memory Access (DMA) and cache the read instruction.

In some embodiments, the artificial neural network processor may include a controlling unit configured to read the instruction from the instruction caching unit and decode the instruction into one or more microinstructions.

In some embodiments, the artificial neural network processor may further include: a primary computation module configured to transmit an input neuron vector of a current layer to one or more secondary computation modules via an H tree module for reverse training of each layer of a neural network. The H tree module may be configured to merge one or more output neuron values from the one or more secondary computation modules into an intermediate result vector. The primary computation module may be further configured to generate a final result vector based on the intermediate result vector.

In some embodiments, the DMA may be further configured to write data into corresponding data caching units of the primary computation module and each secondary computation module from an external address space, or read data into the external address space from the data caching units.

In some embodiments, the artificial neural network processor may further include a primary computation module connected with a branch processing module. The branch processing module may be further connected to multiple secondary processing modules. The branch processing module may be configured to forward data or instructions between the primary computation module and the secondary processing modules.

The disclosure may further include a method for data sharing. The method may include transmitting, by a second processing module to a first processing module, a request signal that includes a data address in a first internal storage unit in the first processing module; retrieving, by the first processing module, upon receiving the request signal, data at the data address in the first internal storage unit; and transmitting, by the first processing module, the retrieved data to the second processing module.

The method may further include transmitting, by the first processing module, an acknowledge signal to the second processing module upon receiving the request signal. Each of the first processing module and the second processing module may include a physical processor. The physical processor includes an artificial neural network processor configured to perform artificial neural network forward computations. The artificial neural network processor may include an instruction caching unit configured to read an instruction from a Direct Memory Access (DMA) and cache the read instruction.

In some embodiments, the method may further include reading, by a controlling unit of the artificial neural network processor, the instruction from the instruction caching unit and decode the instruction into one or more microinstructions.

In some embodiments, the method may further include transmitting, by a primary computation module of the artificial neural network processor, an input neuron vector of a current layer to one or more secondary computation modules via an H tree module for reverse training of each layer of a neural network; merging, by the H tree module, one or more output neuron values from the one or more secondary computation modules into an intermediate result vector; and generating, by the primary computation module, a final result vector based on the intermediate result vector.

In some embodiments, the method may further include writing, by the DMA, data into corresponding data caching units of the primary computation module and each secondary computation module from an external address space.

In some embodiments, the method may further include reading, by the DMA, data into the external address space from the data caching units.

The artificial neural network processor further includes a primary computation module connected with a branch processing module, wherein the branch processing module is further connected to multiple secondary processing modules.

In some embodiments, the method may further include: forwarding, by the branch processing module, data or instructions between the primary computation module and the secondary processing modules.

In some embodiments of the disclosure, the preset rule may include a communication protocol, a transport protocol, a handshake protocol and/or a bus protocol.

In some embodiments of the disclosure, the communication may performed through a preset rule may include the follows. The at least two processing modules may include a first processing module and a second processing module. The first processing module sends a request signal and a corresponding data address to the second processing module, and the second processing module returns a valid signal and data to the first processing module according to the request signal and the corresponding data address to implement data sharing.

In some embodiments of the disclosure, the at least two processing modules may include a physical processor.

In some embodiments of the disclosure, the physical processor may include a neural network processor.

In some embodiments of the disclosure, the neural network processor may include a device configured to perform an artificial neural network forward computation.

In some embodiments of the disclosure, the device configured to perform the artificial neural network forward computation may include an instruction caching unit and a Direct Memory Access (DMA).

The instruction caching unit may be configured to read an instruction in through the DMA and cache the read-in instruction.

In some embodiments of the disclosure, the device configured to perform the artificial neural network forward computation may further include a controlling unit configured to read the instruction from the instruction caching unit and decode the instruction into a microinstruction.

In some embodiments of the disclosure, the device configured to perform the artificial neural network forward computation may further include an H tree module, and the H tree module may be replaced by a branch processing module.

A primary computation module may be connected with the branch processing module, and the branch processing module may be connected with multiple secondary processing modules.

The branch processing module may be configured to perform and forward data or instruction between the primary computation module and the secondary processing modules.

In some embodiments of the disclosure, the DMA may be further configured to write data into corresponding data caching units of the primary computation module and each secondary computation module from an external address space or read data into the external address space from the data caching units.

In some embodiments of the disclosure, the at least two processing modules may include two processors in different structures, and one of the two processors in different structures is a neural network processor.

In some embodiments of the disclosure, the at least two processing modules may include at least two processor cores of a processor, and the at least two processor cores are processor cores in the same/different structures.

In some embodiments of the disclosure, the at least two processing modules may include at least two computation units of a processor core, and the at least two computation units are computation units in the same/different structures.

In some embodiments of the disclosure, the sharing system may further include at least two storage units, connected with at least one of the at least two computation units respectively. Any one of the at least two computation units may be connected with one or more storage units, and the at least two storage units may share the storage module.

In some embodiments of the disclosure, the at least two computation units may share the same storage unit, or exclusively use a storage unit respectively or partially may share the same storage unit and partially exclusively use a storage unit respectively.

In some embodiments of the disclosure, the at least two processing modules may include three computation units of a processor core, and the at least two storage units may include two storage units. The two computation units may be connected with one storage unit, and the other computation unit may be connected with the other storage unit.

In order to achieve the purpose, in another aspect of the disclosure, a data sharing method is provided, which may include the following steps.

The at least two processing modules communicate through a preset rule to implement data sharing, and the at least two processing modules may share a storage module.

In some embodiments of the disclosure, the preset rule may include a communication protocol, a transport protocol, a handshake protocol and/or a bus protocol.

In some embodiments of the disclosure, the communication through a preset rule may include the follows. The at least two processing modules may include a first processing module and a second processing module. The first processing module sends a request signal and a corresponding data address to the second processing module, and the second processing module returns a valid signal and data to the first processing module according to the request signal and the corresponding data address to implement data sharing.

In some embodiments of the disclosure, the at least two processing modules may include a physical processor.

In some embodiments of the disclosure, the physical processor may include a neural network processor.

In some embodiments of the disclosure, the neural network processor may include a device configured to perform an artificial neural network forward computation.

In some embodiments of the disclosure, the device configured to perform the artificial neural network forward computation may include an instruction caching unit and a DMA.

The instruction caching unit may be configured to read an instruction in through the DMA and cache the read-in instruction.

In some embodiments of the disclosure, the device configured to perform the artificial neural network forward computation may further include a controlling unit, and the controlling unit may be configured to read the instruction from the instruction caching unit and decode the instruction into a microinstruction.

In some embodiments of the disclosure, the device configured to perform the artificial neural network forward computation may further include an H tree module, a primary computation module and multiple secondary computation modules.

In a stage where computation for reverse training of each layer of a neural network is started, the primary computation module transmits an input neuron vector of this layer to all the secondary computation modules through the H tree module. After a computation process of the secondary computation modules is completed, the H tree module merges an output neuron value of each secondary computation module into an intermediate result vector step by step. The primary computation module completes subsequent computation by using the intermediate result vector.

In some embodiments of the disclosure, the DMA may further write data into corresponding data caching units of the primary computation module and each secondary computation module from an external address space or read data into the external address space from the data caching units.

In some embodiments of the disclosure, the at least two processing modules may include two processors in different structures, and one of the two processors in different structures is a neural network processor.

In some embodiments of the disclosure, the at least two processing modules may include at least two processor cores of a processor, and the at least two processor cores are processor cores in the same/different structures.

In some embodiments of the disclosure, the at least two processing modules may include at least two computation units of a processor core, and the at least two computation units are computation units in the same/different structures.

In some embodiments of the disclosure, at least two storage units may be further adopted in the data sharing method.

The at least two storage units may be connected with at least one of the at least two computation units respectively. Any one of the at least two computation units may be connected with one or more storage units, and the at least two storage units may share the storage module.

In some embodiments of the disclosure, the at least two computation units may share the same storage unit, or exclusively use a storage unit respectively or partially may share the same storage unit and partially exclusively use a storage unit respectively.

In some embodiments of the disclosure, the at least two processing modules may include three computation units of a processor core, and the at least two storage units may include two storage units. Two computation units may be connected with one storage unit, and the other computation unit may be connected with the other storage unit.

An aspect of the disclosure provides an information processing device, which may include a storage module and a data processing module. The storage module may be configured to receive and store input data, instruction and output data, and the input data may include one or more key features. The data processing module may be configured to judge the key features included in the input data and score the input data in the storage module according to a judgment result.

In the solution, the input data is original input data or data obtained by preprocessing the original input data.

In the solution, the data processing module judging the key features included in the input data may include: the data processing module computing confidence of the key features included in the input data, in which the confidence may be the judgment result.

In the solution, data and an instruction may be stored in the storage module, and the data may include input data, input neurons, weights, output neurons and output data. The input data may be transmitted to each input neuron in an artificial neural network, thereby participating in subsequent computation. Values of the output neurons, in other words the judgment result and a score, may be taken as the output data.

In the solution, the data processing module may include a computation module configured to perform corresponding computation on the data stored in the storage module according to the instruction stored in the storage module and output a computational result to the storage module.

In the solution, the computation module may be configured to perform the corresponding computation on the data stored in the storage module according to the instruction stored in the storage module, and in each layer of the neural network, the computation module may include a first part including a multiplier, a second part including one or more adders, a third part including an activation function unit, and a fourth part including a vector processing unit. In the solution, the second part may include multiple adders, and the multiple adders form an adder tree.

In the solution, activation functions may be sigmoid, tan h, relu or softmax.

In the solution, the fourth part may include the vector processing unit, and the vector processing unit may perform pooling computation.

In the solution, the data processing module may further include an instruction cache and a neural network data cache. The instruction cache may be configured to cache the instruction, and the neural network data cache may be configured to cache weight data, input neurons and output neurons in the storage module.

In the solution, the neural network data cache may include a weight cache, an input neuron cache and an output neuron cache. The weight cache may be configured to cache the weight data; the input neuron cache may be configured to cache the input neurons; and the output neuron cache may be configured to cache and output the computational result, in other words the judgment result and/or the score, output by the computation module.

In the solution, the data processing module may further include a DMA, and the DMA may serve as a bridge connecting the storage module with each cache and may be configured to read/write the data and/or instruction stored in the storage module, store the read-out/written-out instruction into the instruction cache, store the read-out weights into the weight cache, store the read-out input neurons, in other words the input data, into the input neuron cache and store the output neurons, in other words the judgment result and/or the score received from the output neuron cache into the storage module.

In the solution, the data processing module may further include a controlling unit, and the controlling unit may be configured to read the instruction from the instruction cache, decode it into an instruction executable for the computation module and output it to the computation module.

In the solution, the data processing module may further include a scoring unit, and the scoring unit may be configured as follows. If the artificial neural network running in the information processing device obtains the judgment result and further obtains the score, the scoring unit does not participate in data processing, and if the artificial neural network running in the information processing device obtains no score but only the judgment result, the scoring unit may be configured to obtain the score according to the judgment result.

In the solution, the judgment result may be values of output neurons of a final output layer of the artificial neural network running in the information processing device, the values of the output neurons may be the confidence that the key features appear, and the confidence may be a natural number within a certain range. The score may be obtained as follows. A layer may be added after the final output layer of the artificial neural network running in the information processing device as a new final output layer. Values of input neurons of the new final output layer may be confidences that the key features appear. The new final output layer may have only one output neuron, the value of the output neuron may be the score and weights in computation of the new final output layer correspond to importance degrees of each key feature. If the layer has N+1 output neurons, a value range of the score is [0,N]. If the output neurons of the layer are numbered to be 0, 1, 2, ..., N, a value of the $i^{th}$ output neuron may be confidence $P_i$ corresponding to a score value i, and the value of a final score may correspond to the highest confidence, in other words, the score=$i_0$, $P_{i_0}$=max $\{P_i | i=0, 1, ..., N\}$.

In the solution, the score may be obtained as follows. After being obtained in the final output layer of the artificial neural network running in the information processing device, the confidence that each key feature appears may be taken as input of the scoring unit, and the scoring unit accordingly obtains the score.

In the solution, the information processing device may be an artificial neural network chip.

Another aspect of the disclosure provides an information processing method, for which an information processing device is adopted, the method including the follows.

A storage module may receive and store input data, an instruction and output data, and the input data may include one or more key features. A data processing module may judge the key features included in the input data and score the input data in the storage module according to a judgment result.

In the solution, the input data adopts original input data or data obtained by preprocessing the original input data.

In the solution, the data processing module judging the key features included in the input data may include: the data processing module computing confidence of the key features included in the input data, in which the confidence may be the judgment result.

In the solution, the storage module may store data and an instruction, and the data may include input data, input neurons, weights, output neurons and output data. The input data may be transmitted to each input neuron in an artificial neural network, thereby participating in subsequent computation. Values of the output neurons, in other words the judgment result and a score, may be taken as the output data.

In the solution, the data processing module may include a computation module, and the computation module may perform corresponding computation on the data stored in the storage module according to the instruction stored in the storage module and output a computational result to the storage module.

In the solution, the computation module may perform the corresponding computation on the data stored in the storage module according to the instruction stored in the storage module, and in each layer of the neural network, the computation performed by the computation module may include: a first part including a multiplier, a second part including one or more adders, a third part including an activation function unit and a fourth part including a vector processing unit.

In the solution, the second part may include multiple adders, the multiple adders form an adder tree.

In the solution, activation functions may be sigmoid, tan h, relu or softmax.

In the solution, the fourth part may include the vector processing unit, and the vector processing unit may perform pooling computation.

In the solution, the data processing module may further include an instruction cache and a neural network data cache. The instruction cache may be configured to cache the instruction. The neural network data cache may be configured to cache weight data, input neurons and output neurons in the storage module.

In the solution, the neural network data cache may include a weight cache, an input neuron cache and an output neuron cache. The weight cache may be configured to cache the weight data. The input neuron cache may be configured to cache the input neurons. The output neuron cache may be configured to cache and output the computational result, in other words the judgment result and/or the score, output by the computation module.

In the solution, the data processing module may further include a DMA, and the DMA may serve as a bridge connecting the storage module with each cache, read/write the data and/or instruction stored in the storage module, store the read-out/written-out instruction into the instruction cache, store the read-out weights into the weight cache, store the read-out input neurons, in other words the input data, into the input neuron cache and store the output neurons, in other words the judgment result and/or the score, received from the output neuron cache into the storage module.

In the solution, the data processing module may further include a controlling unit, and the controlling unit may read the instruction from the instruction cache, decode it into an instruction executable for the computation module and output it to the computation module.

In the solution, the data processing module may further include a scoring unit, and if the artificial neural network running in the information processing device obtains the judgment result and further obtains the score, the scoring unit does not participate in data processing. If the artificial neural network running in the information processing device obtains no score but only the judgment result, the scoring unit obtains the score according to the judgment result.

In the solution, the judgment result may include values of output neurons of a final output layer of the artificial neural network running in the information processing device, the values of the output neurons may be the confidences that the key features appear, and the confidence may be a natural number within a certain range. The score may be obtained as follows. A layer may be added after the final output layer of the artificial neural network running in the information processing device as a new final output layer. Values of input neurons of the new final output layer may be confidences that key features appear. The new final output layer has only one output neuron, the value of the output neuron is the score and weights in computation of the new final output layer correspond to importance degrees of each key feature. If the layer has N+1 output neurons, a value range of the score is [0,N]. If the output neurons of the layer are numbered to be 0, 1, 2, ..., N, a value of the $i^{th}$ output neuron corresponds to confidence $P_i$ corresponding to a score value i, and the value of a final score corresponds to highest confidence, in other words, the score=$i_0$, $P_{i_0}$=max $\{P_i | i=0, 1, ..., N\}$.

In the solution, the score may be obtained as follows. After being obtained in the final output layer of the artificial neural network running in the information processing device, the confidence of appearance of each key feature may be taken as input of the scoring unit, and the scoring unit accordingly obtains the score.

In the solution, the information processing device adopted for the information processing method is an artificial neural network chip.

Another aspect of the disclosure further provides an information processing system, which may include an information acquisition device, an information processing device, an interaction interface and a controlling device.

The information acquisition device may be configured to acquire external data and transmit the external data to the information processing device.

The information processing device may be configured to perform computational processing on the external data received from the information acquisition device and output a computational processing result to the interaction interface.

The interaction interface may be configured to display the computational result received from the information processing device and transmit an externally received operation or command to the controlling device.

The controlling device may be configured to control operations of the information acquisition device, the information processing device and the interaction interface according to the operation or command received from the interaction interface.

In the solution, the information acquisition device may include a character recognition device, an image recognition device and a voice recognition device.

The character recognition device may be configured to acquire text information in the external data.

The image recognition device may be configured to acquire picture or video information in the external data.

The voice recognition device may be configured to acquire audio information in the external data.

In the solution, the interaction interface may be a display screen of a mobile phone, a computer, a notebook computer or a tablet computer.

Another aspect of the disclosure further provides an information processing method, for which an information processing system is adopted, and the method may include the follows.

The information acquisition device may acquire external data and transmit the external data to an information processing device directly or after preprocessing.

The information processing device may perform computational processing on the external data or the external data preprocessed received from the information acquisition device and output a computational processing result to the interaction interface.

The interaction interface may display the computational result received from the information processing device.

In the solution, the information acquisition device may include a character recognition device, an image recognition device and a voice recognition device, and the information acquisition device acquiring the external data may include the follows.

The information acquisition device may adopt the character recognition device to acquire text information in the external data.

The information acquisition device may adopt the image recognition device to acquire picture or video information in the external data.

The information acquisition device may adopt the voice recognition device to acquire audio information in the external data.

According to an aspect of the disclosure, a task segmentation device is provided, which may include a granularity task segmentation unit configured to segment a task by adopting at least one granularity to form subtasks, and a task segmentation granularity selection unit configured to select the granularity to be adopted.

In some embodiments, the task segmentation device is configured for a neural network, and the granularity task segmentation unit may include at least one of the following units: a first granularity task segmentation unit, a second granularity task segmentation unit, a third granularity task segmentation unit, a fourth granularity task segmentation unit, and a fifth granularity task segmentation unit. The first granularity task segmentation unit may be configured to take the whole task as a subtask. The second granularity task segmentation unit may be configured to segment the task by selecting part of sample computation in the task as a subtask. The third granularity task segmentation unit may be configured to perform task segmentation according to layer types of the neural network, computation for layers of the same type being taken as a subtask. The fourth granularity task segmentation unit may be configured to perform task segmentation according to an interlayer structure of the neural network, in which computation for multiple adjacent layers may be taken as a subtask. The fifth granularity task segmentation unit may be configured to perform task segmentation according to intra-layer structures of the neural network to segment computation in the layers of the neural network into subtasks.

In some embodiments, the task segmentation granularity selection unit selects at least one of the first to fifth granularity task segmentation units for task segmentation on the basis of at least one of the count of samples to be processed of the neural network, a topological structure of the neural network and a computation amount of each layer.

In some embodiments, performing task segmentation according to the intra-layer structures of the neural network may include the follows. Task segmentation may be performed on convolutional layer computation, fully connected layer computation, pooling layer computation or active layer computation of the neural network.

In some embodiments, segmenting convolutional layer computation of the neural network may include the follows. Input neurons of a convolutional layer of the neural network form a three-dimensional matrix (Nfin, Nxin, Nyin). Weights form a four-dimensional matrix (Nfout, Nfout, Kx, Ky). Output neurons form a three-dimensional matrix (Nfout, Nxout, Nyout). Nfin represents the count of input feature image. (Nxin, Nyin) represents the size of input feature image. Nfout represents the count of output feature image. (Kx, Ky) represents the size of convolution kernel. (Nxout, Nyout) represents an output feature image size. All of Nfin, Nxin, Nyin, Kx, Ky, Nfout, Nxout, and Nyout are positive integers. Then, the output neurons are segmented according to a block size of (Bfout, Bxout, Byout), and the weights are simultaneously segmented according to a block size of (Bfout, Bfin, Bx, By). All of Bfout, Bxout, Byout, Bfout, Bfin, Bx and By are positive integers, and $0<Bfout \leq Nfout$, $0<Bxout \leq Nxout$, $0<Byout \leq Nyout$, $0<Bfin \leq Nfin$, $0<Bx \leq K$ and $0<By \leq Ky$.

According to another aspect of the disclosure, a task processing device is provided, which may include a task segmentation device and a task scheduling device. The task scheduling device may include a task queue unit configured to cache unscheduled tasks, a monitoring unit configured to monitor the working state of each core of a multi-core processor in real time, and a task scheduling unit configured to select a task to be scheduled from the unscheduled tasks and allocate and schedule the task to be scheduled to a target core according to the working state of each core.

In some embodiments, the task scheduling unit may be configured to allocate and schedule the task to be scheduled to the target core in at least one of the following manners. The task scheduling unit may be configured to make statistics on the count of tasks in a private task queue of each core and to select the core with the fewest tasks in the private task queue as the target core. The task scheduling unit may be configured to make statistics on time for completion of all the tasks in the private task queue of each core and to select the core of which the task completion time is shortest as the target core. The task scheduling unit may be configured to make statistics on a distribution condition of resources required by the task to be scheduled in all the cores, to select the core with the most resources as the target core, and to allocate the task to be scheduled to the target core by adopting a heuristic algorithm.

In some embodiments, the heuristic algorithm may include at least one of a genetic algorithm, an ant colony algorithm, and a simulated annealing algorithm.

In some embodiments, the task scheduling unit may be configured to perform task scheduling at a time interval T, and to select the task to be scheduled in at least one of the following manners.

The task scheduling unit may be configured to randomly select an unscheduled task. The task scheduling unit may be configured to select the unscheduled task of which estimated execution time is longest. The task scheduling unit may be configured to select the unscheduled task of which the estimated execution time is shortest. The task scheduling unit may be configured to select the unscheduled task occupying most resources and the unscheduled task occupying fewest resources.

In some embodiments, the working state of each core may include at least one of a utilization rate, a workload, a working frequency, the count of the tasks in the private task queue in the core and the task completion time in the core.

According to another aspect of the disclosure, a multi-core processor is provided, which may include J processing cores and a task processing device. J is a positive integer.

In some embodiments, a topological structure between the processing cores may adopt at least one of a one-dimensional linear structure, a two-dimensional mesh structure, a two-dimensional star structure, and a three-dimensional cube structure.

In some embodiments, the processing cores may include a neural network processing core, and the neural network processing core may include the following units: a storage unit, a data selection unit, a computation unit, and a controlling unit. The storage unit may be configured to store neurons, weights and instruction of a neural network. The data selection unit may be configured to receive input neurons and non-zero weight position information and select the neurons corresponding to non-zero weights. The computation unit may be configured to receive the neurons corresponding to the input non-zero weights and the corresponding non-zero weights and complete neural network training computation. The controlling unit may be configured to receive the instruction of the neural network and decode it to generate control information to control the data selection unit and the computation unit.

In some embodiments, the instruction may include at least one of a control instruction, a data transfer instruction, an operation instruction and a logical instruction.

In some embodiments, the operation instruction may be configured to complete arithmetic computation of the neural network, and may include at least one of a matrix operation instruction, a vector operation instruction, a scalar operation instruction, a convolutional neural network operation instruction, a fully connected neural network operation instruction, a pooling neural network operation instruction, a Restricted Boltzmann Machine (RBM) neural network operation instruction, a Local Response Normalization (LRN) neural network operation instruction, a Local Contrast Normalization (LCN) neural network operation instruction, a Long Short-Term Memory (LSTM) neural network operation instruction, a Recurrent Neural Networks (RNN) operation instruction, a Rectified Linear Unit (RELU) neural network operation instruction, a Parametric Rectified Linear Unit (PRELU) neural network operation instruction, a SIGMOID neural network operation instruction, a TANH neural network operation instruction and a MAXOUT neural network operation instruction.

According to another aspect of the disclosure, a task segmentation method is provided, which is adapted to a neural network. At least one of the following task segmentation manners is selected for task segmentation. The whole task is taken as a subtask. The task is segmented by selecting part of sample computation in the task as a subtask. Task segmentation may be performed according to layer types of the neural network, in which computation for layers of the same type may be taken as a subtask. Task segmentation may be performed according to an interlayer structure of the neural network, in which computation for multiple adjacent layers may be taken as a subtask. Task segmentation may be performed according to intra-layer structures of the neural network to segment computation in the layers of the neural network into subtasks.

In some embodiments, at least one unit in a task segmentation device is selected for task segmentation on the basis of at least one of the count of samples to be processed of the neural network, a topological structure of the neural network and a computation amount of each layer.

In some embodiments, performing task segmentation according to the intra-layer structures of the neural network may include: performing task segmentation on convolutional layer computation, fully connected layer computation, pooling layer computation or active layer computation of the neural network.

In some embodiments, segmenting convolutional layer computation of the neural network may include the follows. Input neurons of a convolutional layer of the neural network form a three-dimensional matrix (Nfin, Nxin, Nyin). Weights form a four-dimensional matrix (Nfout, Nfout, Kx, Ky) and output neurons form a three-dimensional matrix (Nfout, Nxout, Nyout). Nfin represents the count of input feature image. (Nxin, Nyin) is the size of input feature image. Nfout represents the count of output feature image. (Kx, Ky) represents a convolution kernel size. (Nxout, Nyout) represents the size of output feature image and all of NJfin, Nxin, Nyin, Kx, Ky, Nfout, Nxout, and Nyout are positive integers. Then, the output neurons are segmented according to a block size of (Bfout, Bxout, Byout), and the weights are simultaneously segmented according to a block size of (Bfout, Bfin, Bx, By). All of Bfout, Bxout, Byout, Bfout, Bfin, Bx and By are positive integers, $0<Bfout \leq Nfout$, $0<Bxout \leq Nxout$, $0<Byout \leq Nyout$, $0<Bfin \leq Nfin$, $0<Bx \leq K$ and $0<By \leq Ky$.

According to a further aspect of the disclosure, a task processing method is provided, which may include a task segmentation method and a task scheduling method. The task scheduling method may include the follows. Unscheduled tasks may be cached, and the unscheduled tasks may include subtasks segmented by any task segmentation device in the claims. The working state of each core of a multi-core processor may be monitored in real time. A task to be scheduled may be selected from the unscheduled tasks, and the task to be scheduled may be allocated and scheduled to a target core according to the working state of each core.

In some embodiments, allocating and scheduling the task to be scheduled to the target core may be performed in at least one of the following manners: making statistics on the count of tasks in a private task queue of each core and selecting the core with the fewest tasks in the private task queue as the target core; making statistics on time for completion of all the tasks in the private task queue of each core and selecting the core of which the task completion time is shortest as the target core; making statistics on a distribution condition of resources required by the task to be scheduled in all the cores and selecting the core with the most resources as the target core; allocating the task to be scheduled to the target core by adopting a heuristic algorithm.

In some embodiments, the heuristic algorithm may include at least one of a genetic algorithm, an ant colony algorithm and a simulated annealing algorithm.

In some embodiments, task scheduling may be performed at a time interval T, and the task to be scheduled may be selected in at least one of the following manners: randomly selecting an unscheduled task; selecting the unscheduled task of which estimated execution time is longest; selecting the unscheduled task of which the estimated execution time is shortest; selecting the unscheduled task occupying most resources; selecting the unscheduled task occupying fewest resources.

In some embodiments, the working state of each core may include at least one of a utilization rate, a workload, a working frequency, the count of the tasks in the private task queue in the core and the task completion time in the core.

According to an aspect of the disclosure, a processor is provided, which may include a task segmentation device and a hardware resource division device. The task segmentation device may be configured to perform task segmentation according to a task segmentation granularity. The hardware resource division device may be configured to divide hardware resources of the processor according to a task segmentation result.

In some embodiments, the processor may further include multiple Processing Elements (PEs), and the hardware resource division device may be configured to divide the multiple PEs of the processor according to the task segmentation result, for example, dividing the multiple PEs into multiple computation groups according to the task segmentation result so as to compute different forward and reverse paths in a batch or run different service requests respectively.

In some embodiments, the processor may dynamically regulate grouping of the multiple PEs according to the task segmentation result in the running process.

In some embodiments, the task segmentation device may include a task segmentation granularity selection unit and a granularity task segmentation unit.

The task segmentation granularity selection unit may be configured to select the granularity to be adopted. The granularity task segmentation unit may be configured to segment a task by adopting at least one granularity to form subtasks.

In some embodiments, the granularity task segmentation unit may include at least one of a first granularity task segmentation unit, a second granularity task segmentation unit, a third granularity task segmentation unit, a fourth granularity task segmentation unit, and a fifth granularity task segmentation unit.

The first granularity task segmentation unit may be configured to take the whole task as a subtask.

The second granularity task segmentation unit may be configured to segment the task by selecting part of sample computation in the task as a subtask.

The third granularity task segmentation unit may be configured to perform task segmentation according to layer types of a neural network, in which computation for layers of the same type may be taken as a subtask.

The fourth granularity task segmentation unit may be configured to perform task segmentation according to an interlayer structure of the neural network, in which computation for multiple adjacent layers may be taken as a subtask.

The fifth granularity task segmentation unit may be configured to perform task segmentation according to intralayer structures of the neural network to segment computation in the layers of the neural network into subtasks.

In some embodiments, the task segmentation granularity selection unit may select at least one of the first to fifth granularity task segmentation units for task segmentation on the basis of at least one of the count of samples to be processed of the neural network, a topological structure of the neural network and a computation amount of each layer.

In some embodiments, the processor may further include a task scheduling device. The processor is a multi-core processor, and the task scheduling device may include a task queue unit, a monitoring unit, and a task scheduling unit.

The task queue unit may be configured to cache unscheduled tasks.

The monitoring unit may be configured to monitor the working state of each core in real time.

The task scheduling unit may be configured to select a task to be scheduled from the unscheduled tasks and allocate and schedule the task to be scheduled to a target core according to the working state of each core.

In some embodiments, the task scheduling unit may be configured to allocate and schedule the task to be scheduled to the target core in at least one of the following manners.

The task scheduling unit may be configured to make statistics on the count of tasks in a private task queue of each core and to select the core with the fewest tasks in the private task queue as the target core.

The task scheduling unit may be configured to make statistics on time for completion of all the tasks in the private task queue of each core and to select the core of which the task completion time is shortest as the target core.

The task scheduling unit may be configured to make statistics on a distribution condition of resources required by the task to be scheduled in all the cores and to select the core with the most resources as the target core.

The task scheduling unit may be configured to allocate the task to be scheduled to the target core by adopting a heuristic algorithm.

According to another aspect of the disclosure, a combined processing device is provided. The combined processing device may include a processor, and interact with another processing device through an interconnection interface to complete a computational operation specified by a user together.

According to another aspect of the disclosure, a neural network chip is provided, and the neural network chip may include a processor or the combined processing device.

According to another aspect of the disclosure, an electronic equipment is provided, and the electronic equipment may include the neural network chip.

According to another aspect of the disclosure, a processing method is provided, which may include the follows.

A task segmentation device may perform task segmentation according to a task segmentation granularity.

A hardware resource division device may divide hardware resources of a processor according to a task segmentation result.

In some embodiments, in the step that the hardware resource division device divides the hardware resources of the processor according to the task segmentation result, the hardware resource division device may divide multiple PEs of the processor according to the task segmentation result, for example, the hardware resource may divide the multiple PEs into multiple computation groups according to the task segmentation result to compute different forward and reverse paths in a batch or run different service requests respectively.

In some embodiments, the processor may dynamically regulate grouping of the multiple PEs according to the task segmentation result in a running process.

In some embodiments, the step that the task segmentation device performs task segmentation according to the task segmentation granularity may include the follows.

The task segmentation granularity selection unit may select the granularity to be adopted.

The granularity task segmentation unit may segment a task of each divided hardware resource by adopting at least one granularity to form subtasks.

In some embodiments, the task segmentation granularity selection unit may select at least one of multiple granularity task segmentation units for task segmentation on the basis of at least one of the count of samples to be processed of a neural network, a topological structure of the neural network and a computation amount of each layer.

In some embodiments, the processing method may further include allocating and scheduling the task after task segmentation, and the processing method may include the followings:

caching unscheduled tasks;

monitoring the working state of each core of the processor in real time; and selecting a task to be scheduled from the unscheduled tasks, and allocating and scheduling the task to be scheduled to a target core according to the working state of each core.

In some embodiments, allocating and scheduling the task to be scheduled to the target core may be in at least one of the following manners:

making statistics on the count of tasks in a private task queue of each core and selecting the core with the fewest tasks in the private task queue as the target core;

making statistics on time for completion of all the tasks in the private task queue of each core and selecting the core of which the task completion time is shortest as the target core;

making statistics on a distribution condition of resources required by the task to be scheduled in all the cores and selecting the core with the most resources as the target core.

The task to be scheduled is allocated to the target core by adopting a heuristic algorithm.

According to an aspect of the disclosure, an information processing device is provided, which may include the follows: a storage module configured to acquire information data, the information data including at least one key feature and the storage module pre-storing true confidence corresponding to the key feature; an operational circuit configured to determine predicted confidence corresponding to the key feature according to the information data and judge whether the predicted confidence of the key feature exceeds a preset threshold value range of the true confidence corresponding to the key feature or not; a controlling circuit configured to control the storage module to modify the key feature or send out a modification signal to the outside if the predicted confidence exceeds the preset threshold value of the true confidence.

In a further implementation solution, the storage module may include a DMA, and the DMA may be electrically connected with the operational circuit, and may be configured to store the predicted confidence determined by computation of the operational circuit and send the true confidence and the predicted confidence into the operational circuit for comparison.

In a further implementation solution, the storage module may further include a storage unit, and the storage unit may be configured to acquire the information data from the outside of the information processing device and transmit it into the DMA for the operational circuit to call.

In a further implementation solution, the storage module may be further configured to store a neural network dedicated instruction and input neurons, output neurons and weights in a neural network. The information processing device may further include the follows: an instruction cache, an input neuron cache, a weight cache, and an output neuron cache.

The instruction cache may be configured to cache the dedicated instruction from the storage module for the controlling circuit to call. The input neuron cache may be configured to cache the neurons from the storage module for the operational circuit to call. The weight cache may be configured to cache the weights from the storage module for the operational circuit to call. The output neuron cache may be configured to store the output neurons obtained by the computation of the operational circuit.

In a further implementation solution, the operational circuit may be further configured to score the information data according to a judgment result of each key feature, or the operational circuit may be further configured to perform adaptive training on the neural network.

In a further implementation solution, determining the predicted confidence corresponding to the key feature according to the information data in the operational circuit may include: performing neural network computation by taking the information data as input of the neural network, in which the predicted confidence may be taken as output of the neural network.

In a further implementation solution, the information data may include at least one of a picture, a text, an audio, a video frame and a video.

In a further implementation solution, a preprocessing module may be further included, and may be configured to preprocess external original information data for transmission into the storage module. Preferably, preprocessing may include original information data segmenting, Gaussian filtering, binarizing, regularizing and/or normalizing to obtained data consistent with an input format of the neural network.

According to another aspect of the disclosure, information processing equipment is provided, which may include an information acquisition device configured to acquire external information data. The information processing equipment may be configured to process the information data, obtain predicted confidence of a key feature and, if the predicted confidence exceeds a preset threshold value of true confidence, modify the key feature or send out a modification signal.

According to another aspect of the disclosure, information processing equipment is provided, which may include an information acquisition device configured to acquire external information data. The information processing equipment may be configured to process the information data, obtain predicted confidence of a key feature and, if the predicted confidence exceeds a preset threshold value of true confidence, modify the key feature or send out a modification signal. An interaction interface may be also included, which may be configured to receive the modified key feature or the modification signal and display a modified content to a user.

In a further implementation solution, the information acquisition device may further include a preprocessing module configured to preprocess the information data acquired by the information acquisition device and send it to the information processing device.

In a further implementation solution, a controller may be further included, and may be configured to control the information acquisition device, the information processing device and/or the interaction interface.

In a further implementation solution, the interaction interface may be further configured to modify the preset threshold value in response to an operation or command of the user.

According to another aspect of the disclosure, an information processing method is provided, which may include: acquiring information data through a storage module, in which the information data may include at least one key feature and the storage module may pre-store true confidence corresponding to the key feature; an operational circuit determining predicted confidence corresponding to the key feature according to the information data and judges whether the predicted confidence of the key feature exceeds a preset threshold value range of the true confidence corresponding to the key feature or not; a controlling circuit controlling the storage module to modify the key feature or sending out a modification signal if the predicted confidence exceeds the preset threshold value range of the true confidence.

In a further implementation solution, the storage module may include a DMA, and the method may further include: adopting the DMA to store the predicted confidence determined by the operational circuit and sending the true confidence and the predicted confidence into the operational circuit for comparison.

In a further implementation solution, acquiring the information data through the storage module may include: adopting a storage unit to acquire the information data from the outside and transmitting it into the DMA for the operational circuit to call.

In a further implementation solution, the steps may further include: adopting the storage module to store a neural network dedicated instruction and caching the neural network dedicated instruction in an instruction cache from the storage module for the controlling circuit to call; adopting the storage module to store input neurons, output neurons and weights in a neural network; adopting an input neuron cache to cache the neurons from the storage module for the operational circuit to call; adopting a weight cache to cache the weights from the storage module for the operational circuit to call, and adopting an output neuron cache to store the output neurons obtained by a computation of the operational circuit.

In a further implementation solution, the steps may further include: adopting the operational circuit to score the information data according to a judgment result of each key feature, or performing an adaptive training on the neural network through the operational circuit.

In a further implementation solution, the operational circuit determining predicted confidence corresponding to the key feature according to the information data may include: performing neural network computation by taking the information data as input of the neural network, in which the predicted confidence may be taken as output of the neural network.

In a further implementation solution, the steps may further include: preprocessing external original information data through a preprocessing module for transmission into the storage module.

According to an aspect of the disclosure, a processing device for performing a generative adversarial network (GAN) is provided, which may include a memory and a computation device.

The memory may be configured to receive input data, in which the input data may include a random noise and reference data, and store a discriminator neural network parameter and a generator neural network parameter.

The computation device may be configured to transmit the random noise input data into a generator neural network and may perform computation to obtain a noise generation result, also configured to input both of the noise generation result and the reference data into a discriminator neural network and may perform computation to obtain a discrimination result and further configured to update the discriminator neural network parameter and the generator neural network parameter according to the discrimination result.

According to another aspect of the disclosure, a method for machine creation by use of the processing device is provided, which may include the follows:

inputting a random noise and reference data into a memory;

a computation device transmitting the random noise input data into a generator neural network to perform computation to obtain a noise generation result;

inputting both of the noise generation result and the reference data into a discriminator neural network through the computation device, and performing computation to obtain a discrimination result;

updating the discriminator neural network parameter and a generator neural network parameter through the computation device according to the discrimination result.

According to another aspect of the disclosure, electronic equipment is provided, which may include the processing device.

The data sharing system and data sharing method disclosed by the disclosure have the following beneficial effects.

In the disclosure, the at least two processing modules may directly communicate through the preset rule to implement data sharing, so that no shared storage module is required. Therefore, storage communication overhead may be reduced, and a data access delay may be effectively reduced. The at least two processing modules of the disclosure may include processors in different structures and cores in processors in different structures, so that external storage modules of the processors in the same or different structures and core external storage modules corresponding to the cores may be maintained. According to the disclosure, under the condition of not reducing original storage efficiency and not increasing original storage cost, each storage unit may be allowed to be directly accessed by one or more computation units, and the specific numbers may be not required to be fixed and unified, support an asymmetric structure and may be allowed to be configured and regulated according to a requirement, so that the count of interaction times for off/on-chip memory access is reduced, and power consumption is reduced. According to the disclosure, a private storage module exclusively used by a computation unit may be allowed to transmit data to another computation unit, so that privacy of the data is protected. Meanwhile, rapid interaction about the data may be allowed, and a data utilization rate is increased. Resource waste by storage of multiple copies of the same data on the chip and a memory access overhead on repeated reading of the same data are avoided. The memory access speed may be further increased, and the memory access power consumption is reduced.

BRIEF DESCRIPTION OF THE DRAWINGS

In order to more clearly illustrate the embodiments of the present invention or the technical solutions in the prior art, the drawings used in the embodiments or the prior art description will be briefly introduced below. Obviously, the drawings in the following description are only some embodiments of the present invention, and those skilled in the art can obtain other drawings according to the drawings without any creative work.

DETAILED DESCRIPTION OF THE EMBODIMENTS

In order to make the purpose, technical solutions and advantages of the disclosure clearer, the disclosure will further be described below in combination with specific embodiments and with reference to the drawings in detail.

The disclosure provides a method by which a machine learning ASIC computation unit may directly access a storage module in an SoC to implement rapid data interaction with another module in the other SoC. According to the method, data interaction efficiency may be effectively improved, and an interaction delay may be greatly reduced. A public storage module for each layer may be accessed by licensed access units, and for private storage modules, data interaction and access between access units may be completed directly or through a certain rule or a certain protocol.

The disclosure provides a data sharing system, which may include a storage module and at least two processing modules.

The at least two processing modules may share the storage module.

The at least two processing modules may communicate through a preset rule to implement data sharing.

The data sharing system of the disclosure may support a heterogeneous multiprocessor. An external storage module may exist outside processors and may be a public storage module of multiple processors. The multiple processors may be the same processor, may be different processors or may be partially the same.

In some embodiments of the disclosure, the at least two processing modules may include processors in the same/different structures, processor cores in the same/different structures and computation units in the same/different structures in the processor cores in the same/different structures.

In some embodiments of the disclosure, the preset rule may include a communication protocol, a transport protocol, a handshake protocol and/or a bus protocol.

In some embodiments of the disclosure, communication through the preset rule may include the follows. The at least two processing modules may include a first processing module and a second processing module. The first processing module may send a request signal and a corresponding data address to the second processing module, and the second processing module may return a valid signal and data to the first processing module according to the request signal and the corresponding data address to implement data sharing. It should be noted that the at least two processing modules described herein are not limited to include the first processing module and the second processing module and may further include, for example, a third processing module, and any two in the three modules may communicate by adopting the preset rule.

The disclosure may further disclose a data sharing method, which may include the following step.

At least two processing modules may communicate through a preset rule to implement data sharing and the two processing modules may share a storage module.

Figure 1:
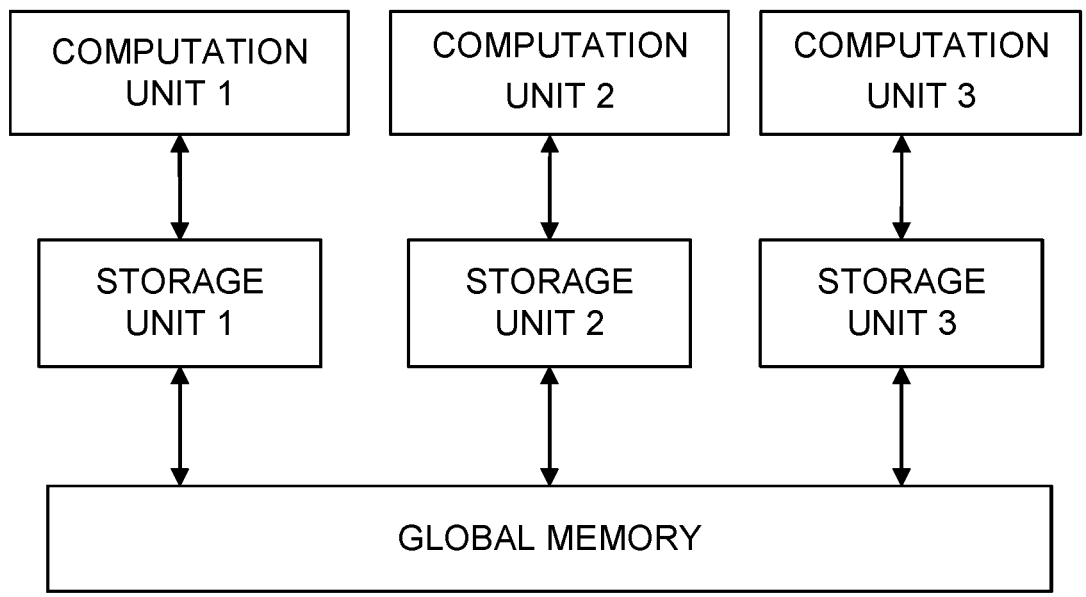
FIG. 1 is a structure diagram of a data processing system according to a conventional art.
Figure 2:
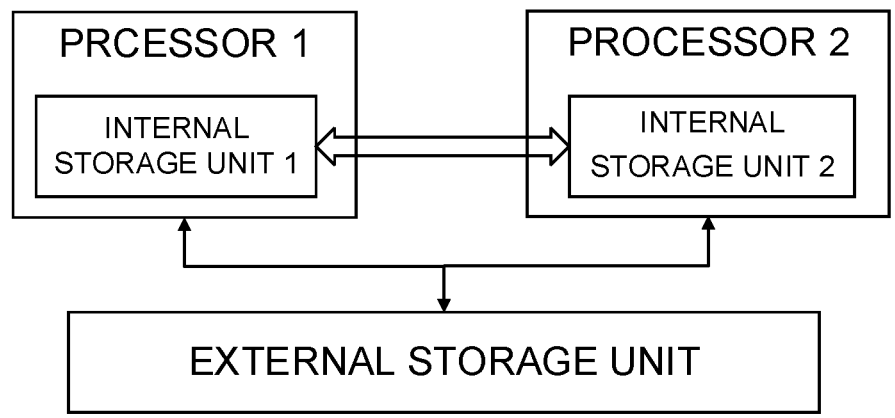
FIG. 2 is a structure diagram of a data sharing system according to an embodiment of the disclosure.

As illustrated in FIG. 2, in some embodiments of the disclosure, the at least two processing modules may include two processors which may be, for example, a processor 1 and a processor 2, and communication between the two processors refers to communication between internal storage modules in the processors. The processor 1 and the processor 2 may be allowed to directly access an external storage module to read data to required positions of an internal storage module 1 and an internal storage module 2 respectively. Consistency of data of the external storage module and the internal storage modules of the processors may be maintained through a certain consistency protocol. In the conventional art, if the processor 1 changes the data in its internal storage module, a "write-through" manner may be adopted to change the data at a corresponding position in the internal storage module 1 and simultaneously change a corresponding position of the data in the external storage module, and then the external storage module may simultaneously send an invalidation signal to the corresponding data in the internal storage module 2. If the processor 2 uses the data, after the invalidation signal is discovered, a new value may be read from the external storage module and written to a corresponding position in the internal storage module 2. In the embodiment, for the data in the internal storage module 1, data interaction may be completed through a certain preset rule. For example, the processor 2 may send a request signal and a corresponding data address to the processor 1 at first and the processor 1 may return a valid signal and data after receiving the request signal. Therefore, for a structure with multiple processors, the same storage space may be maintained, and direct communication between the multiple processors may be implemented through a certain defined rule. In such a manner, the storage communication overhead is reduced, and a data access delay is reduced.

The processor 1, processor 2 and the like involved in the embodiment may be the same processor and may also be different processors. The embodiment may be applied to cooperation between a novel artificial neural network processor and a conventional universal processor. For example, we may assume that the processor 1 is a central processing unit (CPU) and the processor 2 is an artificial neural network processor.

Figure 3:
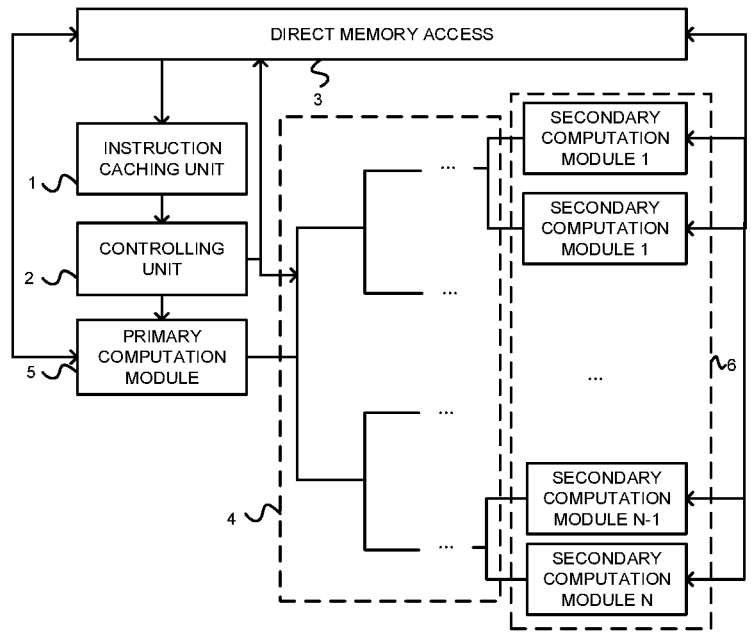
FIG. 3 is a structure diagram of a processor in the system in FIG. 2.

Specifically, as illustrated in FIG. 3, the artificial neural network processor may include a structure configured to perform artificial neural network forward computation, and the structure configured to perform the artificial neural network forward computation may include an instruction caching unit 1, a controlling unit 2, a DMA 3, an H tree module 4, a primary computation module 5 and multiple secondary computation modules 6. All of the instruction caching unit 1, the controlling unit 2, the DMA 3, the H tree module 4, the primary computation module 5 and the multiple secondary computation modules 6 may be implemented through a hardware circuit (for example, an ASIC).

The instruction caching unit 1 may read an instruction in through the DMA 3 and cache the read-in instruction. The controlling unit 2 may read an instruction from the instruction caching unit 1 and decode the instruction into a microinstruction controlling an operation of another module. The other module may be, for example, the DMA 3, the primary computation module 5 and the secondary computation module 6, and the DMA 3 may access an external address space and directly read and write data from and into each caching unit in the processor to complete loading and storage of the data.

Figure 4:
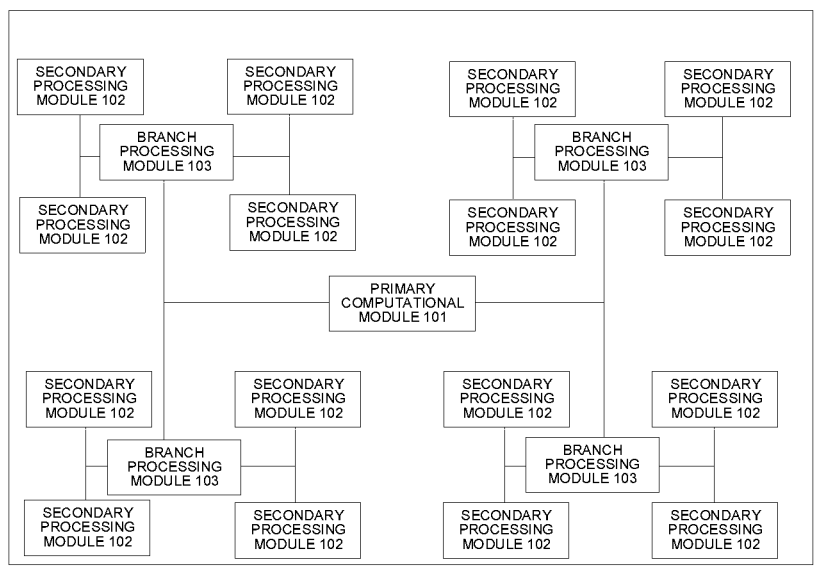
FIG. 4 is a structure diagram of an H tree module in FIG. 3.

As illustrated in FIG. 4, the H tree module may be replaced by a branch processing module 103, and its specific connecting structure is illustrated in FIG. 4.

A primary computation module 101 may be connected with the branch processing module 103, and the branch processing module 103 may be connected with multiple secondary processing modules 102.

The branch processing module 103 may be configured to perform and forward data or instruction between the primary computation module 101 and the secondary processing modules 102.

In an optional embodiment, for example, for fully connected computation in neural network computation, a process may be performed by a function of $a=y=f(wx+b)$, where x represents an input neuron matrix, w represents a weight matrix, b represents an offset scalar, and f represents an activation function and may specifically be any one of a sigmoid function, a tan h function, a relu function and a softmax function. Assuming that a binary tree structure with eight secondary processing circuits is provided, an implementation method may be as follows.

The controlling unit may acquire the input neuron matrix x, the weight matrix w and a fully connected operation instruction from the storage module and transmits the input neuron matrix x, the weight matrix w and the fully connected operation instruction to the primary computation module.

The primary computation module may split the input neuron matrix x into eight sub-matrixes, distribute the eight sub-matrixes to eight secondary processing modules through a tree module and broadcasts the weight matrix w to the eight secondary processing modules.

The secondary processing modules may concurrently perform multiplication computation and accumulation computation between the eight sub-matrixes and the weight matrix w to obtain eight intermediate results and send the eight intermediate results to the primary computation module.

The primary computation module may be configured to rank the eight intermediate results to obtain a computational result of wx, to perform computation with an offset b on the computational result, to perform an activation operation to obtain a final result y and send the final result y to the controlling unit, and the controlling unit may output or store the final result y to the storage module.

Figure 5:
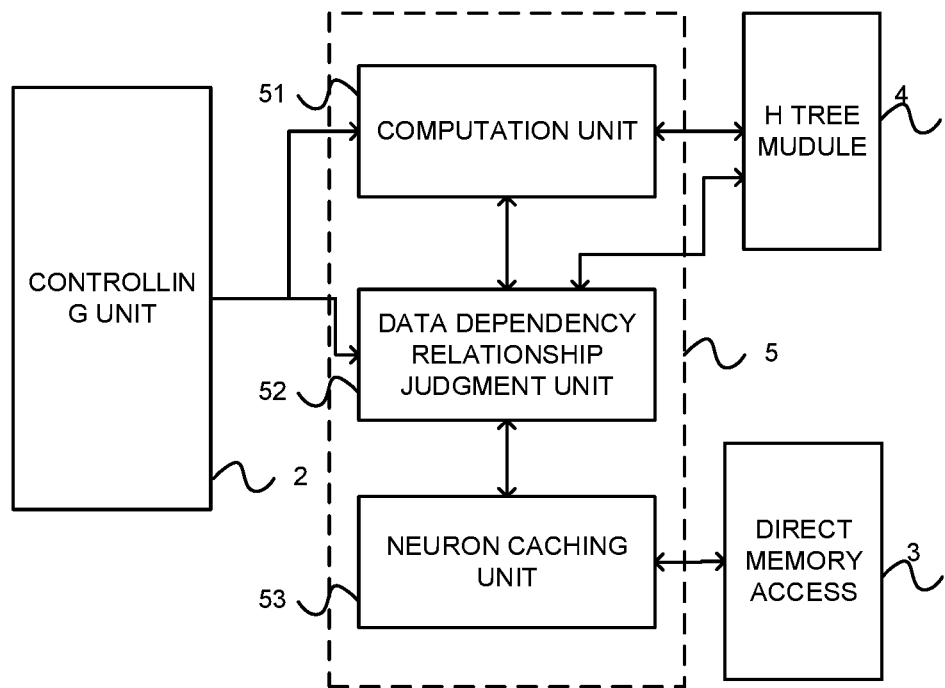
FIG. 5 is a structure diagram of a primary computation module in FIG. 3.

FIG. 5 is an exemplary structure block diagram of the primary computation module 5. The primary computation module 5 may include a computation unit 51, a data dependency relationship judgment unit 52 and a neuron caching unit 53. The neuron caching unit 53 may be configured to cache input data and output data used by the primary computation module 5 in a computation process. The computation unit 51 may realize various computational functions of the primary computation module 5, and the data dependency relationship judgment unit 52 is a port through which the computation unit 51 may read and write the neuron caching unit 53 and may also ensure read/write consistency of data in the neuron caching unit. Meanwhile, the data dependency relationship judgment unit 52 may be also configured to send the read data to the secondary computation modules 6 through the H tree module 4, and output data of the secondary computation modules 6 may be directly sent to the computation unit 51 through the H tree module 4. The instruction output by the controlling unit 2 may be sent to the computation unit 51 and the data dependency relationship judgment unit 52 to control operations.

Figure 6:
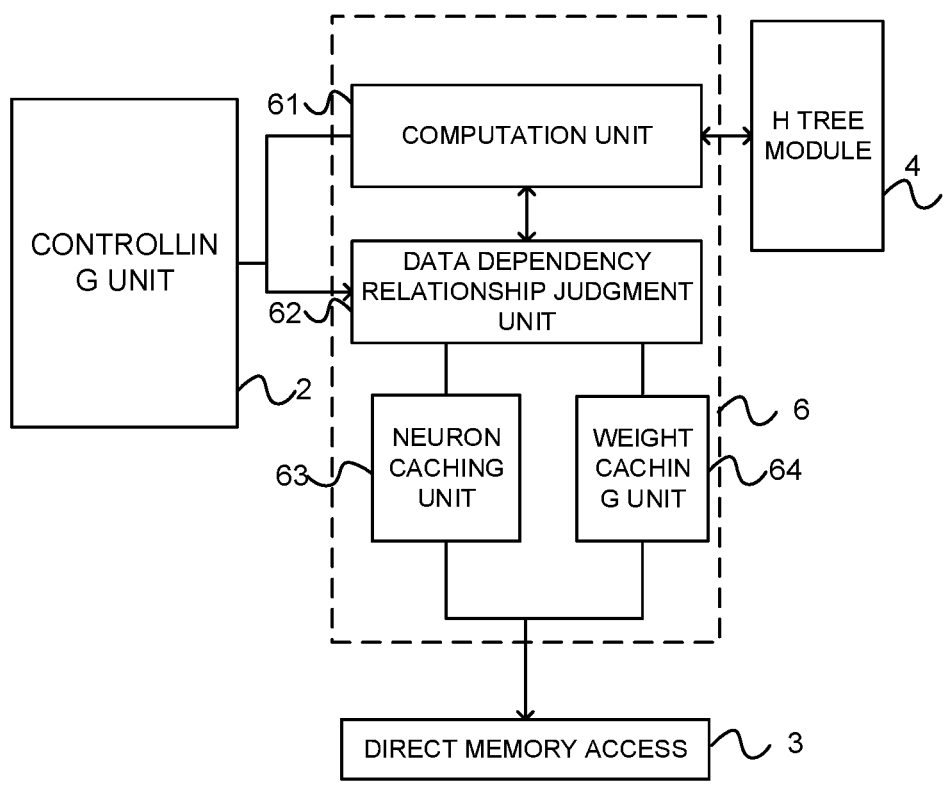
FIG. 6 is a structure diagram of a secondary computation module in FIG. 3.

FIG. 6 is an exemplary structure block diagram of a secondary computation module 6. Each secondary computation module 6 may include a computation unit 61, a data dependency relationship judgment unit 62, a neuron caching unit 63 and a weight caching unit 64. The computation unit 61 may be configured to receive the microinstruction sent by the controlling unit 2 and may perform arithmetic logical computation. The data dependency relationship judgment unit 62 is configured for a read/write operation over the neuron caching unit 63 in the computation process. The data dependency relationship judgment unit 62 may ensure that no read/write consistency conflict exists between data used for instructions before performing the read/write operation. For example, all microinstructions sent to the data dependency relationship judgment unit 62 may be stored into an instruction queue in the data dependency relationship judgment unit 62, and in this queue, if a data reading range of a read instruction conflicts with a data writing range of a write instruction at an early position in the queue, the read instruction may be performed only after the write instruction on which the read instruction depends may be performed. The neuron caching unit 63 caches input neuron vector data and output neuron value data of the secondary computation modules 6. The weight caching unit 64 may cache weight data required by the secondary computation modules 6 in the computation process. For each secondary computation module 6, weights between all input neurons and part of output neurons may only be stored. For example, for a fully connected layer, output neurons may be segmented according to the number N of secondary computation units, and a weight corresponding to the $n^{th}$ output neuron of each segment may be stored in the $n^{th}$ secondary computation unit.

The secondary computation modules 6 implement concurrent arithmetic logical computation in a forward computational process of each layer of an artificial neural network. For example, for the fully connected layer of the artificial neural network (a Multi-Layer Perceptron (MLP)), the process may be performed by a function of $y=f(wx+b)$. Multiplication between the weight matrix w and an input neuron vector x may be divided into unrelated concurrent computation subtasks. In other words, since out and in are column vectors, each secondary computation module 6 only computes products of part of corresponding scalar elements of in and corresponding columns of the weight matrix w only, each obtained output vector is a partial sum to be accumulated of a final result, and these partial sums are added in pairs step by step in the H tree module 4 to obtain the final result. Therefore, the computation process may be turned into concurrent partial sum computation processes and a subsequent accumulation process. Each secondary computation module 6 may compute output neuron values, and all the output neuron values may be merged into a final intermediate result vector in the H tree module 4. Therefore, each secondary computation module 6 may be only required to compute the value of the output neuron corresponding to the module in the intermediate result vector y. The H tree module 4 may summate the neuron values output by all the secondary computation modules 6 to obtain the final intermediate result vector y. The primary computation module 5 may perform subsequent computation, for example, offset addition, pooling (for example, MAXPOOLING or AVGPOOLING), activation and sampling, on the basis of the intermediate result vector y.

The structure may include a public storage module for the CPU and the artificial neural network processor and the two processors may be allowed to directly access the public storage to read data into a cache of the CPU and the caching unit of the artificial neural network processor respectively. If the CPU is intended to change the data in the cache, a "write-through" manner is adopted to change a corresponding position of the data in the cache and simultaneously change a corresponding position of the data in the external storage module. Meanwhile, an invalidation signal may be sent to the corresponding data in the artificial neural network processor. If the artificial neural network processor uses the data, after the invalidation signal is discovered, a new value is read from the external storage module and written to a corresponding position of the caching unit in the artificial neural network processor. In addition, for the data in the CPU, data interaction may be completed through a defined rule. For example, the artificial neural network processor may send a request signal and a corresponding data address to the CPU at first and the CPU may return a valid signal and data after receiving the request signal. Therefore, for heterogeneous multiprocessor structure, the data sharing system disclosed by the embodiment may maintain the same storage space to reduce the storage communication overhead and reduce the data access delay.

Figure 7:
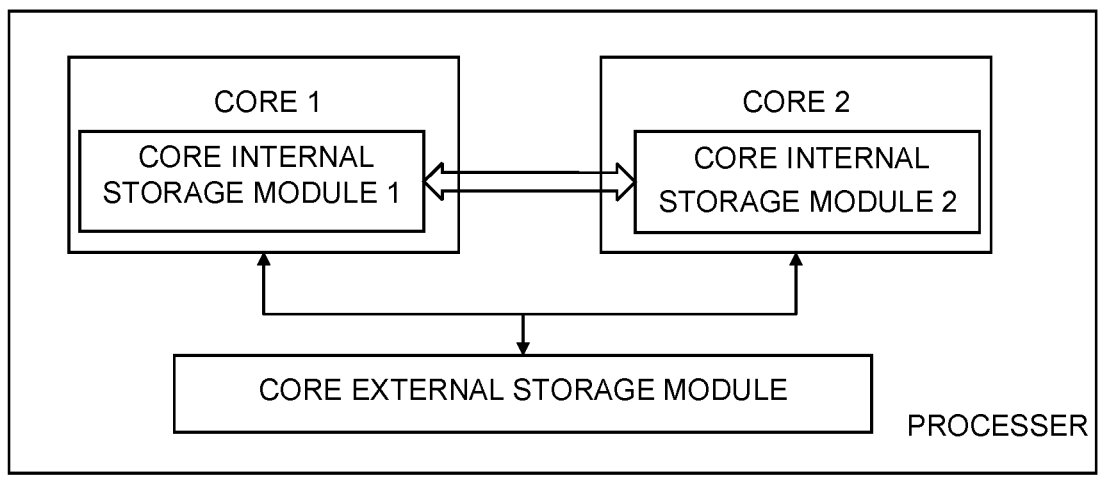
FIG. 7 is a structure diagram of a data sharing system according to another embodiment of the disclosure.

Each processor may include multiple cores. Each core may include a core internal storage module and a core external storage module, and data of the core external storage modules may be directly accessed by some or all of the cores. In some embodiments of the disclosure, as illustrated in FIG. 7, a data sharing system is disclosed. At least two processing modules are two processor cores between which data sharing is implemented through core internal storage modules therein, and a storage module refers to a core external storage module. In the embodiment, a core 1 may access a core internal storage module of a core 2 through a communication protocol if being required. The core external storage module may be accessed by the core 1 and the core 2, and then the core 1 and the core 2 reads required data into corresponding positions of a core internal storage module 1 and a core internal storage module 2 respectively. Consistency of data of the core external storage module and the core internal storage modules is maintained through a certain consistency protocol. In the conventional art, if the core 1 changes the data in corresponding core internal storage module, a "write-back" manner is adopted. Only the data at the corresponding position in the core internal storage module 1 is changed, and meanwhile, the core external storage module sends an invalidation signal to the core internal storage module 2. If the corresponding data in the core internal storage module 1 is swapped out or if the core 2 uses the data, after the invalidation signal is discovered, a new value is read from the core external storage module and written to the corresponding position in the core internal storage module 2. However, in the embodiment, for the data in the core internal storage module 1, data interaction may also be completed through a certain defined rule, for example, the core 2 sends a request signal and a corresponding data address to the core 1 at first and the core 1 returns a valid signal and data after receiving the request signal. Types of the cores may be the same, for example, both of them are neural network cores, and may also be different, for example, a neural network core and a CPU core. Therefore, the data may be protected to a certain extent. Meanwhile, cores in the same or different structures are allowed to access the stored data, and the consistency of the data is maintained. Meanwhile, a memory access overhead is reduced, and a memory access delay is reduced.

Figure 8:
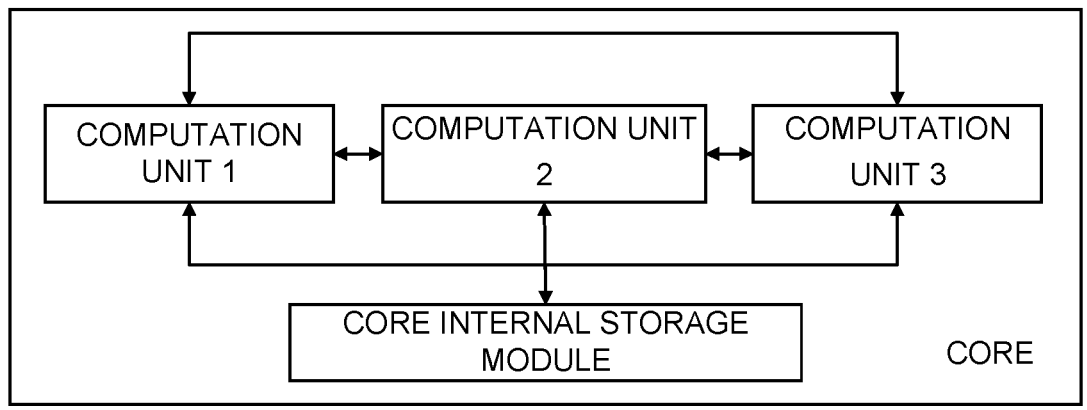
FIG. 8 is a structure diagram of a data sharing system according to another embodiment of the disclosure.

Each neural network core may include multiple neural network computation units. Therefore, as illustrated in FIG. 8, in some embodiments of the disclosure, a data sharing system is disclosed. At least two processing modules refer to three computation units, and the three computation units may directly access a core internal storage module and may also directly transmit related data in a certain direction, so that transmission of data between the computation units is facilitated, the count of times of access to the storage module is reduced, and power consumption and an access delay are further reduced. If neural network computation is completed, if a computation unit 1 computes an output value 1, the result of the output value 1 is represented with out1. Corresponding neurons are represented with n=(n1, n2 ... nk) and synapse values are represented with w=(w1, w2, ..., wk), and then out1=n1*w1+n2*w2+ ... +nk*wk. Similarly, if an output result of a computation unit 2 is out2, corresponding neurons represented with m=(m1, m2 ..., mk) and synapse values are represented with w=(w1, w2, ..., wk), out2=m1*w1+m2*w2+ ... +mk*wk. If an output result of a computation unit 3 is out3, corresponding neurons represented with q=(q1, q2, ... qk) and synapse values are represented with w=(w1, w2 ..., wk), out3=q1*w1+q2*w2+ ... +qk*wk. Specifically, the computation unit 1 reads out n and w from the core internal storage module at first and directly may perform computation to obtain out1. The computation unit 2 reads out m from the core internal storage module, may receive the synapse values w from the computation unit 1 and may perform corresponding computation to obtain out2. The computation unit 3 reads out q from the core internal storage module, may receive the synapse values w from the computation unit 1 and may perform corresponding computation to obtain out3. Therefore, the count of times of access to the core internal storage module is reduced, the delay and the power consumption are reduced, the computational speed is increased, and the computational energy consumption is reduced.

Figure 9:
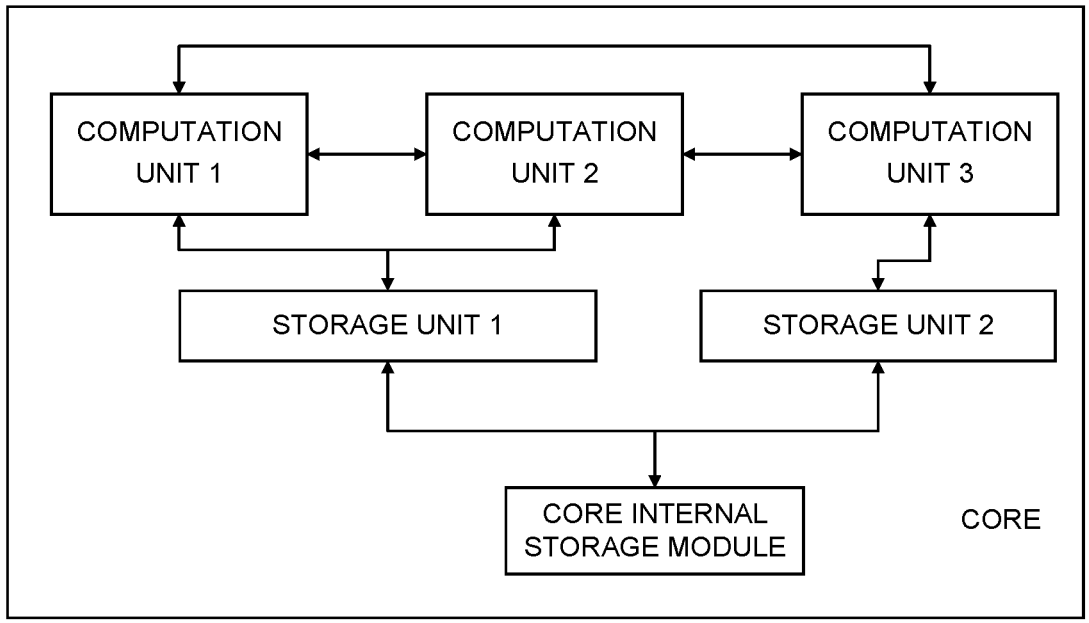
FIG. 9 is a structure diagram of a data sharing system according to another embodiment of the disclosure.

In some embodiments of the disclosure, in the data sharing system in the above embodiment, one or more layers of storage units may also be additionally arranged in the core, and a storage unit may be allowed to be shared by a few computation units or a storage unit may be exclusive to a computation unit. As illustrated in FIG. 9, assuming that the sharing system may include two storage units, a storage unit 1 may be shared by the computation unit 1 and the computation unit 2. The storage unit 1 may be directly accessed by the computation unit 1 and the computation unit 2 and may not be directly accessed by the computation unit 3. The storage unit 2 may be exclusive to the computation unit 3, and may be directly accessed by the computation unit 3 and may not be directly accessed by the computation unit 1 and the computation unit 2. In such a manner, if being intended to access a computational result in the computation unit 3, the computation unit 1 may directly acquire it through the computation unit 3. Such a long process that the core internal storage module is accessed through the storage unit 1, then the storage unit 2 is caused to update the core internal storage module for transmission into the storage unit 1 and the computation unit 1 may be allowed to access is avoided, so that an effective protection effect on the data is achieved, in other words, another unlicensed computation unit (for example, the computation unit 1) is forbidden to arbitrarily change the storage unit (for example, the storage unit 2), meanwhile, the count of memory access times may also be greatly reduced, and on-chip storage resource waste caused by on-chip storage of multiple copies of the same data is avoided. Therefore, the delay and the power consumption are reduced, the computational speed is further increased, and the computational energy consumption is reduced.

Figure 10:
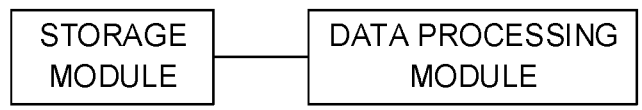
FIG. 10 is a structure diagram of an information processing device according to an embodiment of the disclosure.

FIG. 10 is a structure diagram of an information processing device according to an embodiment of the disclosure. The device may include a storage module and a data processing module. The storage module may be configured to receive and store input data, an instruction and output data. The input data may include one or more key features, and the input data is original input data or data obtained by preprocessing the original input data. The data processing module may be configured to judge the key features included in the input data, in other words, the data processing module computes confidence of the key features included in the input data, the confidence being a judgment result, and score the input data in the storage module according to the judgment result.

In the solution, data and an instruction are stored in the storage module, and the data may include input data, input neurons, weights, output neurons and output data. The input data is transmitted to each input neuron in an artificial neural network, thereby participating in subsequent computation, and values of the output neurons, in other words the judgment result and/or a score, are taken as the output data.

Figure 11:
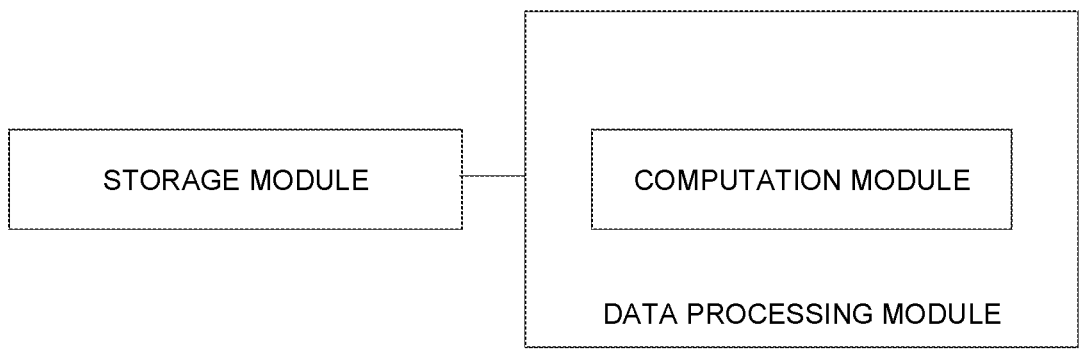
FIG. 11 is a structure diagram of an information processing device including a computation module according to an embodiment of the disclosure.

FIG. 11 is a structure diagram of an information processing device including a computation module according to an embodiment of the disclosure. The data processing module may include the computation module configured to perform corresponding computation on the data stored in the storage module according to the instruction stored in the storage module and output a computational result to the storage module.

Computation performed by the computation module may include neural network computation, and the computation module may include, but is not limited to a first part including a multiplier, a second part including one or more adders (more specifically, the adders of the second part form an adder tree), a third part including an activation function unit, and/or a fourth part including a vector processing unit. More specifically, the vector processing unit may process vector computation and/or pooling computation. The first part multiplies input data 1 (in1) and input data 2 (in2) to obtain multiplied output (out), and a process is represented with out=in1×in2. The second part adds the input data in1 through the adders to obtain output data (out). More specifically, if the second part is the adder tree, the input data in1 is added step by step through the adder tree to obtain the output data (out). Data in1 is a vector with a length N, N is greater than 1, and a process is represented with out=in1[1]+in1[2]+ . . . +in1[N], and/or the input data 1 (in1) is accumulated through the adder tree and then is added with the input data 2 (in2) to obtain the output data (out), A process is represented with out=in1[1]+in1[2]+ . . . +in1[N]+in2, or the input data 1 (in1) and the input data 2 (in2) are added to obtain the output data (out), and a process is represented with out=in1+in2. The third part may perform computation on the input data (in) through an activation function to obtain active output data (out), and a process is represented with out=active(in), and the activation function may be sigmoid, tan h, relu, softmax and the like. Besides an activation operation, the third part may implement another nonlinear function and may perform computation (f) on the input data (in) to obtain the output data (out), and a process is represented with out=f(in). The vector processing unit may perform the pooling computation on the input data (in) to obtain output data (out) after a pooling operation, and a process is represented with out=pool(in), in which pool may be the pooling operation, and the pooling operation may include, but is not limited to AVGPOOLINGS MAXPOOLING and median pooling. The input data (in) is data in a pooling core related to output out. The computation of one or more parts of the above-mentioned parts may be freely selected for combination in different sequences, thereby implementing computation of various functions.

Figure 12:
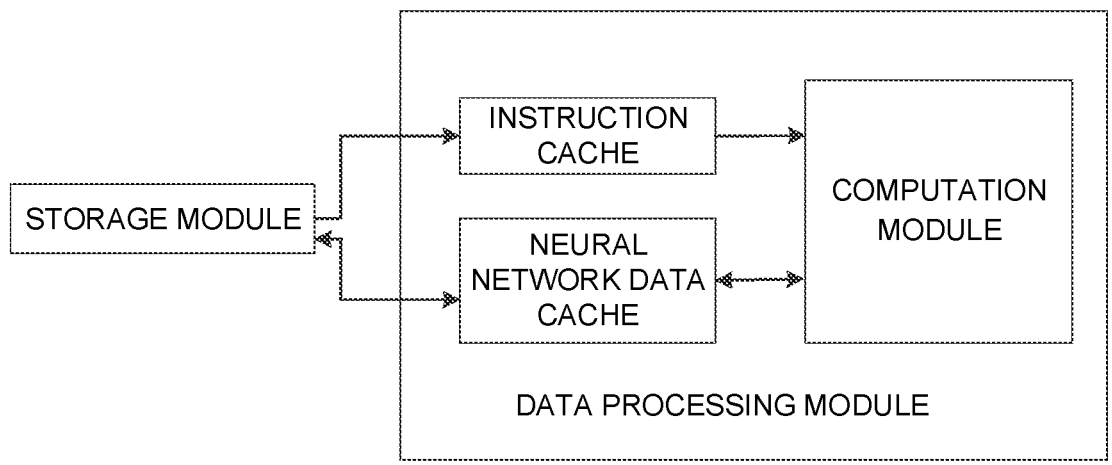
FIG. 12 is a structure diagram of an information processing device including an instruction cache and a neural network data cache according to an embodiment of the disclosure.

FIG. 12 is a structure diagram of an information processing device including an instruction cache and a neural network data cache according to an embodiment of the disclosure. As illustrated in FIG. 12, the data processing module of the information processing device may further include the instruction cache and the neural network data cache. The instruction cache may be configured to cache an instruction, and the neural network data cache may be configured to cache weight data, input neurons and output neurons in the storage module.

Figure 13:
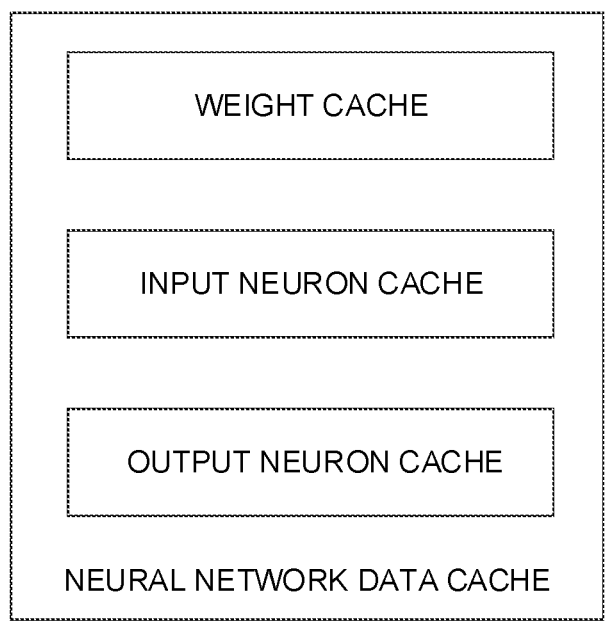
FIG. 13 is a structure diagram of a neural network data cache according to an embodiment of the disclosure.

FIG. 13 is a structure diagram of a neural network data cache according to an embodiment of the disclosure. As illustrated in FIG. 13, the neural network data cache may include a weight cache, an input neuron cache and an output neuron cache. The instruction cache may be configured to cache the instruction, and the neural network data cache may be configured to cache the weight data, input neurons and output neurons in the storage module.

Figure 14:
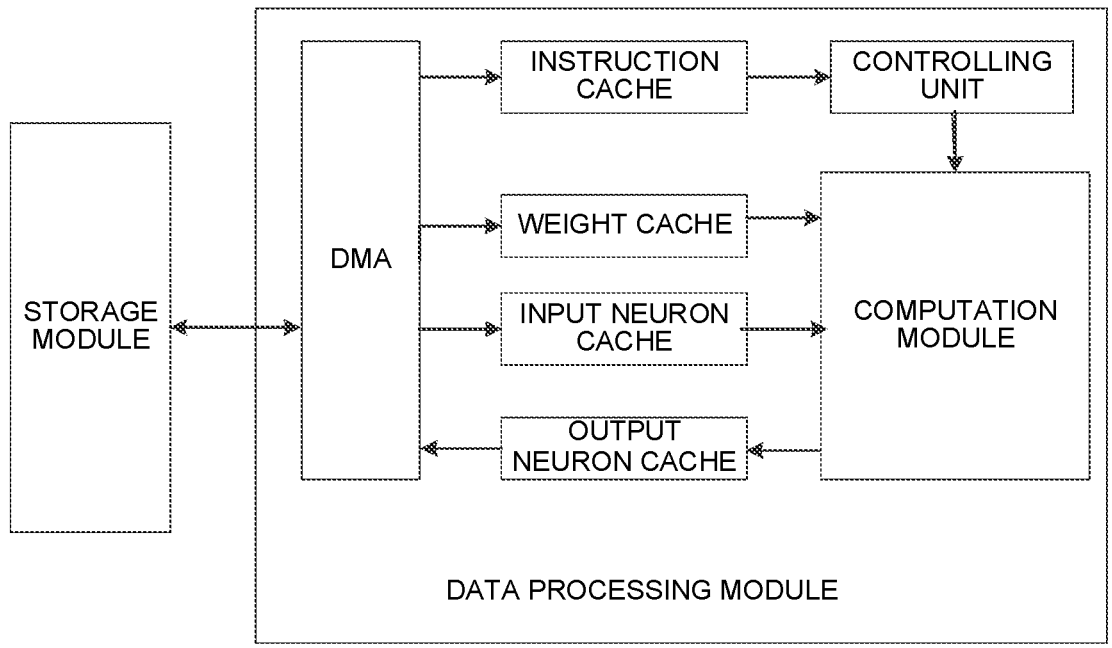
FIG. 14 is a structure diagram of an information processing device including a DMA and a controlling unit according to an embodiment of the disclosure.

FIG. 14 is a structure diagram of an information processing device including a DMA and a controlling unit according to an embodiment of the disclosure. As illustrated in FIG. 14, the data processing module of the information processing device may further include the DMA, serving as a bridge connecting the storage module with each cache and configured to read/write the data and/or instruction stored in the storage module, store the read-out/written-out instruction into the instruction cache, store read-out weights into the weight cache, store the read-out input neurons, in other words the input data, into the input neuron cache and store the output neurons, in other words a judgment result and/or a score, received from the output neuron cache into the storage module. The instruction cache may be configured to store the instruction cached in the DMA. The weight cache may be configured to cache the weight data cached in the DMA, and the input neuron cache may be configured to cache the input neurons cached in the DMA. Similarly, as illustrated in FIG. 14, the data processing module of the information processing device may further include the controlling unit configured to read the instruction from the instruction cache, decode the instruction acquired into an instruction executable for the computation module and output the instruction decoded to the computation module. The output neuron cache may be configured to cache the computational result, in other words the judgment result and/or the score, output by the computation module and output it to the DMA.

Figure 15:
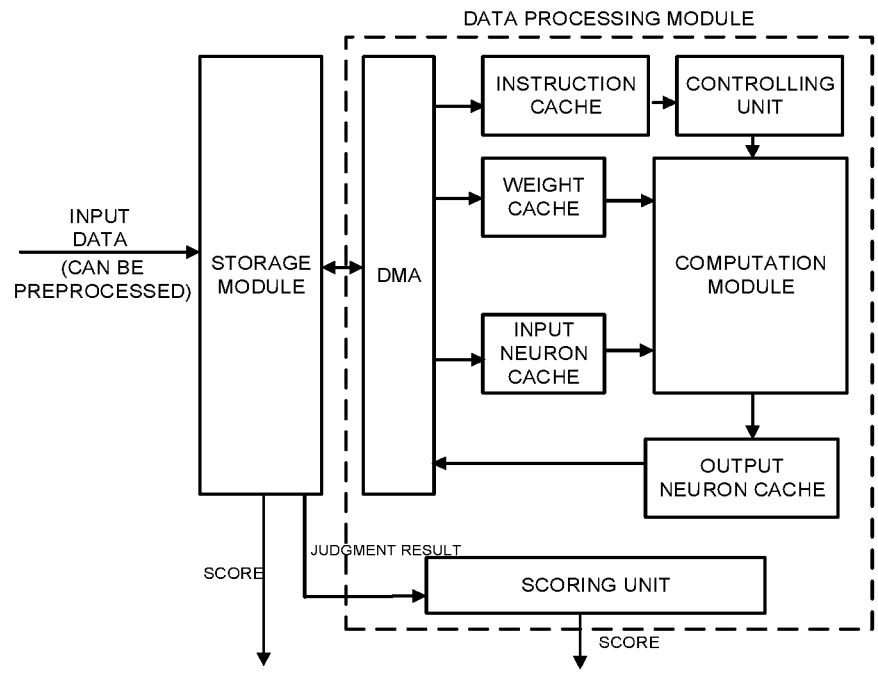
FIG. 15 is a specific structure diagram of an information processing device according to an embodiment of the disclosure.

FIG. 15 is a specific structure diagram of an information processing device according to an embodiment of the disclosure. As illustrated in FIG. 15, the data processing module may further include a scoring unit, and the scoring unit is configured as follows. If the artificial neural network running in the information processing device obtains the judgment result and further obtains the score, the unit does not participate in data processing, and if the artificial neural network running in the information processing device obtains no score but only the judgment result, the scoring unit may be configured to obtain the score according to the judgment result.

The judgment result may include values of output neurons of a final output layer of the artificial neural network running in the information processing device. The values of the output neurons are the confidence of appearance of the key features, and the confidence is a natural number within a certain range. For example, confidence within [0, 1] represents a probability of appearance of the key feature. If the confidence is binarized to be {0, 1}, 0 represents that the key feature does not appear and 1 represents that the key feature appears, or 1 represents that the key feature does not appear and 0 represents that the key feature appears. A representation manner for the confidence is not limited to the above two.

The score is obtained as follows. A layer is added after the final output layer of the artificial neural network running in the information processing device as a new final output layer. Values of input neurons of the new final output layer are confidences of appearance of key features, the layer has only one output neuron, its value is the score and weights in computation of the new final output layer correspond to importance degrees of each key feature. If the layer has N+1 output neurons, a value range of the score is [0,N]. If the output neurons of the layer are numbered to be 0, 1, 2, . . . , N, a value of the $i^{th}$ output neuron corresponds to confidence $P_i$ corresponding to a score value i, and the value of a final score corresponds to highest confidence, in other words, the score=$i_0$, $P_{i_0}$=max $\{P_i | i=0, 1, \ldots, N\}$.

The score may also be obtained as follows. After being obtained in the final output layer of the artificial neural network running in the information processing device, the confidence of appearance of each key feature may be taken as input of the scoring unit, and the scoring unit may accordingly obtain the score. The scoring unit may obtain the score by multiple methods which may be a complex machine learning algorithm and may also be simple data processing. For example, the scoring unit simply averages the confidences of which values are within [0, 1] and then multiplies a result by 100 to obtain a centesimal score.

The above-mentioned information processing device is an artificial neural network chip.

Figure 16:
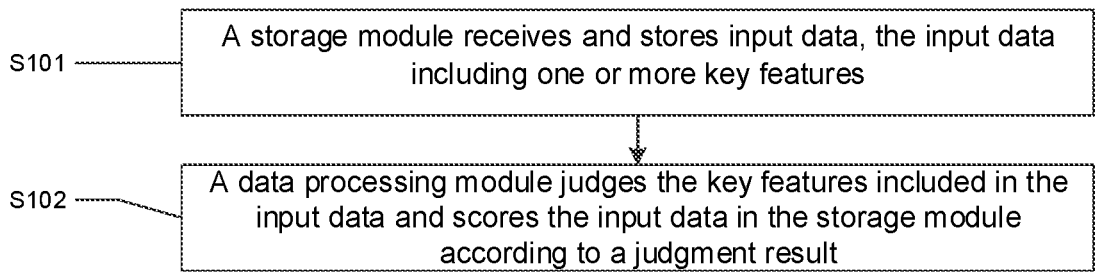
FIG. 16 is a flowchart of an information processing method for an information processing device according to an embodiment of the disclosure.

FIG. 16 is a flowchart of an information processing method for an information processing device according to an embodiment of the disclosure. The method may specifically include the following steps.

In S101, a storage module may receive and store input data, in which the input data may include one or more key features.

In S102, a data processing module may judge the key features included in the input data and score the input data in the storage module according to a judgment result. A score may be obtained by an artificial neural network running in the information processing device and may also be obtained by a scoring unit in the data processing module.

Figure 17:
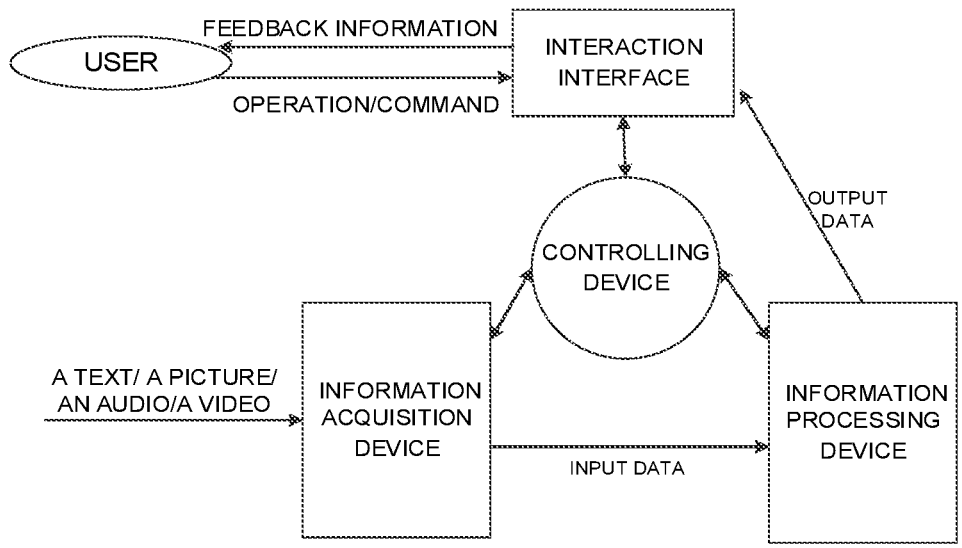
FIG. 17 is a structure diagram of an information processing system according to an embodiment of the disclosure.

FIG. 17 is a structure diagram of an information processing system according to an embodiment of the disclosure. The information processing system may include an information acquisition device, an information processing device, an interaction interface, and a controlling device.

The information acquisition device may be configured to acquire external data and transmit the external data to an information processing device.

The information processing device may be configured to perform computational processing on the external data received from the information acquisition device and output a computational processing result to an interaction interface.

The interaction interface may be configured to display the computational result received from the information processing device and transmit an externally received operation or command to a controlling device.

The controlling device may be configured to control operations of the information acquisition device, in which the information may process device and the interaction interface according to the operation or command received from the interaction interface.

The information acquisition device may be configured to acquire the external data and transmit the external data to the information processing device directly or after preprocessing, and the external data may include a text, a picture, an audio and/or a video. The information acquisition device may at least include a character recognition device, an image recognition device and a voice recognition device. The character recognition device may be configured to acquire text information in the external data, and the text information is a combination of one or more language texts and/or symbols, and the combination of the one or more language texts and/or symbols is at least an answer of test paper of a subject such as Chinese language, mathematics physics and the like. The image recognition device may be configured to acquire picture or video information in the external data, and the image recognition device is a webcam. The picture is a two-dimensional picture and/or a two-dimensional perspective, and the two-dimensional picture and/or the two-dimensional perspective are/is at least an answer of test paper of a subject such as fine arts, cartography and the like. The voice recognition device may be configured to acquire audio information in the external data, and the voice recognition device is a microphone. A preprocessing operation may make the input data more suitable to be processed by the artificial neural network to remove noise and redundancy in the input data and improve classification and recognition accuracy and the like.

The information processing device may be configured to perform computational processing on the external data or preprocessed external data received from the information acquisition device and output the computational result to the interaction interface. The information processing device in the embodiment of the disclosure is implemented by adopting an artificial neural network chip. The computational result is the judgment result or the score.

The judgment result may include values of output neurons of a final output layer of the artificial neural network running in the information processing device, in which the values of the output neurons may be confidence of appearance of the key features, and the confidence may be a natural number within a certain range. For example, confidence within [0, 1] represents a probability of appearance of the key feature. If the confidence is binarized to be $\{0, 1\}$, 0 represents that the key feature does not appear and 1 represents that the key feature appears, or 1 represents that the key feature does not appear and 0 represents that the key feature appears. A representation manner for the confidence is not limited to the above two. The score is obtained as follows. A layer is added after the final output layer of the artificial neural network running in the information processing device as a new final output layer. Values of input neurons of the new final output layer are confidence of appearance of key features. The new final neuron layer has only one output neuron, the value of the output neuron is the score and weights in computation of the new final output layer correspond to importance degrees of each key feature. If the layer has N+1 output neurons, a value range of the score is [0,N]. If the output neurons of the layer are numbered to be 0, 1, 2, . . . , N, a value of the $i^{th}$ output neuron corresponds to confidence $P_i$ corresponding to a score value i, and the value of a final score corresponds to highest confidence, in other words, the score=$i_0$, $P_{i_0}$=max $\{P_i | i=0, 1, \ldots, N\}$. The score may also be obtained as follows. After being obtained in the final output layer of the artificial neural network running in the information processing device, the confidence of appearance of each key feature is taken as input of the scoring unit, and the scoring unit accordingly obtains the score. The scoring unit may obtain the score by multiple methods which may be a complex machine learning algorithm and may also be simple data processing. For example, the scoring unit simply averages the confidences of which values are within [0, 1] and then multiplies a result by 100 to obtain a centesimal score.

The information processing device of the specific embodiment of the disclosure adopts the artificial neural network chip. The artificial neural network chip may perform adaptive training, and the artificial neural network chip accumulates data of a user for self-learning and may be gradually adapted to, for example, handwritings, habitual writing errors, postural characteristics and habitual movements of the user to constantly improve the accuracy and improve a movement/posture regulation capability for the user. The artificial neural network chip is of powerful computation capability, supports offline running of the neural network and may work for automatic scoring monitoring without assistance of a cloud server in computation if a user terminal/front end is offline. If the chip is online and assisted by the cloud server for computation, the computation capability of the chip is more powerful. The artificial neural network chip is adopted to automatically score a handwriting, a text and a picture instead of a worker, which is more accurate and faster than manual scoring. A subjective question may be evaluated more objectively, and influence of hobbies of a person and influence of a handwriting level of a testee are avoided.

The interaction interface may be configured to display the output result received from the information processing device and transmit the externally received operation or command to the controlling device. The user interaction interface is a display screen of a mobile phone, a computer, a notebook computer or a tablet computer.

The controlling device may be configured to control the operations of the information acquisition device, the information processing device and the interaction interface according to the operation or command received from the interaction interface.

Figure 18:
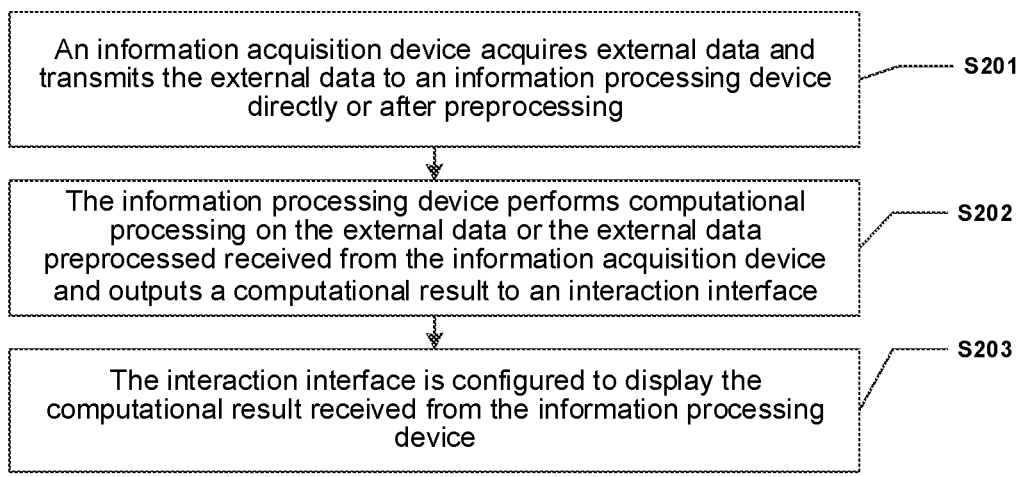
FIG. 18 is a flowchart of an information processing method for an information processing system according to an embodiment of the disclosure.

FIG. 18 is a flowchart of an information processing method for an information processing system according to an embodiment of the disclosure. As illustrated in the figure, the information processing method may include the following steps.

In S201, an information acquisition device acquires external data and transmits the external data to an information processing device directly or after preprocessing.

In S202, the information processing device may perform computational processing on the external data or the external data preprocessed received from the information acquisition device and outputs a computational result to an interaction interface.

In S203, the interaction interface may be configured to display the computational result received from the information processing device.

The information acquisition device acquires the external data and transmits the external data to the information processing device directly or after preprocessing, and the external input data may include a text, a picture, an audio and/or a video, and is preprocessed to obtain data matched with the information processing device. Preprocessing may include segmentation, Gaussian filtering, binarization, regularization, normalization or the like. Preprocessing may make the input data more suitable to be processed by an artificial neural network to remove noise and redundancy in the input data and improve classification, recognition accuracy and the like.

An artificial neural network chip may perform adaptive training, and the artificial neural network chip may accumulate data of a user for self-learning and may be gradually adapted to, for example, handwritings, habitual writing errors, postural characteristics and habitual movements of the user to constantly improve the accuracy and improve a movement/posture regulation capability for the user. The artificial neural network chip is of powerful computation capability, supports offline running of the neural network and may work for automatic scoring monitoring without assistance of a cloud server in computation if a user terminal/front end is offline. If the chip is online and assisted by the cloud server for computation, the computation capability of the chip is improved. The artificial neural network chip is adopted to automatically score a handwriting, a text and a picture instead of a worker, which is more accurate and faster than manual scoring. A subjective question may be evaluated more objectively, and influence of hobbies of a person and influence of a handwriting level of a testee are avoided.

Embodiment 1

An information processing device of the embodiment may be configured to score a group of test paper including one or more key features and acquired by a character recognition device in an information acquisition device, the key features in the test paper including keywords. Output neurons of a final output layer of an artificial neural network chip output a judgment result through computation of the artificial neural network chip, and the judgment result is confidence of appearance of the key features of the test paper, for example, confidence of appearance of the keywords. Confidence within [0, 1] represents a probability of appearance of the key feature. The probability of appearance of the keyword will be higher if the confidence is higher. If the confidence is binarized to be $\{0, 1\}$, 0 represents that the key feature does not appear and 1 represents that the key feature appears, or 1 represents that the key feature does not appear and 0 represents that the key feature appears. A representation manner for the confidence is not limited to the above two. A layer is added after the final output layer of the artificial neural network chip as a new final output layer, and values of input neurons of the new final output layer are confidence of appearances of key features.

A score may be obtained as follows. A layer is added after the final output layer of an artificial neural network running in the information processing device as a new final output layer, values of input neurons of the new final output layer are confidences of appearance of key features. The new final output layer has only one output neuron, the value of the output neuron is a score value and weights in computation of the new final output layer correspond to importance degrees of each key feature. If the layer has N+1 output neurons, a value range of the score is [0,N]. If the output neurons of the layer are numbered to be 0, 1, 2, . . . , N a value of the $i^{th}$ output neuron corresponds to confidence $P_i$ corresponding to a score value i, and the value of a final score corresponds to highest confidence, in other words, the score=$i_0$, $P_{i_0}$=max $\{P_i | i=0, 1, \ldots, N\}$.

The score may also be obtained as follows. After being obtained in the final output layer of the artificial neural network running in the information processing device, the confidence of appearance of each key feature is taken as input of a scoring unit, and the scoring unit accordingly obtains the score. The scoring unit may obtain the score by multiple methods which may be a complex machine learning algorithm and may also be simple data processing. For example, the scoring unit simply averages the confidences of which values are within [0, 1] and then multiplies a result by 100 to obtain a centesimal score.

The keywords in the test paper are acquired. The keywords and the probabilities of appearance are provided through computation of the artificial neural network, so that the new final output layer is further added or the probabilities are taken as the input of the scoring unit to obtain the score of the test paper. The score is displayed on a display screen of a mobile phone, a computer, a notebook computer, a tablet computer and the like. A user may obtain the score of the test paper through the display screen.

Referring to FIG. 12, a specific processing process for the keywords in the artificial neural network chip is as follows.

In step 1, the external data acquired by the character recognition device, image recognition device and voice recognition device in the information acquisition device is transmitted into a storage module of the artificial neural network chip after preprocessing or directly. After the external data is preprocessed, the external data may be more suitable to be processed by an artificial neural network to remove noise and redundancy in the input data and improve classification and recognition accuracy and the like.

In step 2, a DMA transmits the data in the storage module into corresponding on-chip caches (for example, an instruction cache, an input neuron cache and a weight cache) in batches. In the artificial neural network chip, the dedicated on-chip caches (for example, the instruction cache, the input neuron cache, an output neuron cache and the weight cache) and a dedicated artificial neural network operation instruction and a memory access instruction are adopted, so that computational and memory access efficiency may be effectively improved.

In step 3, a controlling unit reads an instruction from the instruction cache and decodes and transmits the instruction decoded into a computation module.

In step 4, the computation module may perform corresponding computation according to the instruction. In each layer of the neural network, computation performed by the computation module may include, but is not limited to a first part including a multiplier, a second part including one or more adders (more specifically, the adders of the second part form an adder tree), a third part including an activation function unit and/or a fourth part including a vector processing unit. More specifically, the vector processing unit may process vector computation and/or pooling computation. The first part multiplies input data 1 (in1) and input data 2 (in2) to obtain multiplied output (out), and a process is represented with out=in1×in2. The second part adds the input data in1 through the adders to obtain output data (out). More specifically, if the second part is the adder tree, the input data in1 is added step by step through the adder tree to obtain the output data (out). Data In1 is a vector with a length N, and N is greater than 1. A process is represented with out=in1[1]+in1[2]+ . . . +in1[N] and/or the input data 1 (in1) is accumulated through the adder tree and then is added with the input data 2 (in2) to obtain the output data (out). A process is represented with out=in1[1]+in1[2]+ . . . +in1[N]+in2. Alternatively, the input data 1 (in1) and the input data 2 (in2) are added to obtain the output data (out), and a process is represented with out=in1+in2. The third part may perform computation on the input data (in) through an activation function to obtain active output data (out), and a process is represented with out=active(in). The activation function may be sigmoid, tan h, relu, softmax and the like. Besides an activation operation, the third part may implement another nonlinear function and may perform computation ($f$) on the input data (in) to obtain the output data (out), and a process is represented with out=$f$(in). The vector processing unit may perform the pooling computation on the input data (in) to obtain output data (out) after a pooling operation, and a process is represented with out=pool(in). Pool is the pooling operation, and the pooling operation may include, but is not limited to AVGPOOLING, MAXPOOLING and median pooling. The input data (in) is data in a pooling core related to output out. The computation of one or more parts of the above-mentioned parts may be freely selected for combination in different sequences, thereby implementing computation of various functions.

In the artificial neural network chip, multiple groups of weights and input neurons may be concurrently processed by the adder tree computation adopted by the computation module, so that the computational efficiency can be improved.

In step 5, step 2 to step 4 are repeated until computation for all the data in the storage module is completed, for example, obtaining a final result required by a function. The final result is obtained by the output neurons of the final layer of the neural network, is output from the computation module to the output neuron cache and is returned to the storage module through the DMA.

According to the requirement of the function, if the judgment result is required to be obtained, values of the output neurons of the final layer of the neural network are the confidences of appearance of the keywords. The final layer has only one output neuron, the value of the output neuron is the score of the test paper, and the weights in the computation of the new final output layer correspond to the importance degrees of each key feature. If the layer has N+1 output neurons, a value range of the score is [0,N]. If the output neurons of the layer are numbered to be 0, 1, 2, . . . , N, a value of the $i^{th}$ output neuron corresponds to confidence $P_i$ corresponding to a score value i, and the value of a final score corresponds to highest confidence, in other words, the score=$i_0$, $P_{i_0}$=max $\{P_i | i=0, 1, \ldots, N\}$. The highest score value is the score of the test paper.

The score may also be obtained as follows. After being obtained in the final output layer of the artificial neural network running in the information processing device, the confidence of appearance of each key feature is taken as input of the scoring unit, and the scoring unit accordingly obtains the score. The scoring unit may obtain the score by multiple methods which may be a complex machine learning algorithm and may also be simple data processing. For example, the scoring unit simply averages the confidences of which values are within [0, 1] and then multiplies a result by 100 to obtain a centesimal score.

Embodiment 2

An information processing device of the embodiment may be configured to score a video, in which the video may be a group of pictures including one or more key features. A storage module in an artificial neural network chip pre-stores one or more key pictures. The storage module acquires the video from the outside and transmits it to a computation module. Output neurons of a final output layer of the artificial neural network chip output a judgment result through computation of the artificial neural network chip, and the judgment result may include a similarity between each input picture and each key picture. To be more specific, if there are N input pictures and M key pictures, N×M similarities are obtained. In the embodiment, the similarities are confidences, and the confidence is a natural number within a certain range. Confidence within [0, 1] represents a probability of appearance of the key feature. If the confidence is binarized to be {0, 1}, 0 represents that the key feature does not appear and 1 represents that the key feature appears, or 1 represents that the key feature does not appear and 0 represents that the key feature appears. A representation manner for the confidence is not limited to the above two.

A layer is added after the final output layer of the artificial neural network chip as a new final output layer, and values of input neurons of the new final output layer are confidence of appearance of each key feature. The confidence is the similarities between the input pictures and each key picture. If the new final output layer has only one output neuron, the value of the output neuron is a score of the video and weights in computation of the new final output layer correspond to importance degrees of each similarity. Or the layer has N+1 output neurons, a value range of the score is [0,N]. If the output neurons of the layer are numbered to be 0, 1, 2, ..., N, a value of the $i^{th}$ output neuron corresponds to confidence $P_i$ corresponding to a score value i, and the value of a final score corresponds to highest confidence, in other words, the score=$i_0$, $P_{i_0}$=max{$P_i$|i=0, 1, ..., N}. The score value corresponding to the highest confidence is the score of the video.

The score may also be obtained as follows. After being obtained in the final output layer of the artificial neural network running in the information processing device, the confidence of appearance of each key feature is taken as input of a scoring unit, and the scoring unit accordingly obtains the score. The scoring unit may obtain the score by multiple methods which may be a complex machine learning algorithm and may also be simple data processing. For example, the scoring unit simply averages the confidences of which values are within [0, 1] and then multiplies a result by 100 to obtain a centesimal score.

The score is displayed on a display screen of a mobile phone, a computer, a notebook computer, a tablet computer and the like. A user may obtain the score of the video through the display screen.

The video may further include an audio, and the audio is divided into multiple segments of audios. The multiple segments of audios correspond to multiple pictures. The chip may perform comparison to obtain similarities between all the pictures in the video and each key picture and/or may perform comparison to obtain similarities between each waveform obtained by decomposing all the audios in the video and key waveforms to score the video.

Another method for obtaining the similarities is as follows. Each output neuron of the final output layer of the neural network corresponds to an input picture, and a value of the output neuron is the similarity between the key picture most similar to the input picture and the input picture. To be kept consistent with the above example, the layer has total N output neurons.

Another method for obtaining the similarities is as follows. Each output neuron of the final output layer of the neural network corresponds to a key picture, and the value of the output neuron is the similarity between the input picture most similar to the key picture and the key picture. To be kept consistent with the above example, the layer has total M output neurons.

Referring to FIG. 12, a specific processing process for video data in the artificial neural network chip is as follows. In step 1, external data acquired by a character recognition device, an image recognition device and a voice recognition device in an information acquisition device is transmitted into the storage module of the artificial neural network chip after preprocessing or directly. A preprocessing module in the device may make the external data more suitable to be processed by an artificial neural network to remove noise and redundancy in the input data and improve classification and recognition accuracy and the like.

In step 2, a DMA transmits the data in the storage module into corresponding on-chip caches, in other words an instruction cache, an input neuron cache and a weight cache, in batches. In the artificial neural network chip, the dedicated on-chip caches (in other words the instruction cache, the input neuron cache, an output neuron cache and the weight cache) and a dedicated artificial neural network operation instruction and memory access instruction are adopted, so that computational and memory access efficiency may be effectively improved.

In step 3, a controlling unit reads an instruction from the instruction cache and decodes and transmits the instruction into a computation module.

In step 4, the computation module may perform corresponding computation according to the instruction in each layer of the neural network.

Computation performed by the computation module may include neural network computation.

The computation module may include, but is not limited to, a first part including a multiplier, a second part including one or more adders (more specifically, the adders of the second part form an adder tree), a third part including an activation function unit, and/or a fourth part including a vector processing unit. More specifically, the vector processing unit may process vector computation and/or pooling computation. The first part multiplies input data 1 (in1) and input data 2 (in2) to obtain multiplied output (out), and a process is represented with out=in1×in2. The second part adds the input data in1 through the adders to obtain output data (out). More specifically, if the second part is the adder tree, the input data in1 is added step by step through the adder tree to obtain the output data (out). In1 is a vector with a length N, in which N may be greater than 1, and a process is represented with out=in1[1]+in1[2]+ ... +in1[N], and/or the input data 1 (in1) is accumulated through the adder tree and then is added with the input data 2 (in2) to obtain the output data (out). A process is represented with out=in1[1]+in1[2]+ ... +in1[N]+in2, or the input data 1 (in1) and the input data 2 (in2) are added to obtain the output data (out), and a process is represented with out=in1+in2. The third part may perform computation on the input data (in) through an activation function to obtain active output data (out), and a process is represented with out=active(in), and the activation function may be sigmoid, tan h, relu, softmax and the like. Besides an activation operation, the third part may implement another nonlinear function and may perform computation (f) on the input data (in) to obtain the output data (out), and a process is represented with out=f(in). The vector processing unit may perform the pooling computation on the input data (in) to obtain output data (out) after a pooling operation, and a process is represented with out=pool(in), wherein pool is the pooling operation, the pooling operation may include, but is not limited to: AVGPOOLING, MAXPOOLING and median pooling, and the input data (in) is data in a pooling core related to output out. The computation of one or more parts of the abovementioned parts may be freely selected for combination in different sequences, thereby implementing computation of various functions.

In the artificial neural network chip, multiple groups of weights and input neurons can be concurrently processed by the adder tree computation adopted by the computation module, so that the computational efficiency can be improved.

In step 5, step 2 to step 4 are repeated until computation for all the data in the storage module is completed, for example, obtaining a final result required by a function. The final result is obtained by the output neurons of the final layer of the neural network, is output from the computation module to the output neuron cache and is returned to the storage module through the DMA.

According to the requirement of the function, if the similarities are required to be obtained, values of the output neurons of the final layer of the neural network are similarity values. If scoring is required, a layer is added after the final output layer as a new final output layer, and values of input neurons of the new final output layer are the similarity values. The new final output layer has only one output neuron, the value of the output neuron is the score of the video, and the weights in the computation of the new final output layer correspond to importance degrees of each similarity value. If the layer has N+1 output neurons, a value range of the score is [0,N], if the output neurons of the layer are numbered to be 0, 1, 2, . . . , N, a value of the $i^{th}$ output neuron corresponds to confidence $P_i$ corresponding to a score value i, and the value of a final score corresponds to highest confidence, in other words, the score=$i_0$, $P_{i_0}$=max$\{P_i|i=0, 1, \ldots, N\}$. The highest score value is the score of the video.

The score may also be obtained as follows. After being obtained in the final output layer of the artificial neural network running in the information processing device, the confidence of appearance of each key feature is taken as input of the scoring unit, and the scoring unit accordingly obtains the score. The scoring unit may obtain the score by multiple methods which may be a complex machine learning algorithm and may also be simple data processing. For example, the scoring unit simply averages the confidences of which values are within [0, 1] and then multiplies a result by 100 to obtain a centesimal score.

The artificial neural network chip is of powerful computation capability, supports offline running of the neural network and may work for automatic scoring monitoring without assistance of a cloud server in computation if a user terminal/front end is offline. If the chip is online and assisted by the cloud server for computation, the computation capability of the chip is more powerful. The artificial neural network chip automatically scores movements in the pictures in the video instead a worker, which is more accurate and faster than manual scoring. A subjective question may be evaluated more objectively, and influence of hobbies of a person is avoided. According to the device and method of the embodiment, the movements/postures of the user are monitored instantly, a prompt is automatically and instantly given to regulate the movements/postures of the user, and the method and the device work for training and monitoring instead of the worker, and are more accurate and instant than the worker.

The artificial neural network chip may perform adaptive training, and the chip accumulates data of the user for self-learning and may be gradually adapted to, for example, handwritings, habitual writing errors, postural characteristics and habitual movements of the user to constantly improve the accuracy and improve a movement/posture regulation capability for the user.

All of the modules in the embodiment of the disclosure may be hardware structures. Physical implementations of the hardware structures may include, but are not limited to, physical devices, and the physical devices may include, but are not limited to, transistors, memristors and Deoxyribonucleic Acid (DNA) computers.

Figure 19:
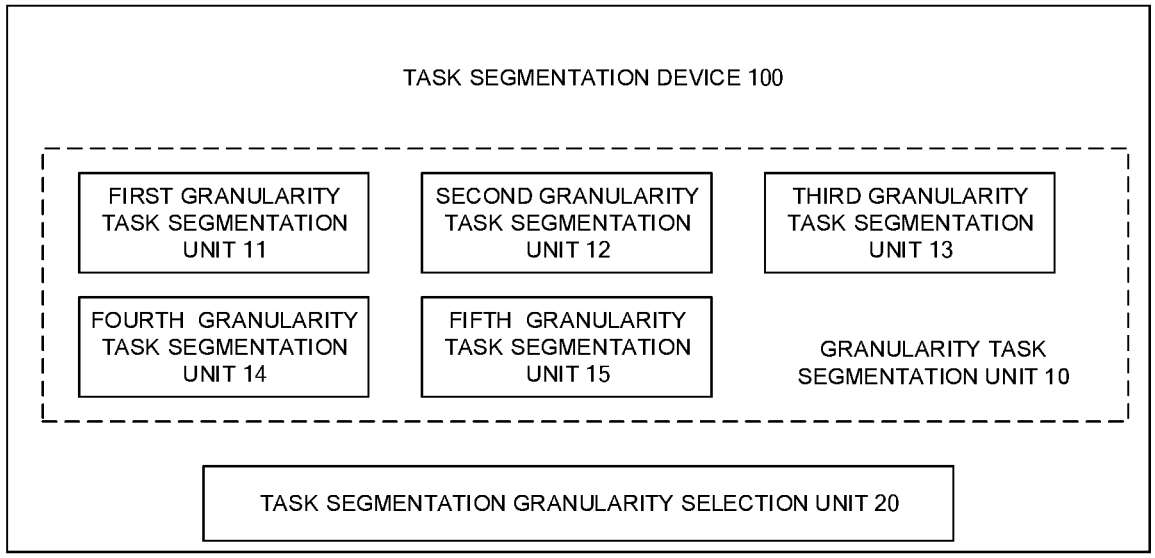
FIG. 19 is a structure block diagram of a task segmentation device according to an embodiment of the disclosure.

An embodiment of the disclosure provides a task segmentation device. FIG. 19 is a structure block diagram of the task segmentation device according to an embodiment of the disclosure. As illustrated in FIG. 19, the task segmentation device 100 may include a granularity task segmentation unit 10 and a task segmentation granularity selection unit 20. The granularity task segmentation unit 10 segments a task by adopting at least one granularity to form subtasks to provide multi-granularity task segmentation selection for a neural network application. The task segmentation granularity selection unit 20 selects the granularity to be adopted for task division to guide a neural network to select the most suitable task segmentation granularity to ensure that the subtasks obtained by segmentation may meet system real-time performance.

In an embodiment, as illustrated in FIG. 19, the granularity task segmentation unit 10 may include a first granularity task segmentation unit 11, a second granularity task segmentation unit 12, a third granularity task segmentation unit 13, a fourth granularity task segmentation unit 14 and a fifth granularity task segmentation unit 15.

The five granularity task segmentation units will be specifically introduced below. Assuming that the neural network application is required to complete computation for M samples and a topological structure of the neural network is formed by N layers, and M and N are positive integers greater than 0.

The first granularity task segmentation unit 11 takes the whole task as a subtask, and specifically, completion of computation for the M samples is taken as a subtask. In such a task segmentation manner, only one subtask is generated, and there is no dependency relationship between subtasks.

The second granularity task segmentation unit 12 takes completion of computation for multiple samples as a subtask. The neural network is segmented into m subtasks, and the $i^{th}$ task completes computation for Mi samples. M is a positive integer greater than 1 and less than or equal to M, i=1, 2, 3, . . . m, Mi is a positive integer greater than 0 and less than M and M1+M2+ . . . +Mm=M is met. There is no dependency relationship between the m subtasks obtained in such a task segmentation manner.

The third granularity task segmentation unit 13 may perform task segmentation on the neural network application according to layer types of the neural network, computation for layers of the same type being taken as a task. The layer types of the neural network may include, but are not limited to, a convolutional layer, a fully connected layer, an LSTM layer, a pooling layer, an active layer, an LRN layer and a Batch Normalization (BN) layer. There is a complex dependency relationship between subtasks obtained in such a task segmentation manner.

The fourth granularity task segmentation unit 14 may perform task segmentation on the neural network application according to an interlayer structure of the neural network, computation for multiple adjacent layers being taken as a subtask. The neural network application is segmented into n subtasks, a first subtask completes computation for a first layer to $N1^{th}$ layer, total N1 layers, of the neural network. A second subtask completes neural network computation for an $(N1+1)^{th}$ layer to an $(N1+N2)^{th}$ layer, total N2 layers and an $i^{th}$ subtask completes computation for an $(N1+ \ldots +Ni-1+1)^{th}$ layer to an $(N1+ \ldots +Ni)^{th}$ layer, total Ni layers. n is a positive integer greater than 0 and less than or equal to N, i=1, 2, 3, . . . n, Ni being a positive integer greater than 0 and less than or equal to N and N+N2+ . . . +Ni+ . . . +Nn=N is met. There is a chain dependency relationship between the subtasks obtained in such a task segmentation manner, wherein the $i^{th}$ subtask is a precursor task of an $(i+1)^{th}$ subtask, the $(i+1)^{th}$ subtask is a subsequent task of the $i^{th}$ task, and execution of the $(i+1)^{th}$ task may be started only after the $i^{th}$ task is completed.

The fifth granularity task segmentation unit 15 may perform task segmentation on the neural network application according to intra-layer structures of the neural network, and computation in the layers of the neural network may be further segmented into subtasks. Segmentation according to computation in the layers of the neural network may include, but is not limited to, task segmentation on convolutional layer computation, fully connected layer computation, pooling layer computation or active layer computation of the neural network.

Task segmentation may be performed on the convolutional layer computation of the neural network. Input neurons of the convolutional layer form a three-dimensional matrix (Nfin, Nxin, Nyin). Weights form a four-dimensional matrix (Nfout, Nfout, Kx, Ky) and output neurons form a three-dimensional matrix (Nfout, Nxout, Nyout). Nfin is the count of input feature image. (Nxin, Nyin) is an input feature image size. Nfout is the count of output feature image. (Kx, Ky) is a convolution kernel size, and (Nxout, Nyout) is an output feature image size. Multiplication and addition computation is required to be performed for Nfin×Kx×Ky times for completion of an output neuron, an output neuron number is Nfout×Nxout×Nyout, and the multiplication and addition computation is required to be performed for total Nfout×Nxout×Nyout×Nfin×Kx×Ky times for completion of the whole convolutional layer. During task segmentation, the output neurons are segmented according to a block size of (Bfout, Bxout, Byout), and the weights are simultaneously segmented according to a block size of (Bfout, Bfin, Bx, By). Then, each subtask computes intermediate results of Bfout×Bxout×Byout output neurons by use of weights (Bfout, Bfin, Bx, By). The multiplication and addition computation may be performd for Bfin×Bx×By times for the intermediate result of each output neuron, and the multiplication and addition computation is required to be completed for total Bfout×Bxout×Byout×Bfin×Bx×By times. Bfout represents a positive integer greater than 0 and less than or equal to Nfout. Bxout represents a positive integer greater than 0 and less than equal to Nxout. Byout represents a positive integer greater than 0 and less than or equal to Nyout. Bfin represents a positive integer greater than 0 and less than or equal to Nfin. Bx represents a positive integer greater than 0 and less than or equal to Kx. By represents a positive integer greater than 0 and less than or equal to Ky. There is no dependency relationship between the subtasks obtained in such a task segmentation manner.

Task segmentation may be performed on the fully connected layer computation of the neural network. Input neurons of the fully connected layer are Nin. Weights form a two-dimensional matrix (Nout, Nin) and output neurons are Nout. Nin is an input neuron number, and Nout is an output neuron number. Multiplication and addition computation is required to be performed for Nin times for completion of an output neuron, the output neuron number is Nout, and the multiplication and addition computation is required to be performed for total Nout×Nin times for completion of the whole fully connected layer. During task segmentation, the output neurons are segmented according to a block size of Bout, and the weights are simultaneously segmented according to a block size of (Bout, Bin). Then, each subtask computes intermediate results of Bout output neurons by use of weights (Bout, Bin). The multiplication and addition computation is required to be performed for Bin times for the intermediate result of each output neuron, and the multiplication and addition computation is required to be completed for total Bout×Bin times. Bout is a positive integer greater than 0 and less than or equal to Nout, and Bin is a positive integer greater than 0 and less than or equal to Nin. There is no dependency relationship between the subtasks obtained in such a task segmentation manner.

Task segmentation may be performed on the pooling layer computation of the neural network. Input neurons of the pooling layer are Nin and output neurons are Nout. Nin and Nout are positive integers greater than 0. A pooling operation may include, but is not limited to, avgpooling, maxpooling and median pooling. During task segmentation, the output neurons are segmented according to a block size of Bout, and each subtask completes computation for Bout output neurons. Bout is a positive integer greater than 0 and less than or equal to Nout and Bin is a positive integer greater than 0 and less than or equal to Nin. There is no dependency relationship between the subtasks obtained in such a task segmentation manner.

Task segmentation may be performed on the active layer computation of the neural network. Input neurons of the active layer are Nin and output neurons are Nout. Nin and Nout are positive integers greater than 0. An activation function may include, but is not limited to, sigmoid, tan h, relu or softmax. During task segmentation, the output neurons are segmented according to a block size of Bout, and each subtask completes computation for Bout output neurons, wherein Bout is a positive integer greater than 0 and less than or equal to Nout. There is no dependency relationship between the subtasks obtained in such a task segmentation manner.

If selecting the granularity to be adopted for task division, the task segmentation granularity selection unit 20 is not limited to select the above-mentioned granularity only, and a combination of multiple granularities may also be selected. For example, segmentation manners of the fourth granularity task segmentation unit and the fifth granularity task segmentation unit may be combined for a neural network application. The neural network application is segmented into n subtasks at first according to the segmentation manner of the fourth granularity task segmentation unit 14, and then p subtasks are segmented according to the segmentation manner of the fifth granularity task segmentation unit 15.

In another embodiment, the granularity task segmentation unit 10 may include at least one of the first to fifth granularity task segmentation units and not always may include all of the first to fifth granularity task segmentation units.

In another embodiment, the granularity task segmentation unit 10 may further include a hybrid granularity task segmentation unit configured to combine segmentation manners of the first to fifth granularity task segmentation units for the task segmentation granularity selection unit 20 to select.

Figure 20:
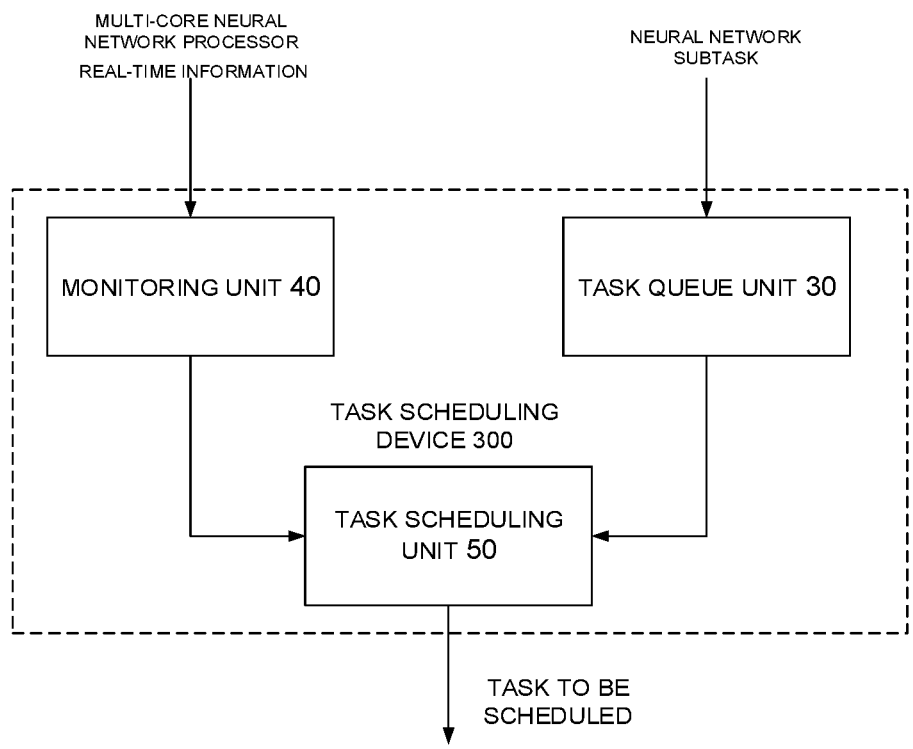
FIG. 20 is a structure block diagram of a task scheduling device according to an embodiment of the disclosure.

Another embodiment of the disclosure provides a task scheduling device. FIG. 20 is a structure block diagram of a task scheduling device according to an embodiment of the disclosure. As illustrated in FIG. 20, the task scheduling device 300 may include a task queue unit 30, a monitoring unit 40 and a task scheduling unit 50. The neural network task scheduling device 300 may implement task scheduling in comprehensive consideration of a dependency relationship between tasks, limitations of the tasks, a task segmentation granularity and running frequencies and loads of cores to improve quality of service, increase utilization rates of the cores, ensure task balance between the cores and reduce energy consumption.

The task queue unit 30 caches all unscheduled neural network tasks and may selectively store execution time of each task to be scheduled, a task dependency relationship diagram and a processing distribution condition of task resources in the cores. The neural network tasks are, for example, the subtasks segmented in the above embodiment.

The monitoring unit 40 detects overall quality of service of a multi-core neural network processor and a working state of each core, for example, a utilization rate, workload, working frequency, the count of tasks in a private task queue in the core and task completion time of each core in real time.

The task scheduling unit 50 selects a task to be scheduled from the unscheduled tasks, determines a mapping relationship between a task to be unscheduled and a target core according to information about the task to be scheduled and the working state of each core, and allocates the task to be scheduled to a target core.

The task scheduling unit 50 may schedule tasks to be scheduled in the task queues at a time interval T, in which T may be a real number greater than 0. If a task t to be scheduled forms a dependency relationship with another task and a precursor task is not completed, the task scheduling unit 50 may not schedule the task t.

The task scheduling unit 50 may select the task to be scheduled from the unscheduled tasks in at least one of the following manners. A task is selected randomly. The task of which estimated execution time is longest may be selected. The task of which the estimated execution time is shortest may be selected. The task occupying most resources and selecting the task occupying fewest resources may be selected.

The task scheduling unit 50 may allocate and schedule the task to be scheduled to the target core in at least one of the following scheduling manners.

The first scheduling manner is to make statistics on the count of the tasks in the private task queue of each core, select the core with the fewest tasks in the private task queue as the target core and allocate the task to be scheduled to the target core.

The second scheduling manner is to make statistics on the time for completion of all the tasks in the private task queue of each core, select the core of which the task completion time is shortest as the target core and allocate the task to be scheduled to the target core.

The third scheduling manner is to make statistics on a distribution condition of resources required by the task to be scheduled in all the cores, select the core with the most resources as the target core and allocate the task to be scheduled to the target core.

The fourth scheduling manner is to allocate the task to be scheduled to the target core by adopting a heuristic algorithm, in which the heuristic algorithm includes, but is not limited to, a genetic algorithm, an ant colony algorithm and a simulated annealing algorithm.

Figure 21:
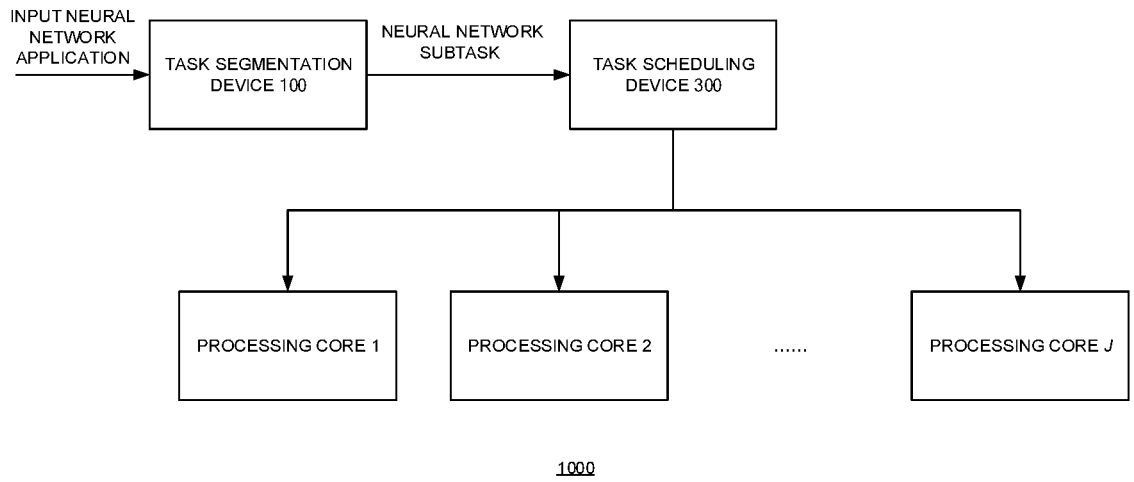
FIG. 21 is a structure block diagram of a multi-core processor according to yet another embodiment of the disclosure.

Another embodiment of the disclosure provides a multi-core processor, for example, a multi-core neural network processor. FIG. 21 is a structure block diagram of a multi-core processor according to another embodiment of the disclosure. As illustrated in FIG. 21, the multi-core neural network processor 1000 may include J processing cores, in which J may be a positive integer greater than 1, and the task segmentation device 100 and task scheduling device 300 in the above-mentioned embodiments.

The task segmentation device 100 segments an input neural network application in a manner that subtasks obtained by segmentation may meet system real-time performance. The task scheduling device 300 may perform neural network subtask scheduling and may improve quality of service, increase utilization rates of the cores, ensure task balance between the processing cores and reduce energy consumption. The neural network processing cores may perform neural network computation to complete the neural network subtasks. A topological structure between the J neural network processing cores may include, but is not limited to, a one-dimensional linear structure, a two-dimensional mesh structure, a two-dimensional star structure, a three-dimensional cube structure and the like.

Figure 22:
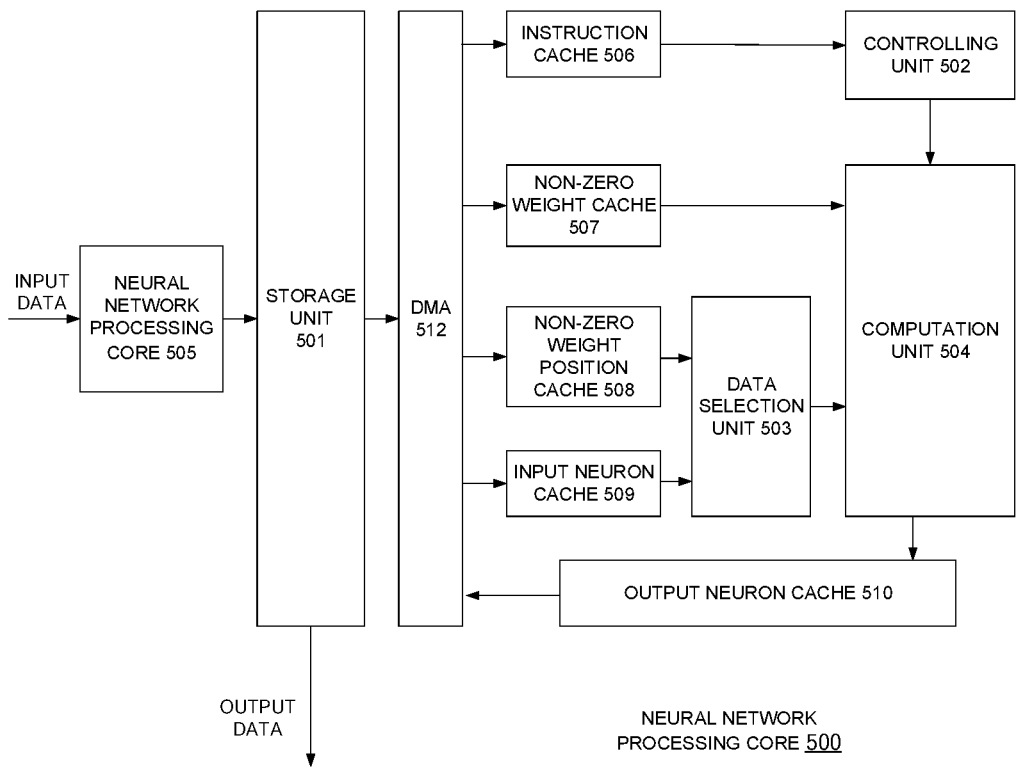
FIG. 22 is a structure block diagram of each neural network processing core for neural network processing according to yet another embodiment of the disclosure.

FIG. 22 is a structure block diagram of each neural network processing core for neural network processing according to another embodiment of the disclosure. As illustrated in FIG. 22, the neural network processing core 500 may include a storage unit 501, a controlling unit 502, a data selection unit 503 and a computation unit 504.

The storage unit 501 may be configured to store neurons, weights and instructions of a neural network. If a neural network subtask processes a sparse neural network, the stored weights are non-zero weights and position information of non-zero weights.

The instruction controlling unit 502 may be configured to receive a neural network-dedicated instruction and decode it to generate control information to control the data selection unit and the computation unit.

The neural network dedicated instruction may include any instruction dedicated to completion of artificial neural network computation. The neural network dedicated instruction may include, but is not limited to, a control instruction, a data transfer instruction, an operation instruction and a logical instruction. The control instruction controls a neural network execution process. The data transfer instruction completes data transfer between different storage media, and a data format may include, but is not limited to, a matrix format, a vector format and a scalar format. The operation instruction completes an arithmetic computation of the neural network, and may include, but is not limited to, a matrix operation instruction, a vector operation instruction, a scalar operation instruction, a convolutional neural network operation instruction, a fully connected neural network operation instruction, a pooling neural network operation instruction, an RBM neural network operation instruction, an LRN neural network operation instruction, an LCN neural network operation instruction, an LSTM neural network operation instruction, an RNN operation instruction, an RELU neural network operation instruction, a PRELU neural network operation instruction, a SIGMOID neural network operation instruction, a TANH neural network operation instruction and a MAXOUT neural network operation instruction. The logical instruction completes logical computation of the neural network, and may include, but is not limited to, a vector logical operation instruction and a scalar logical operation instruction.

The RBM neural network operation instruction may be configured to implement RBM neural network computation.

The LRN neural network operation instruction may be configured to implement LRN neural network computation.

The LSTM neural network operation instruction may be configured to implement LSTM neural network computation.

The RNN operation instruction may be configured to implement RNN computation.

The RELU neural network operation instruction may be configured to implement RELU neural network computation.

The PRELU neural network operation instruction may be configured to implement PRELU neural network computation.

The SIGMOID neural network operation instruction may be configured to implement sigmoid growth curve (SIGMOID) neural network computation.

The TANH neural network operation instruction may be configured to implement hyperbolic tangent function (TANH) neural network computation.

The MAXOUT neural network operation instruction may be configured to implement MAXOUT neural network computation.

More specifically, the neural network dedicated instruction may include a Cambricon instruction set.

The Cambricon instruction set is characterized in that the length of each instruction in the instruction set is 64 bit and each instruction consists of an operation code and an operand. The instruction set may include four types of instructions, in other words control instructions, data transfer instructions, operation instructions and logical instructions.

Further, the control instructions may be configured to control an execution process. The control instructions may include a jump instruction and a conditional branch instruction.

Further, the data transfer instructions may be configured to complete data transfer between different storage media. The data transfer instructions may include a load instruction, a store instruction and a move instruction. The load instruction may be configured to load data from a main memory to a cache, the store instruction may be configured to store the data from the cache to the main memory, and the move instruction may be configured to move the data between the cache and another cache or the cache and a register or the register and another register. The data transfer instruction supports three different data organization manners, including the matrix, the vector and the scalar.

Further, the operation instructions may be configured to complete the arithmetic computations of the neural network. The operation instructions may include a matrix operation instruction, a vector operation instruction and a scalar operation instruction.

Furthermore, the matrix operation instruction may be configured to complete matrix computation in the neural network, including matrix multiply vector computation, vector multiply matrix computation, matrix multiply scalar computation, outer product computation, matrix add matrix computation and matrix subtract matrix computation.

Furthermore, the vector operation instruction may be configured to complete vector computation in the neural network, including vector elementary arithmetic, vector transcendental functions computation, dot product computation, random vector generator computation and maximum/minimum of a vector computation, where the vector elementary arithmetic computation may include vector addition, subtraction, multiplication and division, and the vector transcendental functions refer to those functions which do not meet any polynomial equations taking polynomials as coefficients, and may include, but are not limited to, an exponential function, a logarithmic function, a trigonometric function and an anti-trigonometric function.

Furthermore, the scalar operation instruction may be configured to complete scalar computation in the neural network, including scalar elementary arithmetic and scalar transcendental functions computation, where the scalar elementary arithmetic computation may include scalar addition, subtraction, multiplication and division, and the scalar transcendental functions refer to those functions which do not meet any polynomial equations taking polynomials as coefficients, and may include, but are not limited to, an exponential function, a logarithmic function, a trigonometric function and an anti-trigonometric function.

Further, the logical instructions may be configured for the logical computation of the neural network. The logical instructions may include vector logical operation instructions and scalar logical operation instructions.

Furthermore, the vector logical operation instructions may include vector compare instructions, vector logical operations instructions and vector greater than merge instructions, where "vector compare" may include, but is not limited to, greater than, less than, equal to, greater than or equal to, less than or equal to and unequal to; and the vector logical operations may include AND, OR and NOT.

Furthermore, the scalar logical operation instructions may include scalar compare instructions and scalar logical operations instructions, where "scalar compare" may include, but is not limited to, greater than, less than, equal to, greater than or equal to, less than or equal to and unequal to; and the scalar logical operations may include AND, OR and NOT.

The data selection unit 503 may be configured to receive input neurons and the position information of non-zero weights, and select neurons corresponding to the non-zero weights. In other words, for each output neuron data, the data selection unit removes input neuron data which have no non-zero weight data corresponding to the output neuron data.

The computation unit 504 may be configured to receive the neurons corresponding to the input non-zero weights and the corresponding non-zero weights, complete neural network training computation and retransmit the output neurons to a storage part.

Specifically, the computation unit 504 may perform corresponding computation on the data according to the instruction stored in the storage unit. The computation unit 504 may include, but is not limited to, three parts, where a first part may include a multiplier, a second part may include one or more adders and a third part may include an activation function unit. Preferably, the one or more adders of the second part form an adder tree. The first part multiplies input data 1 (in1) and input data 2 (in2) to obtain multiplied output (out), and a process is represented with out=in1×in2. The second part adds the input data 1 (in1) through the adder tree step by step to obtain output data (out), where in1 is a vector with a length N, in which N may be greater than 1, and a process is represented with out=in1[1]+in1[2]+ . . . +in1[N]; and/or the input data 1 (in1) is accumulated through the adder tree and then is added with the input data 2 (in2) to obtain the output data (out), and a process is represented with out=in1[1]+in1[2]+ . . . +in1[N]+in2; or the input data 1 (in1) and the input data 2 (in2) are added to obtain the output data (out), and a process is represented with out=in1+in2. The third part may perform an activation function computation on the input data (in) to obtain activation output data (out), and a process is represented with out=active(in), where the activation function may be sigmoid, tan h, relu, softmax and the like. Besides an activation operation, the third part may implement another nonlinear function and may perform computation (f) on the input data (in) to obtain the output data (out): out=f(in).

The computation unit may further include a pooling unit. The pooling unit may perform pooling computation on the input data (in) to obtain output data (out) pooled, and the process is out=pool(in), where pool is the pooling operation, which may include but is not limited to: avgpooling, maxpooling and median pooling, and the input data (in) is the data related to the output (out) in a pooling core.

The computation unit may perform, but is not limited to, the following computation. The first part multiplies the input data and the input data to obtain multiplied data. The second part may perform adder tree computation to add the input data through the adder tree step by step or add the input data and the input data to obtain the output data, the third part may perform the activation function computation, performing the activation function computation on the input data to obtain the output data. The computation of the abovementioned parts may be freely combined, thereby implementing computation of various functions.

The neural network processing core 500 may further include a preprocessing module 505. As illustrated in FIG. 4, the module preprocesses original data, including segmentation, Gaussian filtering, binarization, regularization, normalization and the like.

The neural network processing core 500 may further include an instruction cache 506, a non-zero weight cache 507, a non-zero weight position cache 508, an input neuron cache 509 and an output neuron cache 510. The instruction cache 506 may be configured to store a dedicated instruction. The non-zero weight cache 507 may be configured to cache the non-zero weight data. The non-zero weight position cache 508 may be configured to cache non-zero weight position data and make each weight in input data to be in a one-to-one correspondence with the input neurons according to the non-zero weight position data. The input neuron cache 509 may be configured to cache the input neurons. The output neuron cache 510 may be configured to cache the output neurons output by the computation unit.

The non-zero weight position data indicates whether each input neuron data and each output neuron data have corresponding weight data of non-zero weights or not.

In one case, a method for making each weight in input data to be in a one-to-one correspondence with the input neurons by the non-zero weight position cache is to adopt 1 to represent existence of a connection and adopt 0 to represent no connection, and form a character string of 0 and 1 by connection states of an output neuron in each group and all the input neurons to represent a connection relationship of the output neuron. In another case, a method for one-to-one correspondence of the cached non-zero weight positions under another condition is to adopt 1 to represent existence of a connection and adopt 0 to represent no connection, and form a character string of 0 and 1 by connection states of an input neuron in each group and all the output neurons to represent a connection relationship of the input neuron. In another case, a method for one-to-one correspondence of the cached non-zero weight positions under another condition is to obtain a distance between an input neuron corresponding to a first connection of an output neuron in a group and a first input neuron, a distance between an input neuron of the output neuron in a second group and a corresponding previous input neuron, a distance between an input neuron of the output neuron in a third group and a corresponding previous input neuron, and so on until all the input neurons of the output neuron are exhausted to represent a connecting relationship of the output neuron.

Existence of the connection refers to that each input neuron data and each output neuron data have corresponding non-zero weight data. No connection refers to the input neuron data and the output neuron data do not have the corresponding non-zero weight data or not.

The neural network processing core 500 may further include a DMA 512.

The DMA may be configured to read/write the data or the instruction in the storage unit, the instruction cache, the non-zero weight cache, the non-zero weight position cache, the input neuron cache and the output neuron cache.

In some embodiments, a chip is provided, which may include the abovementioned neural network processor.

In some embodiments, a chip packaging structure is provided, which may include the abovementioned chip.

In some embodiments, a board card is provided, which may include the abovementioned chip packaging structure.

In some embodiments, an electronic device is provided, which may include the abovementioned board card.

The electronic device may include a data processing device, a robot, a computer, a printer, a scanner, a tablet computer, an intelligent terminal, a mobile phone, an automobile data recorder, a navigator, a sensor, a webcam, a cloud server, a camera, a video camera, a projector, a watch, an earphone, a mobile storage, wearable equipment, a transportation means, a household electrical appliance and/or medical equipment.

The transportation means may include an airplane, a ship and/or a vehicle. The household electrical appliance may include a television, an air conditioner, a microwave oven, a refrigerator, an electric rice cooker, a humidifier, a washing machine, an electric lamp, a gas cooker and a range hood. The medical equipment may include a nuclear magnetic resonance spectrometer, a B-ultrasonic scanner and/or an electrocardiograph.

Another embodiment of the disclosure provides a task segmentation method, which is used for a neural network. At least one of the following five granularity task segmentation manners is selected for task segmentation.

In a first granularity task segmentation manner, the whole task is taken as a subtask. Specifically, completion of computation for M samples is taken as a subtask. In such a task segmentation manner, only one subtask is generated, and there is no dependency relationship between subtasks.

In a second granularity task segmentation manner, completion of computation for a plurality of samples is taken as a subtask. The neural network is segmented into m subtasks, and the $i^{th}$ task completes computation for Mi samples, where m is a positive integer greater than 1 and less than or equal to M, i=1, 2, 3, . . . m, Mi is a positive integer greater than 0 and less than M, and M1+M2+ . . . +Mm=M is met. There is no dependency relationship between the m subtasks obtained in such a task segmentation manner.

In a third granularity task segmentation manner, task segmentation may be performed on a neural network application according to layer types of the neural network, in which computation for layers of the same type may be taken as a task. The layer types of the neural network may include, but are not limited to, a convolutional layer, a fully connected layer, an LSTM layer, a pooling layer, an active layer, an LRN layer and a BN layer. There is a complex dependency relationship between subtasks obtained in such a task segmentation manner.

In a fourth granularity task segmentation manner, task segmentation may be performed on the neural network application according to an interlayer structure of the neural network, in which computation for a plurality of adjacent layers may be taken as a subtask. The neural network application is segmented into n subtasks, a first subtask completes computation for a first layer to $N1^{th}$ layer, total N1 layers, of the neural network, a second subtask completes neural network computation for an $(N1+)^{th}$ layer to an $(N1+N2)^{th}$ layer, total N2 layers, and an $i^{th}$ subtask completes computation for an $(N1+ \ldots +Ni-1+1)^{th}$ layer to an $(N1+ \ldots +Ni)^{th}$ layer, total Ni layers, where n is a positive integer greater than 0 and less than or equal to N, i=1, 2, 3, . . . n, Ni is a positive integer greater than 0 and less than or equal to N and N+N2+ . . . +Ni+ . . . +Nn=N is met. There is a chain dependency relationship between the subtasks obtained in such a task segmentation manner, where the $i^{th}$ subtask is a precursor task of an $(i+1)^{th}$ subtask, the $(i+1)^{th}$ subtask is a subsequent task of the $i^{th}$ task, and execution of the $(i+1)^{th}$ task may be started only after the $i^{th}$ task is completed.

In a fifth granularity task segmentation manner, task segmentation may be performed on the neural network application according to intra-layer structures of the neural network, and computation in the layers of the neural network may be further segmented into subtasks. Segmentation according to computation in the layers of the neural network may include, but is not limited to, task segmentation on convolutional layer computation, fully connected layer computation, pooling layer computation or active layer computation of the neural network.

Furthermore, an embodiment of the disclosure provides a task scheduling method. Task scheduling may be implemented in comprehensive consideration of a dependency relationship between tasks, task locality, a task segmentation granularity, and running frequencies and loads of cores to improve quality of service, increase utilization rates of the cores, ensure task balance between the cores and reduce energy consumption. The task scheduling method may include the following steps.

All unscheduled neural network tasks are cached.

Specifically, execution time of each task to be scheduled, a task dependency relationship diagram and a processing distribution condition of task resources in the cores may be selectively stored, and the neural network tasks are, for example, the subtasks segmented in the above embodiment.

Overall quality of service of a multi-core neural network processor and a working state of each core are detected in real time.

Specifically, the working state of each core is, for example, a utilization rate, workload, working frequency, the count of tasks in a private task queue in the core and task completion time of each core.

A task to be scheduled is selected from the unscheduled tasks, a mapping relationship between a task to be scheduled and a target core is determined according to information about the task to be scheduled and the working state of each core, and the task to be scheduled is allocated to a target core.

During task scheduling, tasks to be scheduled in the task queues may be scheduled at a time interval T, in which T may be a real number greater than 0. If a task t to be scheduled forms a dependency relationship with another task and a precursor task is not completed, the task t is not scheduled.

A manner for selecting the task to be scheduled from the unscheduled tasks may adopt at least one of the following manners: randomly selecting a task, selecting the task of which estimated execution time is the longest, selecting the task of which the estimated execution time is the shortest, selecting the task occupying the most resources and selecting the task occupying the fewest resources.

The task to be scheduled may be allocated and scheduled to the target core in at least one of the following scheduling manners. A first scheduling manner is to make statistics on the count of the tasks in the private task queue of each core, select the core with the fewest tasks in the private task queue as the target core and allocate the task to be scheduled to the target core.

The second scheduling manner is to make statistics on the time for completion of all the tasks in the private task queue of each core, select the core of which the task completion time is the shortest as the target core and allocate the task to be scheduled to the target core.

A third scheduling manner is to make statistics on a distribution condition of resources required by the task to be scheduled in all the cores, select the core with the most resources as the target core and allocate the task to be scheduled to the target core.

A fourth scheduling manner is to allocate the task to be scheduled to the target core by adopting a heuristic algorithm, in which the heuristic algorithm includes, but is not limited to, a genetic algorithm, an ant colony algorithm and a simulated annealing algorithm.

The processes or methods described in the abovementioned drawings may be performed by processing logics including hardware (for example, a circuit and a dedicated logic), firmware and software (for example, software born on a non-transitory computer-readable medium) or a combination of two. Although the processes or methods have been described above according to some sequential operations, it should be understood that some described operations may be performed in different sequences. In addition, some operations may be performed not sequentially but concurrently.

Figure 23:
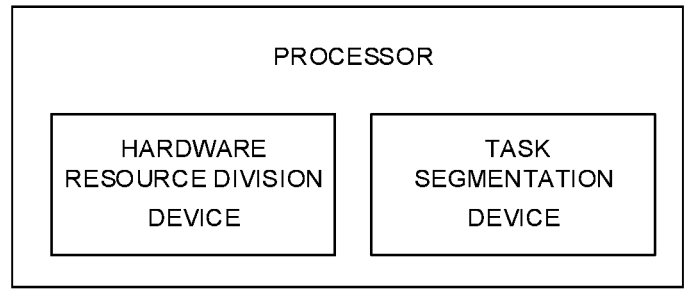
FIG. 23 is a structure block diagram of a processor according to an embodiment of the disclosure.

The disclosure provides a processor. As illustrated in FIG. 23, the processor may include a task segmentation device and a hardware resource division device.

The task segmentation device may be configured to perform task segmentation according to a task segmentation granularity.

The hardware resource division device may be configured to divide hardware resources of the processor according to a task segmentation result.

Figure 24:
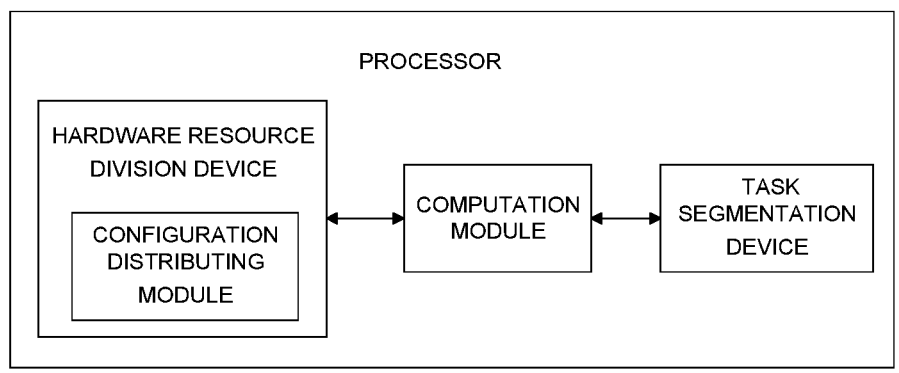
FIG. 24 is a structure block diagram of a processor according to another embodiment of the disclosure.
Figure 25:
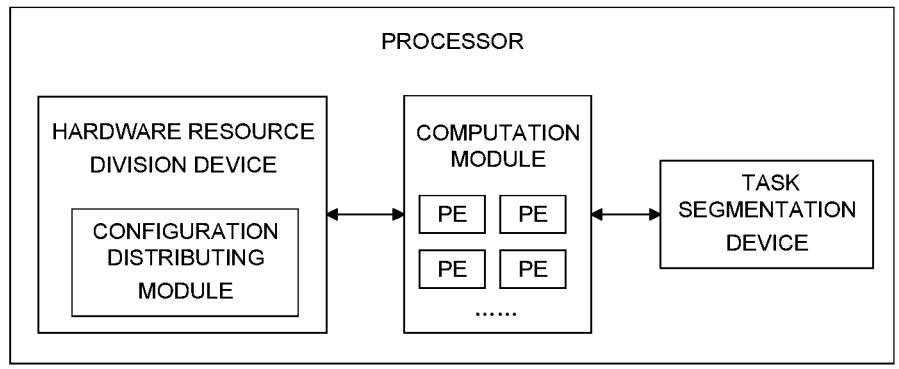
FIG. 25 is a structure block diagram of a processor according to another embodiment of the disclosure.

In an embodiment, as illustrated in FIG. 24-25, the hardware resource division device may include a configuration distributing module configured to distribute configuration information. The configuration information may include configuration information, determined according to the task segmentation result, for division of the hardware resources (at this moment, the corresponding configuration information is determined according to the task segmentation result, and the hardware resources are divided according to the configuration information).

The processor may further include a computation module, in which the computation module may include multiple PEs. The hardware resource division device may be configured to divide the multiple PEs of the processor according to the task segmentation result, for example, dividing the multiple PEs into multiple computation groups according to the task segmentation result, to compute different forward and reverse paths in a batch or run different service requests respectively.

Figure 26:
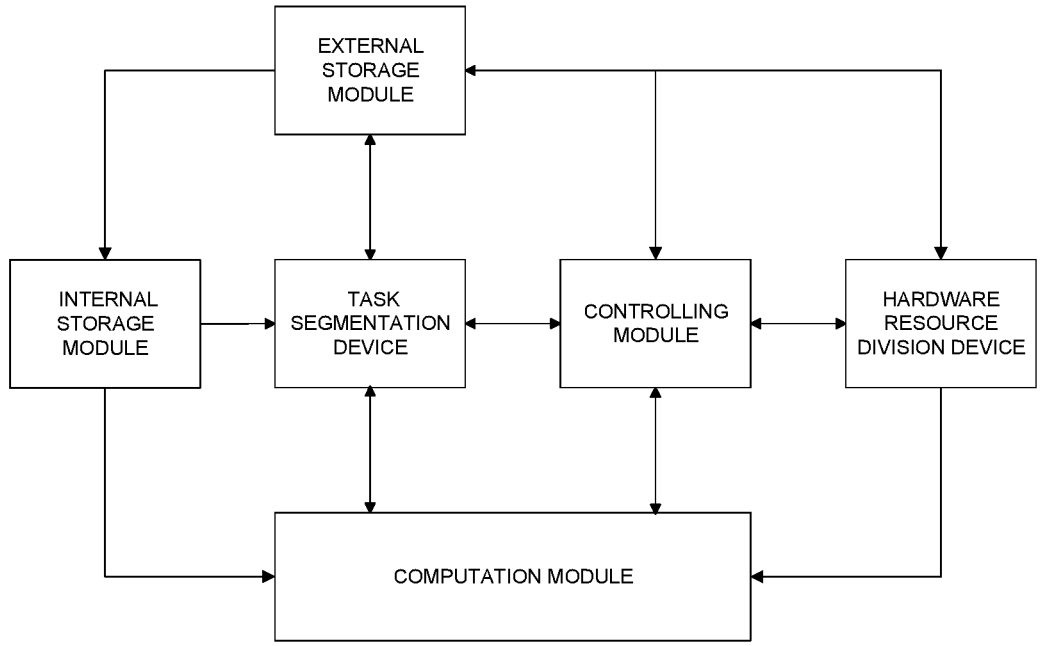
FIG. 26 is a structure block diagram of a processor according to another embodiment of the disclosure.

In an embodiment, as illustrated in FIG. 26, the processor may further include an external storage module, an internal storage module and a controlling module.

The external storage module may be configured to store data information of the computation module, the internal storage module, the controlling module and the configuration distributing module. For example, for neural network computation, the data information may include: weight data, neuron data (including input), instruction data, configuration information and the like.

In addition, the external storage module may provide a read/write interface for an external memory and may configure a related register to flexibly implement operations over different external memories.

The internal storage module may be configured to store data for use by the computation module, including, weights, neurons (including input), instruction data and the like.

The internal storage module may further provide a read/write interface with the external storage module to complete data exchange between the internal storage module and the external storage module.

The controlling module provides an interface for control signal exchange with the external storage module to receive and parse an external control signal, thereby implementing control over the other modules.

The controlling module may further provide a signal exchange interface with the computation module to configure and control the computation module, thereby completing different computation.

The controlling module may further provide a signal exchange interface with the configuration distributing module of the hardware resource division device to send a configuration signal to the configuration distributing module, thereby controlling a function realized by distribution configuration. The controlling module may include a storage unit, and a storage unit may also be configured outside of the controlling module to store different control information.

The controlling module may further provide a signal exchange interface with the task segmentation device to control the task segmentation device to perform task segmentation.

The configuration distributing module may provide a signal exchange interface with the computation module, thereby distributing the configuration information. The configuration information may be configured to configure functions and data connections in the computation module, thereby supporting the computation module to complete batches and multi-service requests. The functions are mainly computation functions of completing a dot product operation, an outer product operation, a nonlinear function operation, a transcendental function operation and the like. Correspondingly, the data connections refers to, for example, the multiple PEs of the computation module are specifically divided into multiple computation groups, according to connection states required by the computation functions and the computation module.

The configuration distributing module may include a storage unit, and a storage unit may also be configured outside of the configuration distributing module to store different configuration information.

The task segmentation device may provide a signal exchange interface with the computation module, thereby performing task division on the computation module. The task segmentation device may divide the tasks on all of the PEs of the computation module and may also selectively divide the tasks on part of the PEs of the computation module.

The computation module may include the multiple PEs.

The multiple PEs may be divided into multiple computation groups to complete different operations. Furthermore, the multiple PEs may be the same PE, in other words an isomorphic mode, and may also be different PEs, in other words a heterogeneous mode.

Specifically, the PEs may structurally be PEs completing simple computation, for example, completing simple operations of scalar multiplication, scalar addition, and scalar multiplication-addition. The PEs may also be PEs completing vector computation, for example, completing operations of vector multiplication, vector addition and vector dot product. The PEs may further be hybrid PEs, for example, matrix PEs configured for operations of matrix multiplication and addition, hybrid PEs configured for vector dot product computation and nonlinear computation, and hybrid PEs including convolutional computation on a pulse array product.

Figure 27:
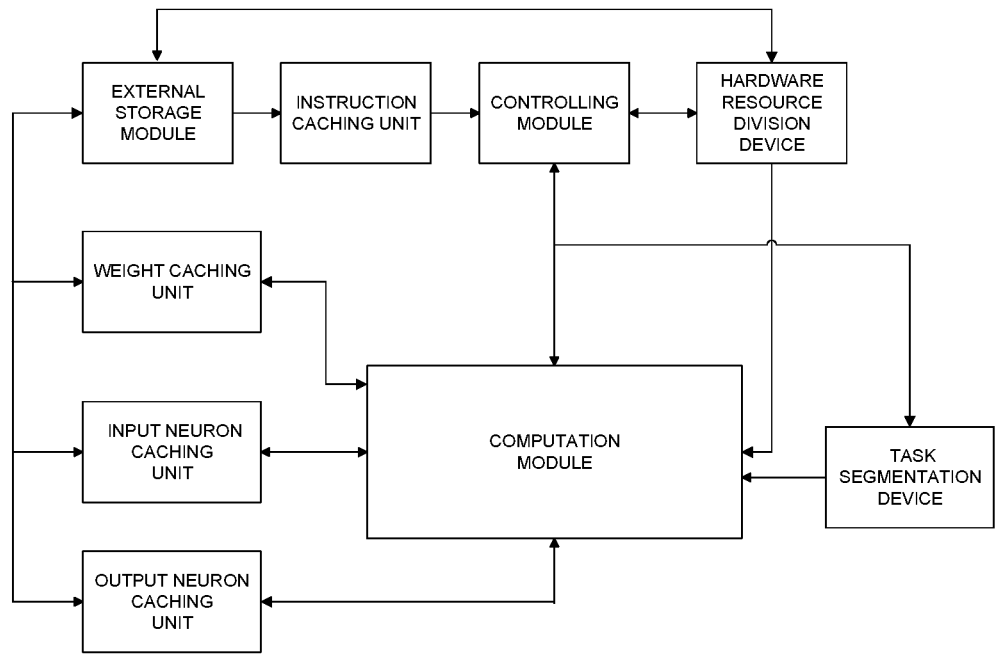
FIG. 27 is a structure block diagram of a processor according to another embodiment of the disclosure.

In an embodiment, as illustrated in FIG. 27, the processor may include the external storage module and the controlling module, and may further include a weight caching unit, an input neuron cache un it, an output neuron caching unit and an instruction caching unit, The instruction caching unit may be configured to cache an instruction.

The weight caching unit may be configured to cache weight data.

The input neuron caching unit may be configured to cache input neuron data.

The output neuron caching unit may be configured to cache a computational result output by the computation module and output it to the external storage module.

Furthermore, the controlling module may be configured to read the instruction from the instruction cache, decode it into an instruction executable for the computation module and output it to the computation module. In the embodiment, the other modules and functions may be the same as the above embodiment and will not be elaborated here.

In the embodiment, input data of the processor may include a picture, a video, an audio, a text and the like. Output data of the device may include numerical data, and its result means, but is not limited to, a classification result and a generation result.

The controlling module of the processor controls the computation module, the hardware resource division device and the task segmentation device according to the control signal. Its control manner may include direct control manner and parsing control manner, where the direct control manner refers to that the control signal is directly input into the other modules and is not required to be parsed by the controlling module; and the parsing control manner refers to that the control signal is required to be parsed in the controlling module to obtain a parsed control signal for input into the other modules for configuration and control.

Figure 28:
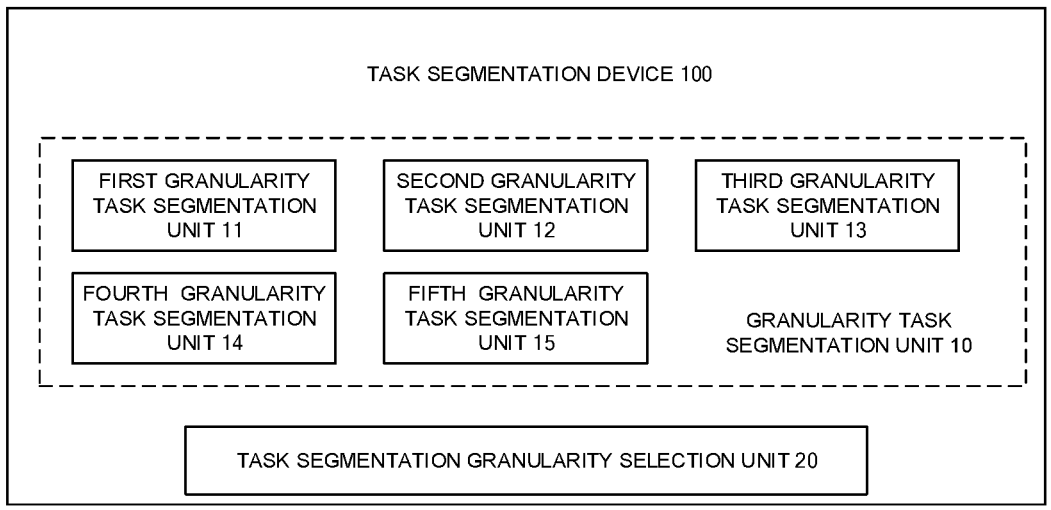
FIG. 28 is a structure block diagram of a task segmentation device according to an embodiment of the disclosure.

In an embodiment, as illustrated in FIG. 28, the task segmentation device may include a granularity task segmentation unit and a task segmentation granularity selection unit. The granularity task segmentation unit segments a task by adopting at least one granularity to form subtasks to provide multi-granularity task segmentation selection for a neural network application. The task segmentation granularity selection unit selects the granularity adopted for task division to guide a neural network to select the most suitable task segmentation granularity, to ensure that the subtasks obtained by segmentation may meet system real-time performance.

As illustrated in FIG. 28, the granularity task segmentation unit may include a first granularity task segmentation unit, a second granularity task segmentation unit, a third granularity task segmentation unit, a fourth granularity task segmentation unit and a fifth granularity task segmentation unit.

The five granularity task segmentation units will be specifically introduced below. It is assumed that the neural network application is required to complete computation for M samples and a topological structure of the neural network is formed by N layers, where M and N are positive integers greater than 0.

The first granularity task segmentation unit takes the whole task as a subtask, and specifically, completion of computation for the M samples is taken as a subtask. In such a task segmentation manner, only one subtask is generated, and there is no dependency relationship between subtasks.

The second granularity task segmentation unit takes completion of computation for a plurality of samples as a subtask. The neural network is segmented into m subtasks, and the $i^{th}$ task completes computation for Mi samples, where m is a positive integer greater than 1 and less than or equal to M, i=1, 2, 3, . . . m, Mi is a positive integer greater than 0 and less than M and M1+M2+ . . . +Mm=M is met.

There is no dependency relationship between the m subtasks obtained in such a task segmentation manner.

The third granularity task segmentation unit may perform task segmentation on the neural network application according to layer types of the neural network, computation for layers of the same type being taken as a task. The layer types of the neural network may include, but are not limited to, a convolutional layer, a fully connected layer, an LSTM layer, a pooling layer, an active layer, an LRN layer and a BN layer. There is a complex dependency relationship between subtasks obtained in such a task segmentation manner.

The fourth granularity task segmentation unit may perform task segmentation on the neural network application according to an interlayer structure of the neural network, in which computation for a plurality of adjacent layers may be taken as a subtask. The neural network application is segmented into n subtasks, a first subtask completes computation for a first layer to $N1^{th}$ layer, total N1 layers, of the neural network, a second subtask completes neural network computation for an $(N1+1)^{th}$ layer to an $(N1+N2)^{th}$ layer, total N2 layers, and an $i^{th}$ subtask completes computation for an $(N1+\ldots+Ni-1+1)^{th}$ layer to an $(N1+\ldots+Ni)^{th}$ layer, total Ni layers, wherein n is a positive integer greater than 0 and less than or equal to N, i=1, 2, 3, ... n, Ni is a positive integer greater than 0 and less than or equal to N and N+N2+ ... +Ni+ ... +Nn=N is met. There is a chain dependency relationship between the subtasks obtained in such a task segmentation manner, where the $i^{th}$ subtask is a precursor task of an $(i+1)^{th}$ subtask, the $(i+1)^{th}$ subtask is a subsequent task of the $i^{th}$ task, and execution of the $(i+1)^{th}$ task may be started only after the $i^{th}$ task is completed.

The fifth granularity task segmentation unit may perform task segmentation on the neural network application according to intra-layer structures of the neural network, and computation in the layers of the neural network may be further segmented into subtasks. Segmentation according to computation in the layers of the neural network may include, but is not limited to, task segmentation on convolutional layer computation, fully connected layer computation, pooling layer computation or active layer computation of the neural network.

Each task segmentation function mentioned above may be realized by adopting an independent hardware unit. For example, the abovementioned functions are realized by adopting a first granularity task segmentation unit, a second granularity task segmentation unit, a third granularity task segmentation unit, a fourth granularity task segmentation unit and a fifth granularity task segmentation unit respectively, and these functions may also be realized by adopting the same hardware unit.

In one case, task segmentation may be performed on the convolutional layer computation of the neural network. Input neurons of the convolutional layer form a three-dimensional matrix (Nfin, Nxin, Nyin). Weights form a four-dimensional matrix (Nfout, Nfout, Kx, Ky), and output neurons form a three-dimensional matrix (Nfout, Nxout, Nyout). Nfin is the count of input feature images. (Nxin, Nyin) is input feature images sizes. Nfout is the count of output feature images. (Kx, Ky) is the size of convolution kernel, and (Nxout, Nyout) is the size of output feature image. Multiplication and addition computation is required to be performed for Nfin×Kx×Ky times for completion of an output neuron, the count of output neurons is Nfout×Nxout×Nyout, and the multiplication and addition computation is required to be performed for total Nfout×Nxout×Nyout×Nfin×Kx×Ky times for completion of the whole convolutional layer. During task segmentation, the output neurons area is segmented according to a block size of (Bfout, Bxout, Byout), and the weights are simultaneously segmented according to a block size of (Bfout, Bfin, Bx, By). Then, each subtask computes intermediate results of Bfout× Bxout×Byout output neurons by use of weights (Bfout, Bfin, Bx, By), the multiplication and addition computation may be performd for Bfin×Bx×By times for the intermediate result of each output neuron, and the multiplication and addition computation is required to be completed for total Bfout× Bxout×Byout×Bfin×Bx×By times, where Bfout is a positive integer greater than 0 and less than or equal to Nfout, Bxout is a positive integer greater than 0 and less than or equal to Nxout, Byout is a positive integer greater than 0 and less than or equal to Nyout, Bfin is a positive integer greater than 0 and less than or equal to Nfin, Bx is a positive integer greater than 0 and less than or equal to Kx and By is a positive integer greater than 0 and less than or equal to Ky. There is no dependency relationship between the subtasks obtained in such a task segmentation manner.

In one case, task segmentation may be performed on the fully connected layer computation of the neural network. The count of input neurons of the fully connected layer is Nin, weights form a two-dimensional matrix (Nout, Nin) and the count of output neurons is Nout. Multiplication and addition computation is required to be performed for Nin times for completion of an output neuron, the count of output neurons is Nout, and the multiplication and addition computation is required to be performed for total Nout×Nin times for completion of the whole fully connected layer. During task segmentation, the output neurons are segmented according to a block size of Bout, and the weights are simultaneously segmented according to a block size of (Bout, Bin). Then, each subtask computes intermediate results of Bout output neurons by use of weights (Bout, Bin), the multiplication and addition computation is required to be performed for Bin times for the intermediate result of each output neuron, and the multiplication and addition computation is required to be completed for total Bout×Bin times, where Bout is a positive integer greater than 0 and less than or equal to Nout, and Bin is a positive integer greater than 0 and less than or equal to Nin. There is no dependency relationship between the subtasks obtained in such a task segmentation manner.

In one case, task segmentation may be performed on the pooling layer computation of the neural network. The count of input neurons of the pooling layer is Nin and the count of output neurons is Nout, where Nin and Nout are positive integers greater than 0. A pooling operation may include, but is not limited to, AVGPOOLING, MAXPOOLING and median pooling. During task segmentation, the output neurons are segmented according to a block size of Bout, and each subtask completes computation for Bout output neurons, where Bout is a positive integer greater than 0 and less than or equal to Nout and Bin is a positive integer greater than 0 and less than or equal to Nin. There is no dependency relationship between the subtasks obtained in such a task segmentation manner.

In one case, task segmentation may be performed on the active layer computation of the neural network. The count of input neurons of the active layer is Nin and the count of output neurons is Nout, where Nin and Nout are positive integers greater than 0. An activation function may include, but is not limited to, sigmoid, tan h, relu or softmax. During task segmentation, the output neurons are segmented according to a block size of Bout, and each subtask completes computation for Bout output neurons, where Bout is a positive integer greater than 0 and less than or equal to Nout. There is no dependency relationship between the subtasks obtained in such a task segmentation manner.

For selecting the granularity adopted for task division, the task segmentation granularity selection unit is not limited to select only one type of the abovementioned granularity, but may also select a combination of multiple granularities. For example, segmentation manners of the fourth granularity task segmentation unit and the fifth granularity task segmentation unit may be combined for a neural network application. The neural network application is segmented into n subtasks at first according to the segmentation manner of the fourth granularity task segmentation unit, and then p subtasks therein are segmented according to the segmentation manner of the fifth granularity task segmentation unit.

In another embodiment, the granularity task segmentation unit may include at least one of the first to the fifth granularity task segmentation units and not always include all of the first to the fifth granularity task segmentation units.

In another embodiment, the granularity task segmentation unit may further include a hybrid granularity task segmentation unit configured to combine segmentation manners of the first to the fifth granularity task segmentation units for the task segmentation granularity selection unit to select.

Figure 29:
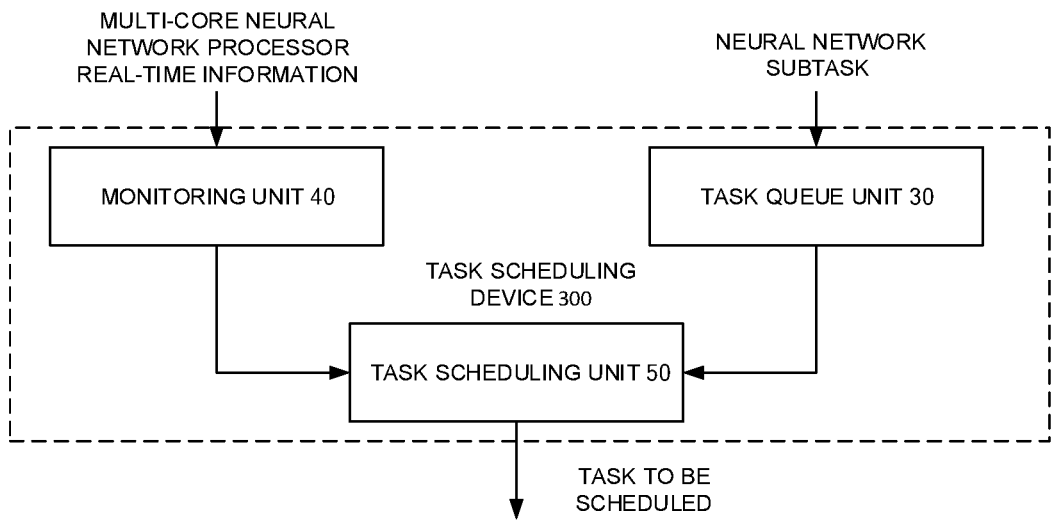
FIG. 29 is a structure block diagram of a task scheduling device according to an embodiment of the disclosure.

In an embodiment, the processor may be a multi-core processor, and may further include a task scheduling device. As illustrated in FIG. 29, the task scheduling device may include a task queue unit, a monitoring unit and a task scheduling unit. The neural network task scheduling device may implement task scheduling in comprehensive consideration of a dependency relationship between tasks, task locality, a task segmentation granularity and running frequencies and loads of cores to improve quality of service, increase utilization rates of the cores, ensure task balance between the cores and reduce energy consumption.

The task queue unit caches all unscheduled neural network tasks and may selectively store execution time of each task to be scheduled, a task dependency relationship diagram and a processing distribution condition of task resources in the cores. The neural network tasks are, for example, the subtasks segmented in the above embodiment.

The monitoring unit detects overall quality of service of the multi-core neural network processor and a working state of each core, for example, a utilization rate, workload, working frequency, the count of tasks in a private task queue in the core and task completion time of each core, in real time.

The task scheduling unit selects a task to be scheduled from the unscheduled tasks, determines a mapping relationship between a task to be unscheduled and a target core according to information about the task to be scheduled and the working state of each core, and allocates the task to be scheduled to a target core.

The task scheduling unit may schedule the unscheduled tasks in the task queues at a time interval T, in which T may be a real number greater than 0. If an unscheduled task t forms a dependency relationship with another task and a precursor task is not completed, the task scheduling unit may not schedule the task t.

The task scheduling unit may select the task to be scheduled from the unscheduled tasks in at least one of the following manners: randomly selecting a task, selecting the task of which estimated execution time is the longest, selecting the task of which the estimated execution time is the shortest, selecting the task occupying the most resources and selecting the task occupying the fewest resources.

The task scheduling unit may allocate and schedule the task to be scheduled to the target core in at least one of the following scheduling manners.

A first scheduling manner is to make statistics on the count of the tasks in the private task queue of each core, select the core with the fewest tasks in the private task queue as the target core and allocate the task to be scheduled to the target core.

A second scheduling manner is to make statistics on the time for completion of all the tasks in the private task queue of each core, select the core of which the task completion time is the shortest as the target core and allocate the task to be scheduled to the target core.

A third scheduling manner is to make statistics on a distribution condition of resources required by the task to be scheduled in all the cores, select the core with the most resources as the target core and allocate the task to be scheduled to the target core.

A fourth scheduling manner is to allocate the task to be scheduled to the target core by adopting a heuristic algorithm, the heuristic algorithm including, but not limited to, a genetic algorithm, an ant colony algorithm and a simulated annealing algorithm.

Figure 30:
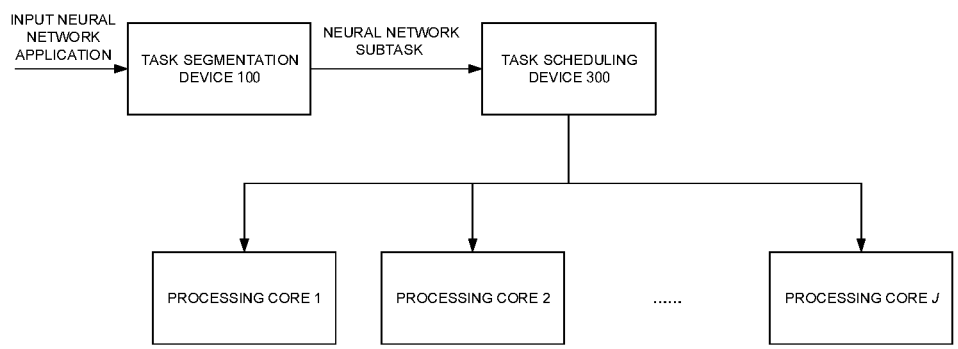
FIG. 30 is a structure block diagram of a multi-core processor according to an embodiment of the disclosure.

In an embodiment, the processor is a multi-core processor, for example, a multi-core neural network processor. As illustrated in FIG. 30, the multi-core neural network processor may include J processing cores (J being a positive integer greater than 1), the task segmentation device and the task scheduling device in the abovementioned embodiments.

The task segmentation device segments an input neural network application in a manner that subtasks obtained by segmentation may meet system real-time performance. The task scheduling device may perform neural network subtask scheduling and may improve the quality of service, increase the utilization rates of the cores, ensure task balance between the processing cores and reduce energy consumption. The neural network processing cores may perform neural network computation to complete the neural network subtasks. A topological structure between the J neural network processing cores may include, but is not limited to, a one-dimensional linear structure, a two-dimensional mesh, a two-dimensional star, a three-dimensional cube and the like.

Figure 31:
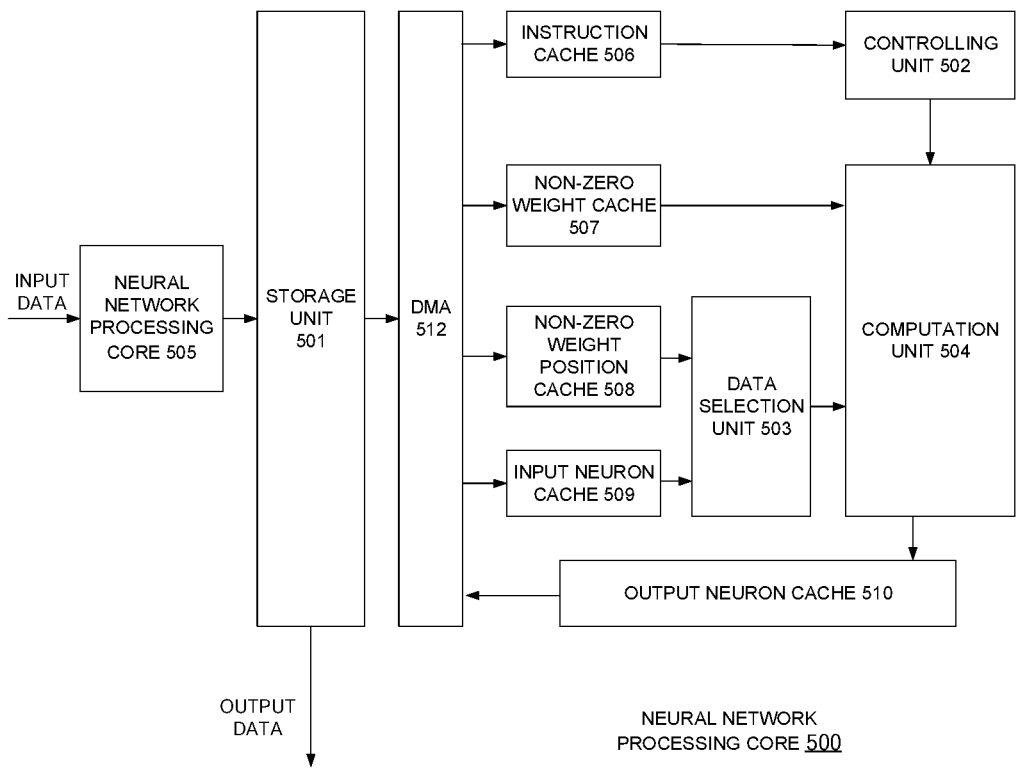
FIG. 31 is a structure block diagram of each neural network processing core for neural network processing according to an embodiment of the disclosure.

In an embodiment, as illustrated in FIG. 31, the neural network processing core may include a storage unit, a controlling unit, a data selection unit and a computation unit.

The storage unit may be configured to store neurons, weights and instructions of the neural network. If a neural network subtask processes a sparse neural network, the stored weights are non-zero weights and non-zero weight position information.

The instruction controlling unit may be configured to receive a neural network dedicated instruction and decode it to generate control information to control the data selection unit and the computation unit.

The neural network dedicated instruction may include any instruction dedicated to completion of artificial neural network computation. The neural network dedicated instruction may include, but is not limited to, a control instruction, a data transfer instruction, an operation instruction and a logical instruction. The control instruction controls a neural network execution process. The data transfer instruction completes data transfer between different storage media, and a data format may include, but is not limited to, a matrix format, a vector format and a scalar format. The operation instruction completes an arithmetic computation of the neural network, and may include, but is not limited to, a matrix operation instruction, a vector operation instruction, a scalar operation instruction, a convolutional neural network operation instruction, a fully connected neural network operation instruction, a pooling neural network operation instruction, an RBM neural network operation instruction, an LRN neural network operation instruction, an LCN neural network operation instruction, an LSTM neural network operation instruction, an RNN operation instruction, an RELU neural network operation instruction, a PRELU neural network operation instruction, a SIGMOID neural network operation instruction, a TANH neural network operation instruction and a MAXOUT neural network operation instruction. The logical instruction completes logical computation of the neural network, and may include, but is not limited to, a vector logical operation instruction and a scalar logical operation instruction.

The RBM neural network operation instruction may be configured to implement RBM neural network computation.

The LRN neural network operation instruction may be configured to implement LRN neural network computation.

The LSTM neural network operation instruction may be configured to implement LSTM neural network computation.

The RNN operation instruction may be configured to implement RNN computation.

The RELU neural network operation instruction may be configured to implement RELU neural network computation.

The PRELU neural network operation instruction may be configured to implement PRELU neural network computation.

The SIGMOID neural network operation instruction may be configured to implement sigmoid growth curve (SIGMOID) neural network computation.

The TANH neural network operation instruction may be configured to implement hyperbolic tangent function (TANH) neural network computation.

The MAXOUT neural network operation instruction may be configured to implement MAXOUT neural network computation.

More specifically, the neural network dedicated instruction may include a Cambricon instruction set.

The length of each instruction in the Cambricon instruction set is 64 bit and each instruction consists of an operation code and an operand. The instruction set may include four types of instructions, in other words control instructions, data transfer instructions, operation instructions and logical instructions.

Further, the control instructions may be configured to control an execution process. The control instruction may include a jump instruction and a conditional branch instruction.

Further, the data transfer instructions may be configured to complete data transfer between different storage media. The data transfer instructions may include a load instruction, a store instruction and a move instruction. The load instruction may be configured to load data from a main memory to a cache, the store instruction may be configured to store the data from the cache to the main memory, and the move instruction may be configured to move the data between the cache and another cache or the cache and a register or the register and another register. The data transfer instruction supports three different data organization manners, including the matrix, the vector and the scalar.

Further, the operation instructions may be configured to complete the arithmetic computations of the neural network. The operation instructions may include a matrix operation instruction, a vector operation instruction, and a scalar operation instruction.

Furthermore, the matrix operation instruction completes matrix computation in the neural network, including matrix multiply vector computation, vector multiply matrix computation, matrix multiply scalar computation, outer product computation, matrix add matrix computation, and matrix subtract matrix computation.

Furthermore, the vector operation instruction completes vector computation in the neural network, including vector elementary arithmetic, vector transcendental functions computation, dot product computation, random vector generator computation and maximum/minimum of a vector computation, where the vector elementary arithmetic may include vector addition, subtraction, multiplication and division, and the vector transcendental functions refer to those functions which do not meet any polynomial equations taking polynomials as coefficients, and may include, but are not limited to, an exponential function, a logarithmic function, a trigonometric function and an anti-trigonometric function.

Furthermore, the scalar operation instruction completes scalar computation in the neural network, including scalar elementary arithmetic and scalar transcendental functions computation, where the scalar elementary arithmetic may include scalar addition, subtraction, multiplication and division, and the scalar transcendental functions refer to those functions which do not meet any polynomial equations taking polynomials as coefficients, and may include, but are not limited to, an exponential function, a logarithmic function, a trigonometric function and an anti-trigonometric function.

Further, the logical instructions may be configured for the logical computation of the neural network. The logical instructions may include vector logical operation instructions and scalar logical operation instructions.

Furthermore, the vector logical operation instructions may include vector compare instructions, vector logical operations instructions, and vector greater than merge instructions, where vector compare may include greater than, less than, equal to, greater than or equal to, less than or equal to and unequal to; and the vector logical operations may include AND, OR and NOT.

Furthermore, the scalar logical operation instructions may include scalar compare instructions and scalar logical operations instructions, where scalar compare may include greater than, less than, equal to, greater than or equal to, less than or equal to and unequal to; and the scalar logical operations may include AND, OR and NOT.

The data selection unit may be configured to receive input neurons and the non-zero weight position information, and select neurons corresponding to the non-zero weights. In other words, for each output neuron data, the data selection unit removes input neuron data which have no corresponding non-zero weight data corresponding to the output neuron data.

The computation unit may be configured to receive the neurons corresponding to the input non-zero weights and the corresponding non-zero weights, complete neural network training computation and retransmit the output neurons to a storage part.

Specifically, the computation unit may perform corresponding computation on the data according to the instruction stored in the storage unit. The computation unit may include, but is not limited to, three parts, where the first part may include a multiplier, a second part may include one or more adders and a third part may include an activation function unit. Preferably, the one or more adders of the second part form an adder tree. The first part multiplies input data 1 (in1) and input data 2 (in2) to obtain multiplied output (out), and a process is represented with out=in1×in2. The second part adds the input data in1 through the adder tree step by step to obtain output data (out), where in1 is a vector with a length N (N is greater than 1), and a process is represented with out=in1[1]+in1[2]+ . . . +in1[N]; and/or the input data 1 (in1) is accumulated through the adder tree and then is added with the input data 2 (in2) to obtain the output data (out), and a process is represented with out=in1[1]+in1[2]+ . . . +in1[N]+in2; or the input data 1 (in1) and the input data 2 (in2) are added to obtain the output data (out), and a process is represented with out=in1+in2. The third part may perform an activation function computation on the input data (in) to obtain activation output data (out), and a process is represented with out=active(in), where the activation function may be sigmoid, tan h, relu, softmax and the like. Besides an activation operation, the third part may implement another nonlinear function and may perform computation (f) on the input data (in) to obtain the output data (out), and a process is represented with out=f(in).

The computation unit may further include a pooling unit. The pooling unit may perform the pooling computation on the input data (in) to obtain output data (out) pooled, and a process is out=pool(in), where pool is the pooling operation, which may include, but is not limited to: AVGPOOLING, MAXPOOLING and median pooling, and the input data (in) is the data in a pooling core related to the output (out).

The computation unit may perform, but is not limited to, the following computation: the first part multiplies the input data 1 and the input data 2 to obtain multiplied data; the second part may perform adder tree computation to add the input data 1 through the adder tree step by step or add the input data 1 and the input data 2 to obtain the output data; and the third part may perform the activation function computation, performing the activation function computation on the input data to obtain the output data. The computation of the abovementioned parts may be freely combined, thereby implementing computation of various functions.

The neural network processing core may further include a preprocessing module. As illustrated in FIG. 31, the module preprocesses original data, including segmentation, Gaussian filtering, binarization, regularization, normalization and the like.

The neural network processing core may further include an instruction cache, a non-zero weight cache, a non-zero weight position cache, an input neuron cache and an output neuron cache. The instruction cache may be configured to store a dedicated instruction. The non-zero weight cache may be configured to cache non-zero weight data. The non-zero weight position cache may be configured to cache non-zero weight position data and, according to the non-zero weight position data, match each weight in input data with the corresponding input neurons one by one. The input neuron cache may be configured to cache the input neurons. The output neuron cache may be configured to cache the output neurons output by the computation unit.

The non-zero weight position data indicates whether each input neuron data and each output neuron data have corresponding weight data of non-zero weights or not.

In one case, a method for one-to-one correspondence of cached non-zero weight positions is to adopt 1 to represent existence of a connection and 0 to represent no connection, and form a character string of 0 and 1 by connection states of an output neuron in each group and all the input neurons to represent a connection relationship of the output neuron. In another case, a method for one-to-one correspondence of the cached non-zero weight positions under another condition is to adopt 1 to represent existence of a connection and 0 to represent no connection, and form a character string of 0 and 1 by connection states of an input neuron in each group and all the output neurons to represent a connection relationship of the input neuron. In another case, a method for one-to-one correspondence of the cached non-zero weight positions under another condition is to exhaust a distance between a position of an input neuron corresponding to a first connection of an output neuron in a group and a first input neuron, a distance between an input neuron of the output neuron in a second group and the previous input neuron, a distance between an input neuron of the output neuron in a third group and the previous input neuron, . . . , and so on until all the input neurons of the output neuron are exhausted to represent a connecting relationship of the output neuron.

Existence of the connection refers to that each input neuron data and each output neuron data have corresponding non-zero weight data. No connection refers to whether each input neuron data and each output neuron data have the corresponding non-zero weight data or not.

The neural network processing core may further include a DMA.

The DMA may be configured to read/write the data or instruction in the storage unit, the instruction cache, the non-zero weight cache, the non-zero weight position cache, the input neuron cache and the output neuron cache.

Figure 32:
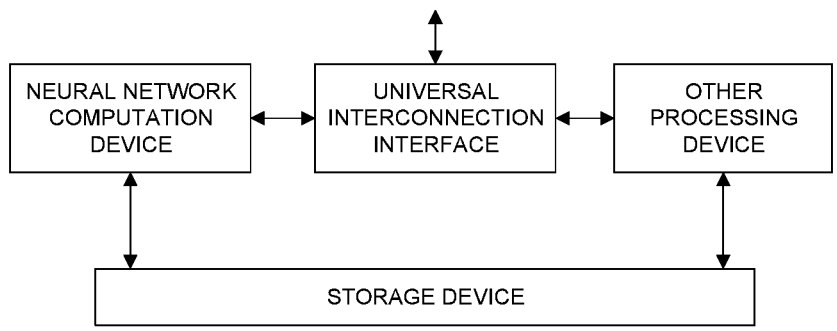
FIG. 32 is a structure block diagram of a combined processing device according to an embodiment of the disclosure.

In an embodiment, the disclosure further provides a combined processing device. As illustrated in FIG. 32, the combined processing device may include a processor, and interacts with other processing device through an interconnection interface to complete a computational operation specified by a user together.

The other processing device may include one or more processor types of universal/dedicated processors such as a CPU, a Graphic Processing Unit (GPU), a neural network processor and the like. The count of the processors included by the other processing device is not limited. The other processing device may serve as an interface between a neural network computation device and external data and control, including data move, to complete basic control such as starting and stopping the neural network computation device. The other processing device may also cooperate with the neural network computation device to complete a computational task together.

The universal interconnection interface may be configured to transmit data and a control instruction between the neural network computation device and the other processing device. The neural network computation device may acquire required input data from the other processing device and write it into an on-chip storage device of the neural network computation device. The neural network computation device may also acquire the control instruction from the other processing device and write it into an on-chip control cache of the neural network computation device. The neural network computation device may also read the data in a storage module of the neural network computation device and transmit it to the other processing device.

The combined processing device may be used as an SoC of equipment such as a mobile phone, a robot, an unmanned aerial vehicle and video monitoring equipment to effectively reduce a core area of a control part, increase a processing speed and reduce overall power consumption. Under this condition, the universal interconnection interface of the combined processing device may be connected with some components of the equipment. The components may include, for example, a webcam, a display, a mouse, a keyboard, a network card and a Wireless Fidelity (WIFI) interface.

Figure 33:
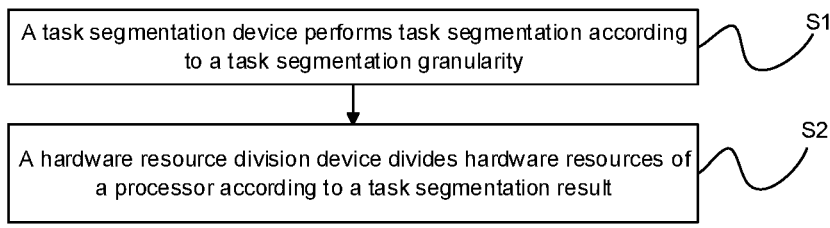
FIG. 33 is a flowchart of a processing method according to an embodiment of the disclosure.

In an embodiment, the disclosure further provides a processing method. As illustrated in FIG. 33, the processing method may include the following steps.

In S1, a task segmentation device may perform task segmentation according to a task segmentation granularity.

In S2, a hardware resource division device divides hardware resources of a processor according to a task segmentation result.

In an embodiment, the hardware resource division device dividing the hardware resources of the processor according to the task segmentation result may include the follows:

Input data and control signal sequences are stored in an external storage module for use.

Data and a control signal are loaded into an internal memory.

A controlling module parses the control signal, and a configuration distributing module parses a distribution configuration signal. For example, in an execution process, the control signal parsed by the controlling module after corresponding configuration information is determined according to the task segmentation result may include an instruction and the configuration information (the configuration information may also be provided in an instruction manner), and if the configuration information is determined, the controlling module sends the configuration information to the configuration distributing module and then the configuration distributing module further sends the configuration information to a computation module. The processor schedules each module to complete corresponding operations according to different signal meanings. For example, if a multi-batch operation may be performed, the processor schedules the configuration distributing module to distribute the configuration information, the computation module to perform computation in groups, and the storage module to send or may receive data. In addition, the configuration information may be sent to the configuration distributing module by the controlling module through the external storage module, and may also be directly sent to the configuration distributing module by the external storage module under control of the controlling module.

A corresponding computational result is output from the computation module to an internal storage module and then is transmitted to the external storage module for subsequent or other use.

If the processor of the disclosure is adopted to perform batch computation on a neural network, a training process and a test process are included, and each forward path in a batch may be parallel performed, where parallel performed computation for each forward path is independent (particularly, weights may be may shared and may also not be may shared). At this moment, the device divides PEs into N independent computation groups to independently compute different forward paths in the batch. In case of the test process, the device may compute an optimal configuration and complete configuration off line, where the optimal configuration may be a configuration about the count of the computation groups, for example, the specific number, capable of achieving an optimal computation effect, of computation units into which multiple PEs in the computation module are divided in a specific computation scenario; and the configuration may also be dynamically regulated to achieve an optimal process in the execution process, where dynamic regulation of the configuration may refer to, for example, that multiple independent computation groups may be configured to compute different output images respectively during execution of a convolutional layer and only one computation group is configured, in other words, all of the PEs may be configured to compute the same layer, during computation for a fully connected layer. In addition, compared with the test process, it is necessary in the training process to reversely compute a gradient and update weights in the network. At this moment, the device may be divided into multiple groups to complete computation of gradients corresponding to different input samples in the batch, and the device may be configured into a group on line, thereby rapidly updating and computing the weights (particularly, the device may also be configured into a group on line to complete computation of the gradients corresponding to different input samples in the batch).

If the processor of the disclosure is adopted to perform a multi-service computation process, a training process and a test process are included, and input and weights required by different service may be different and may also be the same. At this moment, the device is required to be configured into different independent groups to run requests corresponding to different service. Since computation loads corresponding to different service may be totally different, computation resources required corresponding to different service are also different. The device dynamically regulates grouping of the PEs in a running process to meet requirements of multiple pieces of service on quality of service.

Figure 34:
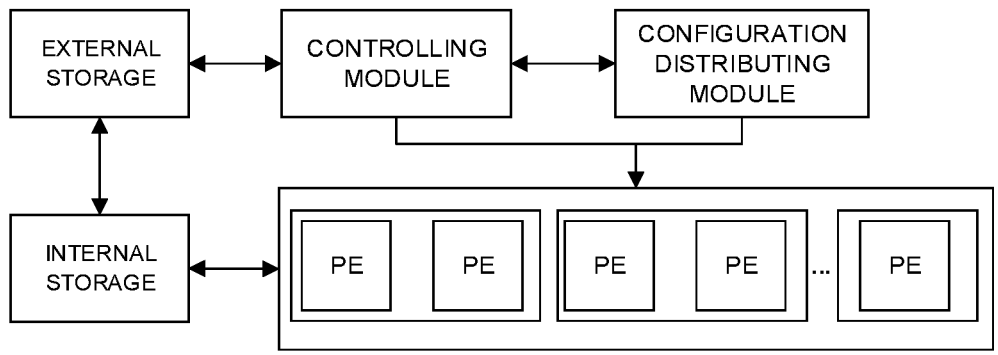
FIG. 34 is a structure diagram after division of PEs according to an embodiment of the disclosure.

In an embodiment, as illustrated in FIG. 34, the PEs in the computation module of the processor are organized in a one-dimensional array, multiple PEs may be configured into different groups and different groups may be configured to compute different input.

How to compute a batch of a convolutional neural network by the processor and corresponding PE configuration of the embodiment will be described below with forward computation for a convolutional layer in the convolutional neural network as an example in detail.

1) Different input of the neural network is input into different computation groups through external storage via the internal storage module, and weights are broadcast to different groups through the external storage via the internal storage module, in other words, different groups adopt different weights data.

2) Different groups start computing respective samples belonging to themselves until forward processes for the samples of the groups are completed.

3) Different groups write their computational results back to internal storage, the results being written back into the external storage or temporally stored in the internal storage for subsequent computation.

4) The processor loads a new batch of input and allocates them to different groups for continuous computation.

Figure 35:
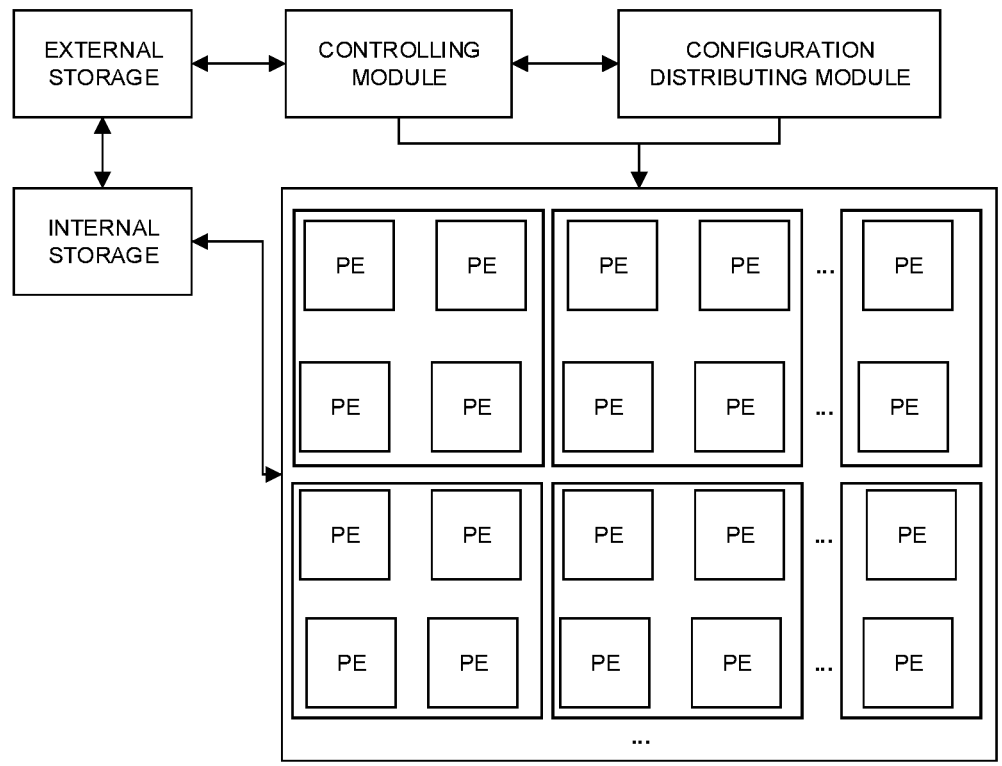
FIG. 35 is a structure diagram after division of PEs according to another embodiment of the disclosure.

In an embodiment, as illustrated in FIG. 35, the PEs are organized in a two-dimensional array, multiple adjacent PEs may be configured into different groups and different groups may be configured to compute different input.

Figure 36:
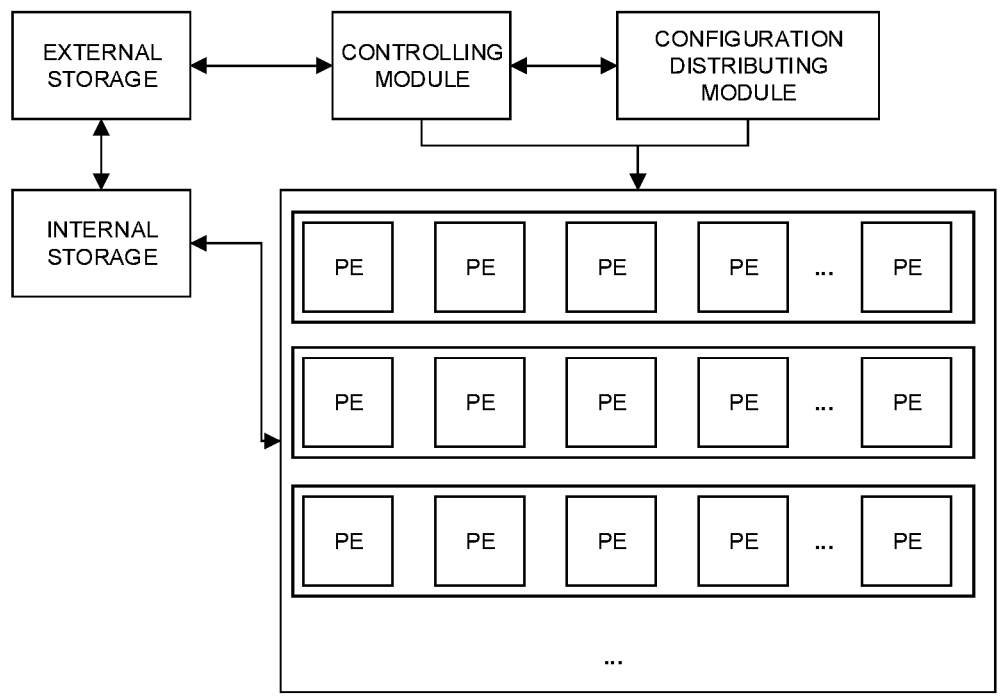
FIG. 36 is a structure diagram after division of PEs according to another embodiment of the disclosure.

In an embodiment, as illustrated in FIG. 36, the PEs are organized in a two-dimensional array, multiple adjacent PEs may be configured into different groups and different groups may be configured to compute different input.

Computation performed by the PEs may include neural network computation.

Specifically, the computation module may include: a multiplier configured to multiply data input into it to obtain multiplied output; and/or one or more adders configured to add input data to obtain output data, where the multiple adders may form an adder tree configured for adder tree computation, for example, adding the input data input step by step to obtain the output data.

More specifically, the computation module may include, but is not limited to: a first part including a multiplier, a second part including an adder tree, a third part including an activation function unit and/or a fourth part including a pooling unit. The first part multiplies input data 1 (in1) and input data 2 (in2) to obtain multiplied output (out), and a process is represented with out=in1×in2. The second part adds the input data 1 (in1) step by step through the adder tree to obtain the output data (out), where in1 is a vector with a length N, N being greater than 1, and a process is represented with out=in1[1]+in1[2]+ . . . +in1[N]; and/or the input data 1 (in1) is accumulated through the adder tree and then is added with the input data 2 (in2) to obtain the output data (out), and a process is represented with out=in1[1]+in1[2]+ . . . +in1[N]+in2; or the input data 1 (in1) and the input data 2 (in2) are added to obtain the output data (out), and a process is represented with out=in1+in2. The third part may perform an activation function computation on the input data (in) to obtain activation output data (out), and a process is represented with out=active(in), and the activation function may be sigmoid, tan h, relu, softmax and the like. Besides an activation operation, the third part may implement another nonlinear function and may perform computation ($f$) on the input data (in) to obtain the output data (out), and a process is represented with out=$f$(in). The pooling unit may perform pooling computation on the input data (in) to obtain output data (out) pooled, and a process is out=pool(in), where pool is the pooling operation, which may include, but is not limited to: AVGPOOLING, MAXPOOLING and median pooling, and the input data (in) is data related to the output (out) in a pooling core.

Correspondingly, the operation that the computation module may perform computation may include the follows: the first part multiplies the input data and the input data to obtain multiplied data; and/or the second part may perform adder tree computation to add the input data through the adder tree step by step or add the input data and the input data to obtain the output data; and/or the third part may perform the activation function computation on the input data to obtain the output data; and/or the fourth part may perform the pooling computation, out=pool(in), where pool is the pooling operation, which may include, but is not limited to: avgpooling, maxpooling and median pooling, and the input data (in) is data related to output (out) in a pooling core. The computation of one or more parts of the abovementioned parts may be freely combined in different sequences, thereby implementing computation of various functions.

Computational elements of one or more parts of the abovementioned parts may be freely combined in different sequences, thereby implementing computation of various functions.

In an embodiment, the processing method is used for a neural network. In the step that the task segmentation device may perform task segmentation on each divided hardware resource according to the task segmentation granularity, at least one of the following five granularity task segmentation manners is selected for task segmentation.

In a first granularity task segmentation manner, the whole task is taken as a subtask. Specifically, completion of computation for M samples is taken as a subtask. In such a task segmentation manner, only one subtask is generated, and there is no dependency relationship between subtasks.

In a second granularity task segmentation manner, completion of computation for a plurality of samples is taken as a subtask. The neural network is segmented into m subtasks, and the $i^{th}$ task completes computation for Mi samples, where m is a positive integer greater than 1 and less than or equal to M, i=1, 2, 3, . . . m, Mi is a positive integer greater than 0 and less than M and M1+M2+ . . . +Mm=M is met. There is no dependency relationship between the m subtasks obtained in such a task segmentation manner.

In a third granularity task segmentation manner, task segmentation may be may performed on a neural network application according to layer types of the neural network, computation for layers of the same type being taken as a task. The layer types of the neural network may include, but are not limited to, a convolutional layer, a fully connected layer, an LSTM layer, a pooling layer, an active layer, an LRN layer and a BN layer. There is a complex dependency relationship between subtasks obtained in such a task segmentation manner.

In a fourth granularity task segmentation manner, task segmentation may be may performed on the neural network application according to an interlayer structure of the neural network, computation for a plurality of adjacent layers being taken as a subtask. The neural network application is segmented into n subtasks, a first subtask completes computation for a first layer to $N1^{th}$ layer, total N1 layers, of the neural network, a second subtask completes neural network computation for an $(N1+)^{th}$ layer to an $(N1+N2)^{th}$ layer, total N2 layers, and an $i^{th}$ subtask completes computation for an $(N1+ \ldots +Ni-1+1)^{th}$ layer to an $(N1+ \ldots +Ni)^{th}$ layer, total Ni layers, where n is a positive integer greater than 0 and less than or equal to N, i=1, 2, 3, . . . n, Ni is a positive integer greater than 0 and less than or equal to N and N+N2+ . . . +Ni+ . . . +Nn=N is met. There is a chain dependency relationship between the subtasks obtained in such a task segmentation manner, wherein the ith subtask is a precursor task of an $(i+1)^{th}$ subtask, the $(i+_1)^{th}$ subtask is a subsequent task of the ith task, and execution of the $(i+1)^{th}$ task may be started only after the $i^{th}$ task is completed.

In a fifth granularity task segmentation manner, task segmentation may be performed on the neural network application according to intra-layer structures of the neural network, and computation in the layers of the neural network may further be segmented into subtasks. Segmentation according to computation in the layers of the neural network may include, but is not limited to, task segmentation on convolutional layer computation, fully connected layer computation, pooling layer computation or active layer computation of the neural network.

In an embodiment, in order to implement task scheduling in comprehensive consideration of a dependency relationship between tasks, task locality, a task segmentation granularity and running frequencies and loads of cores to improve quality of service, increase utilization rates of the cores, ensure task balance between the cores and reduce energy consumption, the processing method may further include that: tasks are allocated and scheduled after task segmentation. Specifically, a task scheduling method may include the follows.

All unscheduled neural network tasks are cached.

Specifically, execution time of each task to be scheduled, the task dependency relationship diagram and the processing distribution condition of task resources in the cores may be selectively stored, and the neural network tasks are, for example, the subtasks segmented in the above embodiment.

Overall quality of service of a multi-core neural network processor and a working state of each core are detected in real time.

Specifically, the working state of each core is, for example, a utilization rate, workload, working frequency, the count of tasks in a private task queue in the core and task completion time of each core.

A task to be scheduled is selected from the unscheduled tasks, a mapping relationship between a task to be scheduled and a target core is determined according to information about the task to be scheduled and the working state of each core, and the task to be scheduled is allocated to a target core.

During task scheduling, the unscheduled tasks in the task queues may be scheduled at a time interval T, T being a real number greater than 0. If an unscheduled task t forms a dependency relationship with another task and a precursor task is not completed, the task t is not scheduled.

A manner for selecting the task to be scheduled from the unscheduled tasks may adopt at least one of the following manners: randomly selecting a task, selecting the task of which estimated execution time is the longest, selecting the task of which the estimated execution time is the shortest, selecting the task occupying the most resources and selecting the task occupying the fewest resources.

The task to be scheduled may be allocated and scheduled to the target core in at least one of the following scheduling manners. A first scheduling manner is to make statistics on the count of the tasks in the private task queue of each core, select the core with the fewest tasks in the private task queue as the target core and allocate the task to be scheduled to the target core.

A second scheduling manner is to make statistics on the time for completion of all the tasks in the private task queue of each core, select the core of which the task completion time is the shortest as the target core and allocate the task to be scheduled to the target core.

A third scheduling manner is to make statistics on a distribution condition of resources required by the task to be scheduled in all the cores, select the core with the most resources as the target core and allocate the task to be scheduled to the target core.

A fourth scheduling manner is to allocate the task to be scheduled to the target core by adopting a heuristic algorithm, the heuristic algorithm including, but not limited to, a genetic algorithm, an ant colony algorithm and a simulated annealing algorithm.

The processes or methods described in the abovementioned drawings may be performed by processing logics including hardware (for example, a circuit and a dedicated logic), firmware and software (for example, software born on a non-transitory computer-readable medium) or a combination of two. Although the processes or methods have been described above according to some sequential operations, it should be understood that some described operations may be performed in different sequences. In addition, some operations may be performed not sequentially but concurrently.

In addition, in some embodiments, signal input of the configuration distributing module may also be direct input by an external signal and a direct control or parsing control manner is adopted.

In some embodiments, a PE organization may be a three-dimensional organization and even a multidimensional organization.

In some embodiments, grouping of the PEs may also be organized in columns, and different grouping manners may also be switched in a running process.

In some embodiments, multiple grouped PEs may also perform different computational operations corresponding to the same input.

In some embodiments, the PEs may be any PEs from simple PEs to PEs able to realize complex functions.

Those skilled in the art should understand that the processor and processing method of the disclosure may further be applied to image processing and video processing computation and the like, besides neural network computation, where the neural network is also not limited to the convolutional neural network and may also be a fully connected neural network, an RBM neural network, an RNN and the like, and no limits are formed by the convolutional layer and the fully connected layer, as the pooling layer and the like may also be involved.

In some embodiments, a chip is further provided, which may include the abovementioned neural network computation device or combined processing device.

In some embodiments, a chip packaging structure is further provided, which may include the abovementioned chip.

In some embodiments, a board card is further provided, which may include the abovementioned chip packaging structure.

In some embodiments, electronic equipment is further provided, which may include the abovementioned board card.

The electronic equipment may include a data processing device, a robot, a computer, a printer, a scanner, a tablet computer, an intelligent terminal, a mobile phone, an automobile data recorder, a navigator, a sensor, a webcam, a may server, a cloud server, a camera, a video camera, a projector, a watch, an earphone, a mobile storage, wearable equipment, a transportation means, a household electrical appliance and/or medical equipment.

The transportation means may include an airplane, a ship and/or a vehicle. The household electrical appliance may include a television, an air conditioner, a microwave oven, a refrigerator, an electric rice cooker, a humidifier, a washing machine, an electric lamp, a gas cooker and a range hood. The medical equipment may include a nuclear magnetic resonance spectrometer, a B-ultrasonic scanner and/or an electrocardiograph.

Figure 37:
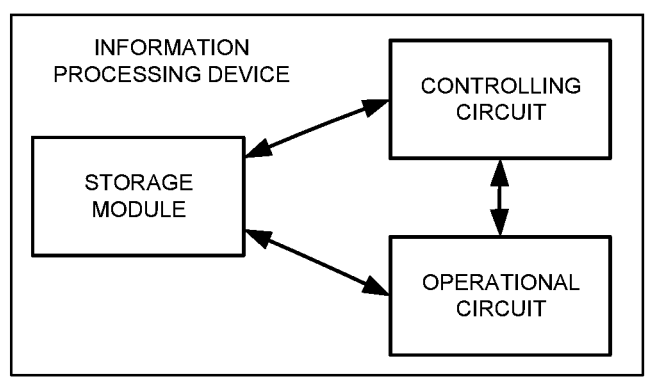
FIG. 37 is a block diagram of an information processing device according to an embodiment of the disclosure.

Referring to FIG. 37, an aspect of the embodiments of the disclosure provides an information processing device, which may include the follows. A storage module may be configured to acquire information data, the information data including at least one key feature and the storage module pre-storing true confidence corresponding to the key feature. An operational circuit may be configured to determine predicted confidence corresponding to the key feature according to the information data and judging whether the predicted confidence of the key feature exceeds a preset threshold value range of the true confidence corresponding to the key feature or not. A controlling circuit may be configured to control the storage module to modify the key feature or send out a modification signal to the outside if the predicted confidence exceeds the preset threshold value range of the true confidence. Through the information processing device, the information data may be automatically corrected and modified rather than manually, and the device is more accurate and faster than manual scoring.

Categories of the information data have been described above according to types, and function classes of the information data will be introduced below. Specifically, school work or test paper of a student, movement or expression data of a sports event or an operation manner or steps of a puzzle event may be involved. For example, the school work or the test paper may be an electronic text, a handwritten text and/or a figure, where the handwritten text and/or the figure may include a combination of one or more handwritten language texts and/or symbols, a handwritten two-dimensional diagram and a handwritten two-dimensional perspective. Furthermore, the combination of the one or more handwritten language texts and/or symbols is a handwritten answer test paper of a subject such as Chinese language, mathematics and physics. Furthermore, the handwritten two-dimensional diagram and/or two-dimensional perspective are/is a handwritten answer of test paper of a subject such as fine arts and cartography. For example, a movement or expression may be a shot picture and/or video. For example, the operation manner or steps of the puzzle event may be electronic data, picture or video reflecting the operation manner or steps. The information data of the abovementioned categories may be timely and automatically modified to improve efficiency of a coach or a teacher and enable a student to timely and accurately correct errors.

In the disclosure, the storage module may be configured to store data and an instruction, where the data may include input neurons (for example, preprocessed data), output neurons (for example, the predicted confidence corresponding to the key features), weights, a loss function, gradient and score in a neural network computation and output process and an error mode judgment result.

In the disclosure, the operational circuit may be configured to perform corresponding computation on the data according to the instruction stored in the storage module. The operational circuit may perform the computation in three steps. In the first step, the input neurons and weights data are multiplied. In a second step, adder tree computation may be performed to add a result obtained in the first step through an adder tree step by step to obtain a weighted sum, and the weighted sum may be offset or not processed according to a requirement. In a third step, activation function computation may be performed on a result obtained in the second step to obtain the output neurons. Values of the output neurons are the predicted confidence of the key features. An activation function may be a sigmoid function, a tan h function, a ReLU function, a softmax function or the like.

In the embodiment of the disclosure, the predicted confidence may be any natural number. For example, if a value of the confidence is larger, the confidence about inclusion of the key feature is higher. The confidence may also be normalized into a natural number within a certain range. For example, if the confidence is within [0, 1], the confidence represents a confidence probability about inclusion of the key feature.

In some embodiments, the storage module may include a DMA, and the DMA is electrically connected with the operational circuit, and may be configured to store the predicted confidence determined by computation of the operational circuit and send the true confidence and the predicted confidence into the operational circuit for comparison.

Figure 38:
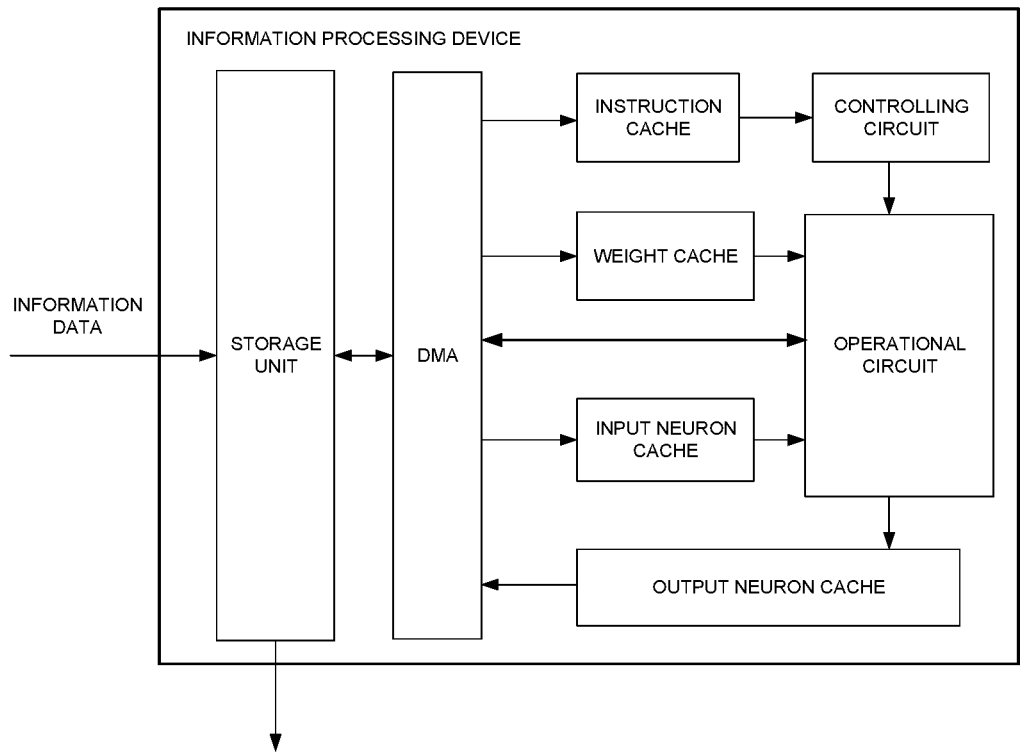
FIG. 38 is a block diagram of an information processing device according to another embodiment of the disclosure.

As illustrated in FIG. 38, the storage module may further include a storage unit, and the storage unit may be configured to acquire the information data from the outside of the information processing device and transmit it into the DMA for the operational circuit to call.

In some embodiments, as illustrated in FIG. 38, the storage module may be further configured to store a neural network dedicated instruction, and the information processing device may further include: an instruction cache configured to cache the dedicated instruction from the storage module for the controlling circuit to call.

In some embodiments, the storage module may be further configured to store input neurons, output neurons and weights in the neural network, and the information processing device may further include: an input neuron cache configured to cache the neurons from the storage module for the operational circuit to call; a weight cache configured to cache the weights from the storage module for the operational circuit to call; and an output neuron cache configured to store the output neurons obtained by the computation of the operational circuit.

In some embodiments, the operational circuit may be further configured to score the information data according to a judgment result of each key feature. In this scoring process, the output neurons corresponding to each key feature may be weighted and comprehensively scored.

In some embodiments, determining the predicted confidence corresponding to the key feature according to the information data in the operational circuit may include: performing neural network computation by taking the information data as input of the neural network, in which the predicted confidence may be taken as output of the neural network.

Figure 39:
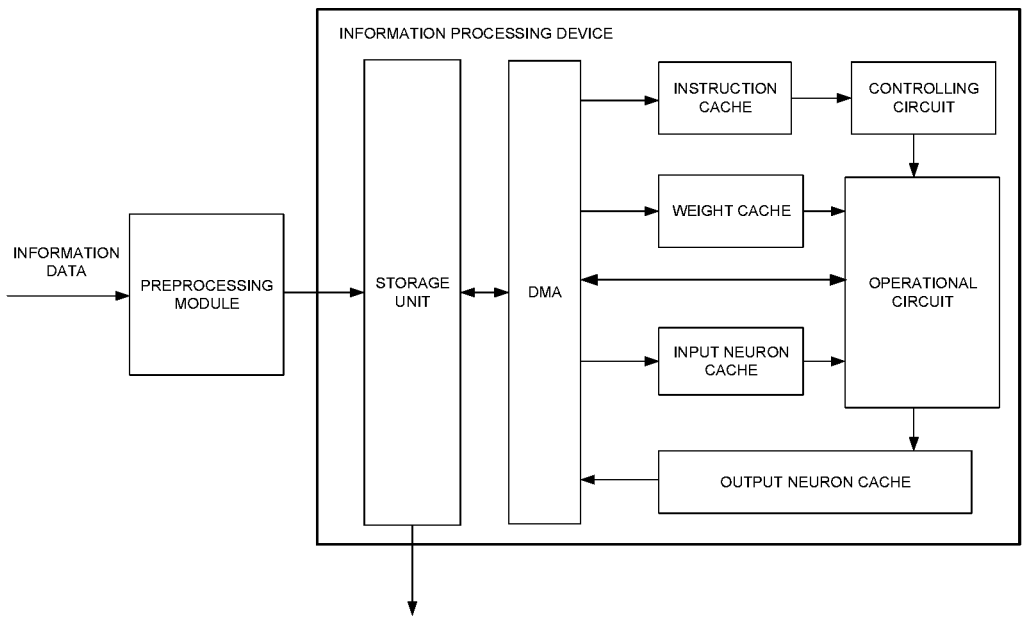
FIG. 39 is a block diagram of an information processing device according to yet another embodiment of the disclosure.

Referring to FIG. 39, in some embodiments, the information processing device may further include a preprocessing module configured to preprocess external original information data for transmission into the storage module. With configuration of the preprocessing module, on one hand, the input data may be more suitable to be processed by the artificial neural network to remove noise and redundancy in the input data and improve classification and recognition accuracy and the like; and on the other hand, subsequent space occupation in the storage module is reduced. Preferably, preprocessing may include original information data segmenting, Gaussian filtering, binarizing, regularizing and/or normalizing, and thus data consistent with an input data format of the neural network is obtained. Preferably, the input data format of the neural network may include, but is not limited to, an image size, a color mode, average brightness and/or a data size.

In some embodiments, the operational circuit may be further configured to perform adaptive training on the neural network. The computed predicted confidence may be compared with the known true confidence to adaptively update parameters (for example, the weights and an offset) in the network to further improve the recognition and prediction accuracy of the device. Preferably, an adaptive training process is implemented off line.

In some embodiments, the information processing device of the disclosure may be an integrated chip integrating each unit, module and circuit it may include, and may be preferably an artificial neural network chip capable of implementing the neural network computation.

Figure 40:
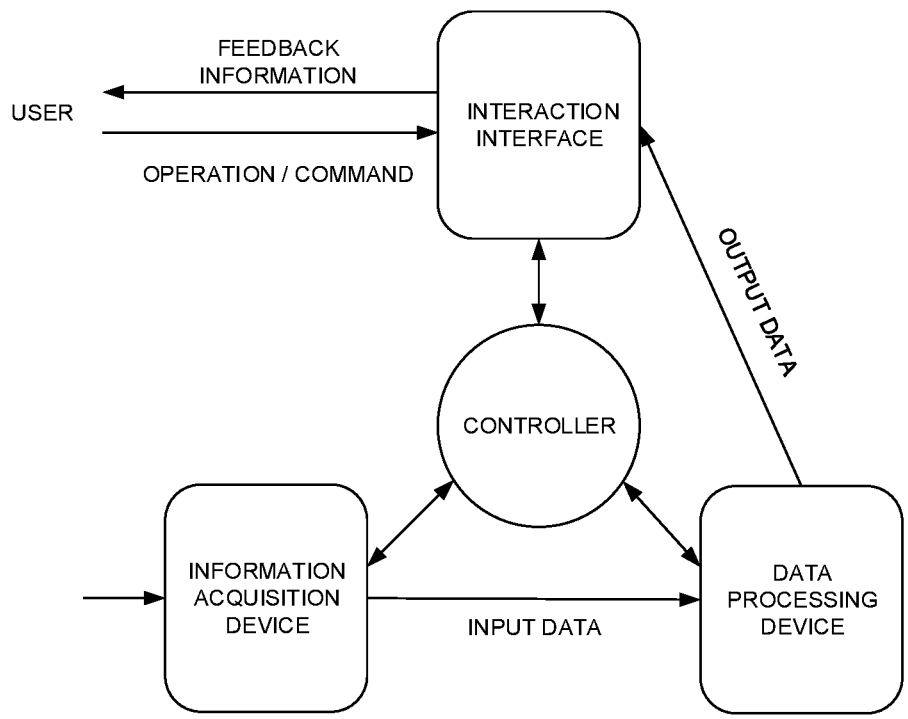
FIG. 40 is a block diagram of information processing equipment according to an embodiment of the disclosure.

Referring to FIG. 40, according to another aspect of the disclosure, information processing equipment is provided, which may include an information acquisition device configured to acquire external information data; and the processing device of the abovementioned embodiment may be configured to process the information data, obtain predicted confidence of a key feature, and modify the key feature or send out a modification signal if the predicted confidence exceeds a preset threshold value of true confidence.

Referring to FIG. 40, according to another aspect of the disclosure, information processing equipment is provided, which may include an information acquisition device configured to acquire external information data; the processing device of the abovementioned embodiment may be configured to process the information data, obtain predicted confidence of a key feature, and modify the key feature or send out a modification signal if the predicted confidence exceeds a preset threshold value of true confidence; and an interaction interface may be configured to receive the modified key feature or the modification signal and display a modified content to a user.

In the embodiment of the information processing equipment, the information acquisition device may be a camera, video camera, scanner and the like only with a photographic function, and may also be terminal equipment (for example, a mobile phone, a computer or wearable equipment) integrating the information acquisition device and the interaction interface.

In the embodiment, the interaction interface may include a display screen, a touch display screen and/or a data output interface. The interaction interface may receive the data (for example, including the modified key feature) of the information acquisition device or may receive original information data and modification signal of the information acquisition device, modify (including, but not limited to, scrawling, modification mark addition, video addition, local picture addition, text addition and voice addition) the original information data (for example, a picture) under control of a controller and display the original information data modified in a visible and audible manner.

In some embodiments, an interaction device may further include a preprocessing device configured to preprocess the information data acquired by the information acquisition device and send the information data preprocessed to the information processing device. A function realized by the preprocessing device is similar to that of the abovementioned preprocessing module, may refer to the abovementioned embodiment and will not be elaborated herein.

In some embodiments, the information processing equipment may further include the controller configured to control the information acquisition device, the information processing device and/or the interaction interface. Specifically, the information acquisition device may be controlled by the controller to acquire the original information data from the outside, the information processing device may be controlled by the controller to receive and process the information data and may perform an operation of judgment, modification or sending out the modification signal, and the interaction interface may be controlled by the controller to display the modified content and the like.

In some embodiments, the interaction interface may be further configured to modify the set threshold value in response to an operation or command of the user. For example, if the user regulates a threshold value corresponding to predetermined confidence of a specific key feature (for example, a specific text, a certain segment of voice or a certain segment of video), the operations of the information acquisition device may be performed through a touch screen, a mouse, a voice command, a keyboard or the like.

Figure 41:
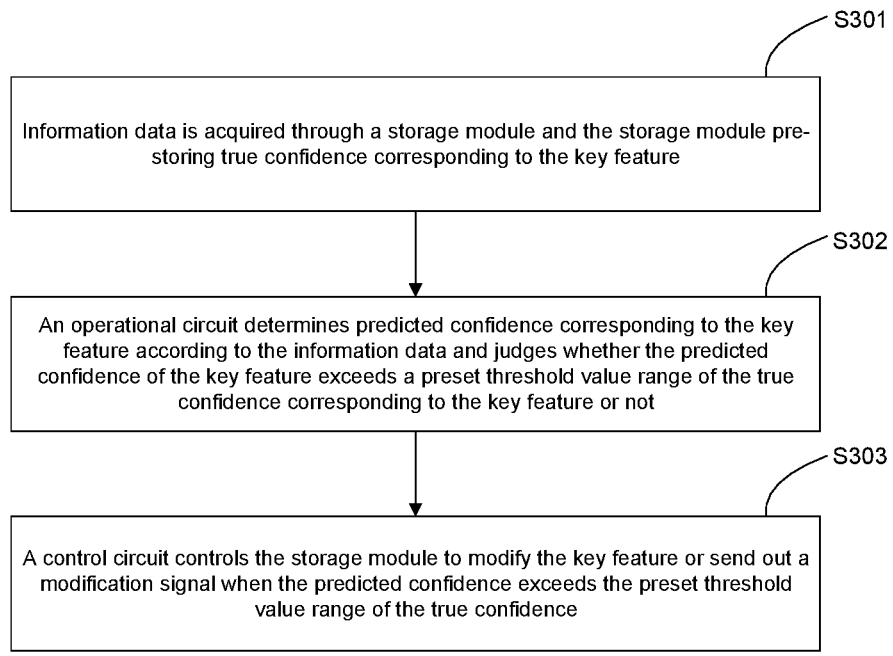
FIG. 41 is a flowchart of an information processing method according to an embodiment of the disclosure.

As illustrated in FIG. 41, another aspect of the embodiments of the disclosure further provides an information processing method, which may include the following steps.

In S301, information data is acquired through a storage module, the information data including at least one key feature and the storage module pre-storing true confidence corresponding to the key feature.

In S302, an operational circuit determines predicted confidence corresponding to the key feature according to the information data and judges whether the predicted confidence of the key feature exceeds a preset threshold value range of the true confidence corresponding to the key feature or not.

In S303, a controlling circuit controls the storage module to modify the key feature or send out a modification signal if the predicted confidence exceeds the preset threshold value range of the true confidence.

The processing method may correspond to the execution steps of the abovementioned processing device. A specific execution manner may refer to the descriptions about the abovementioned steps and will not be elaborated herein.

For further describing the disclosure, specific embodiments will be listed below for detailed description. In the following detailed descriptions, for convenient explanation, many specific details are elaborated to provide a comprehensive understanding to the embodiments of the disclosure. However, it is apparent that one or more embodiments may also be implemented without these specific details. Under another condition, a well-known structure and device are embodied in a graphical representation manner to simplify the drawings. It should be understood that the following detailed descriptions are not intended to limit the disclosure and, instead, they provide bases for those skilled in the art to understand alternative forms, equivalents and corrected cases covered by the embodiments described within the scope of the appended claims.

Embodiment 3 corresponds to a processing device for information data which is a picture, embodiment 4 corresponds to a processing device for information data which is an audio and/or a video, and embodiment 5 corresponds to information processing equipment.

Embodiment 3

In the embodiment, a storage unit of an information processing device may receive information data. The information data may include, but are not limited to, a group of pictures including one or more key features. The device computes confidence of each key feature included in the information data and obtains a judgment result. The device scores the information data in the storage unit according to the judgment result, where the information data may be original information data and may also be a result obtained by preprocessing the original data.

The information processing device may perform adaptive training. For example, the device inputs a group of pictures including one or more key features, such as a picture including a handwritten text and a picture forming a video. Each key feature has corresponding confidence, and the confidence is a natural number. For the input pictures for adaptive training, confidence of each key feature therein is known and is for example, true confidence. The device takes these pictures as information data and computes confidence, in other words predicted confidence, of each key feature. The computed predicted confidence is compared with the known true confidence to adaptively update parameters (for example, weights and an offset) in a network to further improve recognition and prediction accuracy of the device.

The confidence may be any natural number. For example, if a value of the confidence is larger, the confidence about inclusion of the key feature is higher. The confidence may also be normalized into a natural number within a certain range. For example, if the confidence is within [0, 1], the confidence represents a confidence probability about inclusion of the key feature.

A value of the true confidence of a training set is alternative, for example, {0, 1}, where 0 represents that the input picture does not include the corresponding key feature, and 1 represents inclusion of the feature; and of course, 1 may also represent exclusion and 1 may represent inclusion.

The abovementioned adaptive training process may be implemented off line. Here, the information processing device may be an artificial neural network chip, including a storage unit configured to store data and an instruction, where the data may include input neurons, output neurons, weights, a score, an error mode judgment result and the like, and an operational circuit configured to perform corresponding computation on the data according to the instruction stored in the storage unit. The operational circuit may mainly perform the computation in three steps. In a first step, the input neurons and weight data are multiplied. In a second step, adder tree computation may be performed to add a result obtained in the first step through an adder tree step by step to obtain a weighted sum, and the weighted sum is offset or not processed according to a requirement. In a third step, activation function computation may be performed on a result obtained in the second step to obtain the output neurons.

The information processing device may further include a DMA configured to read/write the data or instruction in the storage unit, an instruction cache, a weight cache, an input neuron cache and an output neuron cache.

In the information processing device, a controlling circuit may be configured to read a dedicated instruction from the instruction cache, decode it into an instruction for the operational circuit and input it into the operational circuit. The instruction cache may be configured to store the dedicated instruction. The weight instruction may be configured to cache the weight data. The input neuron cache may be configured to cache the input neurons input into a mapping unit. The output neuron cache may be configured to cache the output neurons (the confidence corresponding to each key feature) output by the operational circuit.

A direct data path between the DMA and the operational circuit may be configured to directly perform computation on the data stored in the DMA and return a result.

Preferably, the chip may further include a preprocessing module. The module preprocesses the original information data, in other words one or more pictures including a handwritten text or figure, to obtain image data matched with a scale of a bottommost input layer of an artificial neural network used by the chip, where preprocessing may include segmentation, Gaussian filtering, binarization, regularization, normalization and the like.

Preferably, a method by which the artificial neural network chip obtains the judgment result may include the follows. Each output neuron of a final output layer of the neural network corresponds to a keyword and a value of the output neuron is confidence of appearance of the keyword.

A modification method may include the follows. A standard answer is split into a set of multiple standard key features, which may be part of a letter, a word, a phrase (text data input) or a picture (image data input), and a standard correct mode of each key feature is pre-stored in the storage unit of the chip. Each output neuron of the final output layer of the neural network provides confidence of each key feature part and the corresponding standard correct mode. (If a certain error mode appears or confidence of its appearance is higher than a preset threshold value, the error mode is modified into the corresponding key feature in the standard answer.) The result of the output neuron is stored in the DMA and is retransmitted into the operational circuit for confidence modification threshold value comparison, and if the confidence of the key feature is lower than the preset threshold value, the key feature is modified according to the standard correct mode of the key feature.

The abovementioned judgment result obtaining, scoring and modification processes are all completed in the artificial neural network chip.

In step 1, the information data is transmitted into the storage unit through the preprocessing module or directly.

In step 2, the DMA transmits the information data in batches to the corresponding on-chip caches (in other words the instruction cache, the input neuron cache and the weight cache).

In step 3, the controlling circuit reads the instruction from the instruction cache and decodes and transmits the instruction into the operational circuit.

In step 4, the operational circuit may perform corresponding computation according to the instruction. In each layer of the neural network, computation is implemented mainly in three steps. In step 4.1, the corresponding input neurons and weights are multiplied. In step 4.2, adder tree computation may be performed, in other words, a result obtained in step 4.1 is added through an adder tree step by step to obtain a weighted sum, and the weighted sum is offset or not processed according to a requirement. In step 4.3, activation function computation may be performed on a result obtained in step 4.2 to obtain the output neurons, and the output neurons are transmitted into the output neuron cache.

In step 5, step 2 to step 4 are repeated until computation for all the data is completed, for example, obtaining a final result required by a function, where the final result is obtained by the output neurons of the final layer of the neural network, output from the operational circuit to the output neuron cache and temporally stored in the DMA for next computation.

In step 6, a scoring result, in other words the confidence of each key feature, stored in the output neurons of the neural network in the DMA is directly input into a computation device for comparison with the preset threshold value through a data path between the DMA and the computation device. If the confidence of the key features is lower than the preset threshold value, the input key features in the DMA are replaced with the standard correct modes of the corresponding key features. After all the key features are compared and replaced according to the abovementioned steps, modification work for the information data is completed in the DMA.

In step 7, the modified information data in the DMA is stored back into the storage unit and output as finally modified output data.

According to the requirement of the function, if the judgment result is required to be obtained, values of the output neurons of the final layer of the neural network are the confidence of appearance of the keywords; and if modification is required, the modified data finally subjected to step 7 in the storage unit is the finally modified data.

According to the requirement of the function, the structure may realize scoring and/or modification functions, and scoring result output is the output after steps 1-5 are performed; and modified output is the final output of the storage unit after steps 1-7 are completely performed.

Embodiment 4

A storage unit in an artificial neural network chip (corresponding to an information processing device) provided by the embodiment may be configured to pre-store one or more key frame pictures (corresponding to key features). The storage unit acquires a video from the outside and transmits the video into an operational circuit, where the video may include multiple input pictures. The operational circuit computes a similarity between each input picture and each key frame picture (to be specific, if there are N input pictures and M key pictures, NM similarities are obtained) and/or may perform normalized modification on the video.

Furthermore, the video may further include an audio which is divided into multiple segments of audios, and the multiple segments of audios correspond to the multiple pictures. The chip may perform comparison to obtain similarities between all the pictures in the video and each key frame picture, and/or may perform comparison to obtain similarities between each waveform obtained by decomposing all the audios in the video and key waveforms, and may perform normalized modification on the video.

Furthermore, the video is a movement video of one or more testees. Furthermore, the movement video may include the video of dancing, Wushu movements, or class-break setting-up exercises, movements and/or postures of a sports event, handwriting movements and/or postures, typing movements and/or postures and reading movements and/or postures.

A method for obtaining the similarities may be as follows. Each output neuron of a final output layer of a neural network corresponds to a similarity, and a value of the output neuron is a similarity value. (To be kept consistent with the above example, the layer has total N output neurons.)

Another method for obtaining the similarities may be as follows. Each output neuron of the final output layer of the neural network corresponds to an input picture, and the value of the output neuron is the similarity of the key frame picture most similar to the input picture and the input picture. (To be kept consistent with the above example, the layer has total N output neurons.)

Another method for obtaining the similarities may be as follows. Each output neuron of the final output layer of the neural network corresponds to a key picture, and the value of the output neuron is the similarity of the input picture most similar to the key frame picture and the key picture. (To be kept consistent with the above example, the layer has total M output neurons.)

A scoring method may be as follows. A layer is added after the final output layer of the neural network as a new final output layer, and output neurons in the previous final output layer are taken as input neurons of the layer added; the layer added has only one output neuron, and its value is a score; and weights in the layer added correspond to importance degrees of each similarity.

A modification method may be as follows. A similarity computational result obtained above is directly input into the operational circuit from the DMA and is compared with a preset threshold value. If the similarity is lower than the preset threshold value, it is determined that the corresponding key feature (which may be expressed as the corresponding key frame picture of the video) is inconsistent with a normalized standard and is required to be modified. Therefore, the corresponding input picture is replaced with the corresponding standard key frame picture for writing back into the DMA and final output into the storage unit for output.

Continuous data input such as a video and an audio is decomposed into multiple key frames according to the time. Similarities between the key frame pictures and standard key frame pictures are computed. If the similarities are lower than the preset threshold value, the input is modified by use of the standard pictures.

The abovementioned similarity obtaining and scoring processes are all completed in the artificial neural network chip, and may include the following steps.

In step 1, information data is transmitted into the storage unit through a preprocessing module or directly.

In step 2, the DMA transmits the information data in batches to corresponding on-chip caches (in other words an instruction cache, an input neuron cache and a weight cache).

In step 3, a controlling circuit reads an instruction from the instruction cache and decodes and transmits the instruction into the operational circuit.

In step 4, the operational circuit may perform corresponding computation according to the instruction. In each layer of the neural network, computation is implemented mainly in three steps. In step 4.1, the corresponding input neurons and weights are multiplied. In step 4.2, adder tree computation may be performed, in other words, a result obtained in step 4.1 is added through an adder tree step by step to obtain a weighted sum, and the weighted sum is offset or not processed according to a requirement. In step 4.3, activation function computation may be performed on a result obtained in step 4.2 to obtain the output neurons, and the output neurons are transmitted into the output neuron cache.

In step 5, step 2 to step 4 are repeated until computation for all the data is completed, for example, obtaining a final result required by a function, wherein the final result is obtained by the output neurons of the final layer of the neural network, is output from the operational circuit to the output neuron cache and is written into the DMA for next operation.

In step 6, a similarity result, in other words a score of each key feature (key frame), stored in the output neurons of the neural network in the DMA is directly input into a computation device for comparison with the preset threshold value through a data path between the DMA and the computation device. If the confidence of the key features is lower than the preset threshold value, the input key features in the DMA are replaced with the corresponding standard key frames. After all the key features are compared and replaced according to the abovementioned steps, modification work for the information data is completed in the DMA.

In step 7, the modified information data in the DMA is stored back into the storage unit and output as finally modified output data.

According to the requirement of the function, if the judgment result is required to be obtained, values of the output neurons of the final layer of the neural network are the similarities (scores) between each key frame and the standard key frame; and if modification is required, the modified data finally subjected to step 7 in the storage unit is the finally modified data.

Embodiment 5

A device may include an information acquisition device, an information processing device (for example, an artificial neural network chip) (with a structure the same as embodiment 3), an interaction interface and a controlling circuit.

The information acquisition device (this device may be an extension of a preprocessing device and is equivalent to a combination of an interface and the preprocessing device) may be configured to receive external information, the information including a text, an image, an audio, a video and the like, and transmit original data or preprocessed data to the artificial neural network chip as information data.

The interaction interface may be configured to interact with a user, for example, receiving an operation or command of the user and transmitting it to the controlling circuit. The interaction interface may be further configured to receive output data of the artificial neural network chip and convert the output data into feedback information in a proper form for display to the user. The controlling circuit may receive the operation or command of the user and controls operations of the whole device.

The interaction interface may enable the user to freely modify the abovementioned preset threshold value to obtain modification results capable of achieving different effects, and is friendlier. Meanwhile, the interaction interface may also provide the feedback information for the user, for example, an alarm about an incorrect sitting posture and modification and correction of a manner of holding a pen.

Furthermore, the information acquisition device is an image acquisition device and a sound acquisition device. The image acquisition device is a webcam. The sound acquisition device is a microphone. Furthermore, a terminal is a character recognition device, a mobile phone, a computer, a notebook computer and a tablet computer.

In the embodiments provided by the disclosure, it should be understood that the disclosed related equipment, devices and methods may be implemented in other manners. For example, the device embodiment described above is only schematic. For example, division of the parts or the modules is only logical function division and another division manner may be adopted during practical implementation. For example, multiple parts or modules may be combined or integrated into a system or some characteristics may be neglected or not performed.

Each functional part/unit/subunit/module/submodule/component in the disclosure may be hardware. For example, the hardware may be a circuit, including a digital circuit, an analogue circuit and the like. Physical implementation of a hardware structure may include, but is not limited to, a physical device, and the physical device may include, but is not limited to, a transistor, a memristor and the like. The computation module in the computation device may be any proper hardware processor, for example, a CPU, a GPU, a Field-Programmable Gate Array (FPGA), a Digital Signal Processor (DSP) and an ASIC. The storage unit may also be any proper magnetic storage medium or magneto-optical storage medium, for example, a Resistance Random Access Memory (RRAM), a DRAM, an SRAM, an Embedded DRAM (EDRAM), a High Bandwidth Memory (HBM) and a Hybrid Memory Cube (HMC).

The "memory" in the disclosure may be integrated in a processing device for performing a GAN, may also be an independent device, and as an external memory, may perform data transmission with the processing device for performing the GAN.

Figure 42:
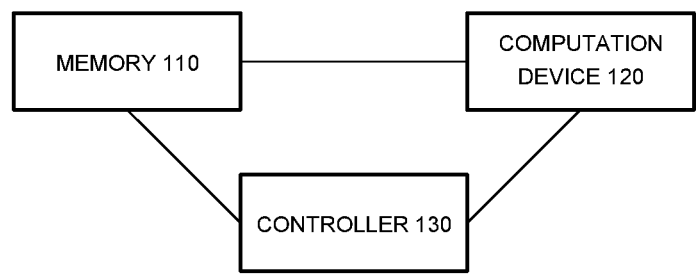
FIG. 42 is a basic block diagram of a processing device for performing a GAN according to an embodiment of the disclosure.

According to the basic concept of the disclosure, a processing device for performing a GAN is provided, which, as illustrated in FIG. 42, may include the follows.

A memory 110 may be configured to receive input data, the input data including a random noise and reference data, and store a discriminator neural network parameter and a generator neural network parameter.

A computation device 120 may be configured to transmit the random noise input data into a generator neural network and may perform computation to obtain a noise generation result, and is also configured to input both of the noise generation result and the reference data into a discriminator neural network and may perform computation to obtain a discrimination result, and may be further configured to update the discriminator neural network parameter and the generator neural network parameter according to the discrimination result.

According to the processing device of the embodiment of the disclosure, a reasonable hardware structure integrating the computation device and the memory is planned for a specific implementation mode of the adversarial network, so that computation efficiency is improved. The memory 110 of the processing device for performing the GAN may receive the input data, the input data including the random noise and the reference data (including, but not limited to, a real picture, voice or text). The reference data may include, but is not limited to, a group of pictures including one or more key features, a group of audios including one or more key sampling points and a word group or phrase including one or more word class tags. The computation device 120 may perform training according to the input data to obtain a group of generation function parameters and obtains the noise generation result (for example, a created image) according to the generation function parameters and the reference data (for example, a reference image), where the input data may be original input data and may also be a result obtained by preprocessing the original data.

In some embodiments, the memory may be further configured to store a computation instruction, the processing device may further include a controller 130, and the controller 130 may be configured to extract the computation instruction, parse the computation instruction into an operation instruction and send the computation instruction to the computation device. Specifically, the controller 130 may be configured to extract the computation instruction from the memory, parse the computation instruction to obtain multiple operation instructions and send the multiple operation instructions and the input data to the computation device.

Figure 43:
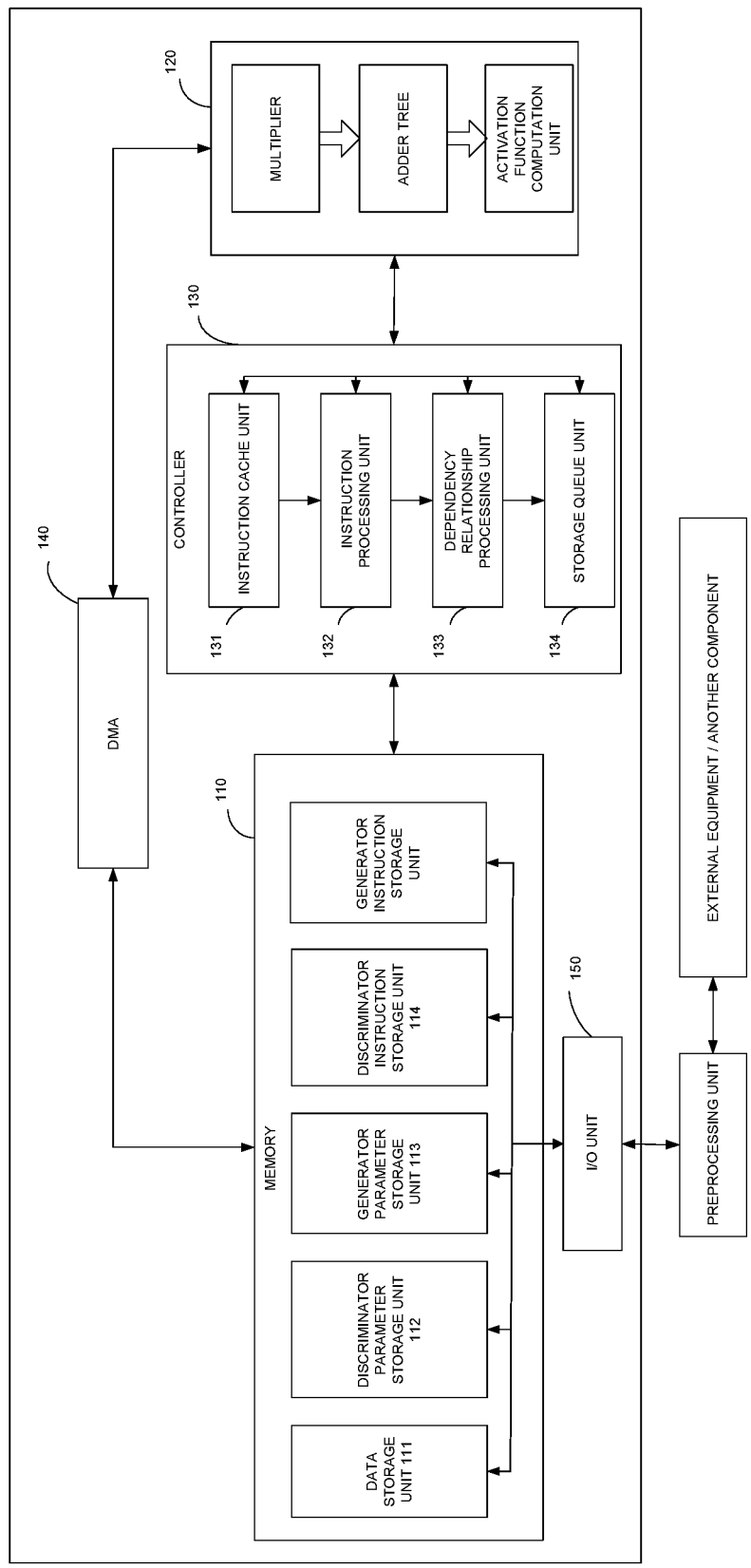
FIG. 43 is a basic block diagram of a processing device for performing a GAN according to another embodiment of the disclosure.

As illustrated in FIG. 43, the memory 110 may include a discriminator parameter storage unit 112 configured to store the discriminator neural network parameter, a generator parameter storage unit 113 configured to store the generator neural network parameter, a discriminator instruction storage unit 114 configured to store a computation instruction for the operation of discriminator neural network, a generator instruction storage unit 115 configured to store a computation instruction for the operation of generator neural network, and a data storage unit 111 configured to store data, where the data may include the ransom noise, the noise generation result (in other words a negative sample, for example, a picture generated by the random noise) and the reference data (the real picture, voice, text or the like obtained from the outside). Here, such a structure is mainly adopted to be adapted to structural characteristics of a generator and discriminator in the GAN, thereby physically distinguishing weight storage of the generator and the discriminator and utilizing storage resources more efficiently. Meanwhile, for adaptation to such a storage structure, Input/Output (I/O) instructions may be modified to distinguish a discriminator I/O instruction from a generator I/O instruction.

The data storage unit 111 may be configured to acquire and store the data, and may further acquire and store a network model (including the discriminator neural network and the generator neural network) and the computation instruction.

Optionally, the processing device may further include an I/O unit 150, which may be configured to acquire external data and output an internal computational result to external equipment or another component.

Optionally, the processing device may further include a DMA 140, which may be configured to forward the generator neural network parameter from the memory to the computation device 120, and forward the random noise and the reference data from the data storage unit 111 to the computation device 120 through the DMA.

Optionally, the memory may further include a storage medium. The storage medium may be an off-chip memory, may also be an on-chip memory during a practical application. The storage medium may be configured to store a data block. The data block may specifically be n-dimensional data, in which n may be an integer greater than or equal to 1. For example, the data block is one-dimensional data, in other words a vector, if n=1; the data block is two-dimensional data, in other words a matrix, if n=2; the data block is a multidimensional tensor if n=3 or is greater than 3.

In some embodiments, the controller 130 may include: an instruction caching unit 131, an instruction processing unit 132, a dependency relationship processing unit 133, and a storage queue unit 134. The instruction caching unit 131 may be configured to store the computation instruction associated with the network model. The instruction processing unit 132 may be configured to parse the computation instruction to obtain multiple operation instructions. The storage queue unit 134 may be configured to store an instruction queue, the instruction queue including multiple operation instructions or computation instructions to be performed according to a sequence of the queue.

As illustrated in Table 1, the computation instruction may include one or more operation fields and an operation code. The computation instruction may include a neural network operation instruction. For example, for the neural network operation instruction, as illustrated in Table 1, register number 0, register number 1, register number 2, register number 3 and register number 4 may be operation fields, and each of register number 0, register number 1, register number 2, register number 3 and register number 4 may be numbers of one or more registers.

A CONFIG instruction configures each constant required by computation for a present layer before computation for each layer of the artificial neural network is started. A COMPUTE instruction completes arithmetic logical computation for each layer of the artificial neural network. An IO instruction implements reading-in of input data required by computation from an external address space and storage of the data back into an external space after computation is completed. A No Operation (NOP) instruction is responsible for clearing microinstructions in all microinstruction cache queues presently loaded inside and ensuring all instructions before the NOP instruction are completed. The NOP instruction does not include any operation. A JUMP instruction is responsible for enabling the controller to jump an address of a next instruction to be read in the instruction caching unit to implement jump of a control flow. A MOVE instruction is responsible for moving data of a certain address in an internal address space of the device to another address in the internal address space of the device, this process is independent from a computation unit, and no resource of the computation unit is occupied in an execution process.

TABLE 1

| Operation code | Register number 0 | Register number 1 | Register number 2 | Register number 3 | Register number 4 |
|---|---|---|---|---|---|
| COMPUTE | Starting address of input data | Length of the input data | Starting address of weight | Length of the weight | Address of activation function interpolation table |
| IO | Address of external data memory | Data length | Address of internal data memory | | |
| NOP | | | | | |
| JUMP | Destination address | | | | |
| MOVE | Input address | Data size | Output address | | |

A dependency relationship processing unit may be configured, if there are multiple operation instructions, to determine whether a first operation instruction forms an associated relationship with a zeroth operation instruction before the first operation instruction or not. If the first operation instruction forms the associated relationship with the zeroth operation instruction, the dependency relationship processing unit caches the first operation instruction in the instruction caching unit, After the zeroth operation instruction is performed, the dependency relationship processing unit extracts the first operation instruction from the instruction caching unit and transmits the first operation instruction to the computation device.

Whether the first operation instruction forming the associated relationship with the zeroth operation instruction before the first operation instruction or not is determined as follows.

A first storage address interval of required data (for example, a matrix) in the first operation instruction is extracted according to the first operation instruction, and a zeroth storage address interval of the required matrix in the zeroth operation instruction is extracted according to the zeroth operation instruction. If an overlapped region exists between the first storage address interval and the zeroth storage address interval, it is determined that the first operation instruction forms the associated relationship with the zeroth operation instruction; and if no overlapped region exists between the first storage address interval and the zeroth storage address interval, it is determined that the first operation instruction does not form the associated relationship with the zeroth operation instruction.

Figure 44:
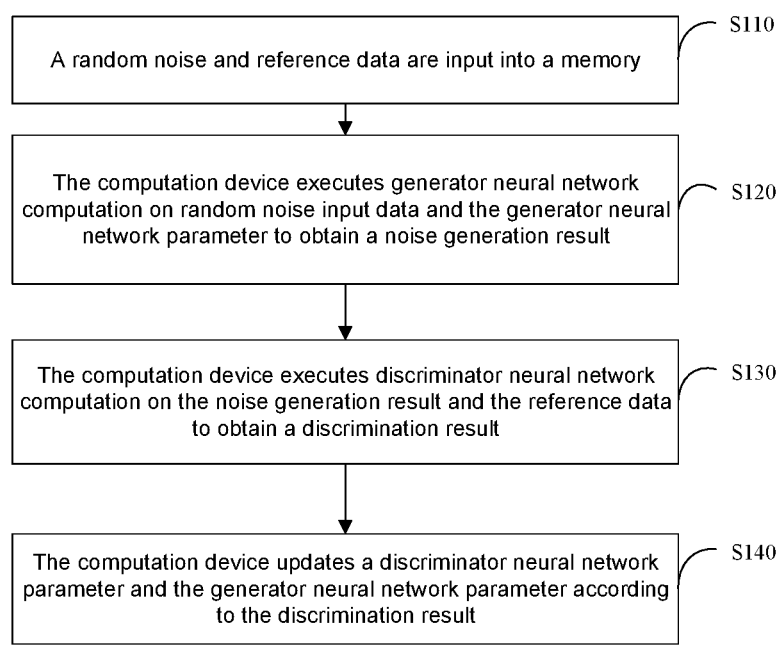
FIG. 44 is a flowchart of a method for machine creation according to an embodiment of the disclosure.

According to another aspect of the embodiments of the disclosure, a method for machine creation by use of the abovementioned processing device is further provided, which, as illustrated in FIG. 44, may include the following steps.

In S110, a random noise and reference data are input into a memory (for example, the random noise and the reference data are stored into a storage unit).

Then, a generator neural network parameter may be forwarded to a computation device 120 through a DMA, and the random noise and the reference data are forwarded from 111 to the computation device 120 through the DMA.

In S120, the computation device may perform generator neural network computation on random noise input data and the generator neural network parameter to obtain a noise generation result.

In S130, the computation device may perform discriminator neural network computation on the noise generation result and the reference data to obtain a discrimination result.

In S140, the computation device updates a discriminator neural network parameter and the generator neural network parameter according to the discrimination result.

In some embodiments, S140 specifically may include the follows. Loss values of a generator neural network and a discriminator neural network are computed according to the discrimination result respectively. Then a parameter in the discriminator neural network is adaptively updated according to maximum gradient directions of reduction of the loss values to further improve discrimination accuracy of a discriminator. A parameter in the generator neural network is adaptively updated according to maximum gradient directions, discriminated by the discriminator, of increase of the loss values.

S110-S140 are repeated, in other words, training may be performed, until the discrimination accuracy of the discriminator neural network changes within a set range, and the noise generation result obtained by the generator neural network computation is output as a final creation result.

The processing device and method for creation by use of the device in the disclosure will be specifically described below in combination with specific embodiments. However, those skilled in the art should know that the following specific details are only adopted to understand the disclosure and should not be understood as limits to the disclosure.

Embodiment 6

A processing device for performing a GAN in the embodiment may be configured to create a video and/or an image.

A memory of the processing device for performing the GAN may receive input data, the input data including, but not limited to, a group of pictures including one or more key features. A computation device may perform training according to the input data to obtain a group of generation function parameters and generates and outputs a created image according to the generation function parameters and an input reference image, where the input data may be original input data and may also be a result obtained by preprocessing the original data.

The processing device for performing the GAN may perform adaptive training. For example, the device inputs a group of training pictures including one or more key features, such as a hand-drawn picture, a real scene photo and a key frame picture of a video. The device inputs the input training pictures into a discriminator for discrimination as real pictures together with false pictures generated by a generation model according to noises in a mixed manner, computes loss values of a generator and the discriminator by weighting according to a discrimination result weight respectively, and then adaptively updates a parameter (for example, weights and an offset) in the discriminator according to maximum gradient directions of reduction of the loss values to further improve discrimination accuracy of the discriminator. Meanwhile, the generator adaptively updates a parameter (for example, weights and an offset) in the generator according to maximum gradient directions of increase of the loss values discriminated by the discriminator to further improve a generation capability of the generator, so as to make images generated according to the noises closer to real images and reduce the discrimination accuracy of the discriminator. Finally, if the discrimination accuracy of the discriminator changes within a set range, an optimal generator standard is achieved, and a picture may be generated and created from a random noise by use of the parameter of the generator according to the reference real pictures.

A value of reliability of the input picture of the discriminator is alternative, for example, $\{0, 1\}$, where 0 represents that the input picture is an input training picture, and 1 represents the input picture is a false picture generated by the generator according to a noise; and of course, 1 may also represent real and 0 may also represent false. Preferably, the abovementioned adaptive training process is implemented off line.

Specific video or image creation steps may include the following steps.

In step 1, the random noise input data is transmitted into the memory after passing through a preprocessing unit or is directly transmitted into the memory.

In step 2, a DMA transmits the random noise input data in batches to an instruction cache, an input neuron cache and a weight cache.

In step 3, a controller reads an instruction from the instruction cache and decodes and transmits the instruction decoded into the computation device.

In step 4, the computation device may perform corresponding computation according to the instruction. In each layer of a neural network, computation is implemented mainly in three steps. In step 4.1, corresponding input neurons and weights are multiplied in a multiplier. In step 4.2, adder tree computation may be performed in an adder tree, in other words, a result obtained in step 4.1 is added through the adder tree step by step to obtain a weighted sum, and the weighted sum is offset or not processed according to a requirement. In step 4.3, activation function computation may be performed on a result obtained in step 4.2 in an activation function computation unit to obtain output neurons, and the output neurons are transmitted into an output neuron cache.

In step 5, step 2 to step 4 are repeated until computation for all the data is completed, where the noise generation result of the generator may be obtained according to a final output layer of the neural network, and the result is stored in a generator output cache by the DMA.

In step 6, part of the input data and the generation result of the generator are mixed as input data of a discriminator model, and step 2 to step 4 are repeated until computation for all the data is completed, where a discrimination result of the discriminator may be obtained according to a result of the final output layer of the neural network, and the result is stored in a discriminator output cache by the DMA.

In step 7, the DMA transmits the output result of the discriminator into the computation device, partial derivative computation may be performed to obtain an optimal gradient of the generator and an optimal gradient of the discriminator respectively for respective addition with neuron weights of the generator and the discriminator, and corresponding results are stored in the corresponding neuron caches.

In step 8, steps 5, 6 and 7 are repeated until loss functions of the generator and the discriminator are optimal.

In step 9, input reference data is transmitted into the memory after passing through the data preprocessing unit or is directly transmitted into the memory.

In step 10, step 2 to step 4 are repeated, and an output result of an output layer of the neural network in a generator model is a creation result.

According to the requirement of the function, a size of an output created picture (in other words the count of neurons of the final output layer of the artificial neural network), training data (input training features) and a network parameter updating manner (random gradient descent, an Adam algorithm and the like) are required to be preset in an adaptive training stage.

Embodiment 7

A processing device for performing a GAN in the embodiment may be configured to create an audio.

According to the processing device for performing the GAN, a memory of the processing device for performing the GAN may receive input data, the input data including, but not limited to, a group of audios including one or more key sampling points. A computation device may perform training according to the input data to obtain a group of generation function parameters, and generates and outputs a created audio according to the generation function parameters and an input reference image, where the input data may be original input data and may also be a result obtained by preprocessing the original data.

The processing device for performing the GAN may perform adaptive training. For example, the device inputs a group of audio data including one or more key sampling points, such as a voice segment and a synthesized and edited electronic sound effect audio. Then, input training audios are input into a discriminator for discrimination as real audios together with false audios generated by a generation model according to noises in a mixed manner, loss values of a generator and the discriminator are computed by weighting according to a discrimination result respectively, and then a parameter (for example, weights and an offset) is adaptively trained in the discriminator according to maximum gradient directions of reduction of the loss values to further improve discrimination accuracy of the discriminator. Meanwhile, the generator adaptively updates a parameter (for example, weights and an offset) in the generator according to maximum gradient directions of increase of the loss values discriminated by the discriminator to further improve a generation capability of the generator, so as to make a distribution of sampling points of the audios generated according to the noises closer to a distribution of feature sampling points and reduce the discrimination accuracy of the discriminator. Finally, if the discrimination accuracy of the discriminator does not change any more, an optimal generator standard is achieved, and an audio of a reference style may be generated from a random noise by use of the parameter of the generator according to the reference audio.

A value of reliability of the input audio of the discriminator is alternative, for example, $\{0, 1\}$, where 0 represents that the input audio is an input training audio, and 1 represents the input audio is a false audio generated by the generator according to a noise; and of course, 1 may also represent real and 0 may also represent false. Preferably, the abovementioned adaptive training process is implemented off line.

A method by which an artificial neural network obtains a created picture (video key frame) is as follows. Matrix multiplication may be performed on the input reference picture according to an optimal generator weight parameter obtained by training to obtain the final created picture (video key frame).

Specific voice creation steps may include the following steps.

In step 1, random noise (a generation source of a generator model is the random noise and a meaningful audio may be generated by continuous generation according to weights) input data is transmitted into a storage unit after passing through a preprocessing unit or is directly transmitted into the storage unit.

In step 2, a DMA transmits the random noise input data in batches to an instruction cache, an input neuron cache and a weight cache.

In step 3, a controller reads an instruction from the instruction cache and decodes and transmits the instruction decoded into the computation device.

In step 4, the computation device may perform corresponding computation according to the instruction. In each layer of a neural network, computation is implemented mainly in three steps. In step 4.1, corresponding input neurons and weights are multiplied. In step 4.2, adder tree computation may be performed, in other words, a result obtained in step 4.1 is added through an adder tree step by step to obtain a weighted sum, and the weighted sum is offset or not processed according to a requirement. In step 4.3, activation function computation may be performed on a result obtained in step 4.2 to obtain output neurons, and the output neurons are transmitted into an output neuron cache.

In step 5, step 2 to step 4 are repeated until computation for all the data is completed, wherein a noise generation result of the generator may be obtained according to a final output layer of the neural network, and the result is stored in a generator output cache by the DMA.

In step 6, part of the input data and the generation result of the generator are mixed as input data of a discriminator model, and step 2 to step 4 are repeated until computation for all the data is completed, wherein a discrimination result of the discriminator may be obtained according to a result of the final output layer of the neural network, and the result is stored in a discriminator output cache by the DMA.

In step 7, the DMA transmits the output result of the discriminator into the computation device, partial derivative computation may be performed to obtain an optimal gradient of the generator and an optimal gradient of the discriminator respectively for respective addition with neuron weights of the generator and the discriminator, and corresponding results are stored in the corresponding neuron caches.

In step 8, steps 5, 6 and 7 are repeated until loss functions of the generator and the discriminator are optimal.

In step 9, input reference data is transmitted into the storage unit after passing through the data preprocessing unit or is directly transmitted into the storage unit.

In step 10, step 2 to step 4 are repeated, and an output result of an output layer of the neural network in the generator model is a creation result.

According to the requirement of the function, the count of sampling points and audio duration of an output created audio (in other words the count of neurons of the final output layer of the artificial neural network), training data (input training features) and a network parameter updating manner (random gradient descent, an Adam algorithm and the like) are required to be preset in an adaptive training stage.

Embodiment 8

A processing device for performing a GAN in the embodiment is configured for creation of a text type.

A memory of the processing device for performing the GAN may receive input data, the input data including, but not limited to, a word group or phrase (text type) including one or more word class tags. The device may perform training according to the input data to obtain a group of generation function parameters and generates and outputs a text paragraph according to the generation function parameters and an input reference text paragraph, where the input data may be original input data and may also be a result obtained by preprocessing the original data. Data output by the device may be the text paragraph and may also be a special format such as a strict format of poems and the like.

The processing device for performing the GAN may perform adaptive training. For example, the device inputs a word group or phrase including one or more word class tags, such as a voice segment and an audio for synthesis and edition of an electronic sound effect. The device inputs an input training text paragraph into a discriminator for discrimination as a feature text paragraph together with a created text paragraph selected from a word group of the same word class by a generation model according to a noise in a mixed manner, computes loss values of a generator and the discriminator by weighting according to a discrimination result respectively and then adaptively updates a parameter (for example, weights and an offset) in the discriminator according to maximum gradient directions of reduction of the loss values to further improve discrimination accuracy of the discriminator. Meanwhile, the generator adaptively updates a parameter (for example, weights and an offset) in the generator according to maximum gradient directions of increase of the loss values discriminated by the discriminator to further improve a generation capability of the generator, so as to make a distribution of sampling points of the audios generated according to the noises closer to a distribution of feature sampling points and reduce the discrimination accuracy of the discriminator. Finally, if the discrimination accuracy of the discriminator does not change any more, an optimal generator standard is achieved, and a created text of a reference style may be generated from a random noise by use of the parameter of the generator according to the reference text paragraph.

A value of reliability of the input text paragraph of the discriminator is alternative, for example, {0, 1}, where 0 represents that the input word group or phrase is a word group or phrase included in an input training paragraph, and 1 represents the input word group or phrase is a random phrase generated by the generator according to a noise; and of course, 1 may also represent real and 0 may also represent false.

Preferably, the abovementioned adaptive training process is implemented off line. Preferably, the processing device for performing the GAN is an artificial neural network chip.

Specific text type creation steps may include the following steps.

In step 1, the random noise input data is transmitted into the memory after passing through a preprocessing unit or is directly transmitted into the memory.

In step 2, a DMA transmits the random noise input data in batches to an instruction cache, an input neuron cache and a weight cache.

In step 3, a controller reads an instruction from the instruction cache and decodes and transmits the instruction decoded into the computation device.

In step 4, the computation device may perform corresponding computation according to the instruction. In each layer of a neural network, computation is implemented mainly in three steps. In step 4.1, corresponding input neurons and weights are multiplied. In step 4.2, adder tree computation may be performed, in other words, a result obtained in step 4.1 is added through an adder tree step by step to obtain a weighted sum, and the weighted sum is offset or not processed according to a requirement. In step 4.3, activation function computation may be performed on a result obtained in step 4.2 to obtain output neurons, and the output neurons are transmitted into an output neuron cache.

In step 5, step 2 to step 4 are repeated until computation for all the data is completed, where a noise generation result of the generator may be obtained according to a final output layer of the neural network, and the result is stored in a generator output cache by the DMA.

In step 6, part of the input data and the generation result of the generator are mixed as input data of a discriminator model, and step 2 to step 4 are repeated until computation for all the data is completed, wherein a discrimination result of the discriminator may be obtained according to a result of the final output layer of the neural network, and the result is stored in a discriminator output cache by the DMA.

In step 7, the DMA transmits the output result of the discriminator into the computation device, partial derivative computation may be performed to obtain an optimal gradient of the generator and an optimal gradient of the discriminator respectively for respective addition with neuron weights of the generator and the discriminator, and corresponding results are stored in the corresponding neuron caches.

In step 8, steps 5, 6 and 7 are repeated until loss functions of the generator and the discriminator are optimal.

In step 9, input reference data is transmitted into a storage unit after passing through the data preprocessing unit or is directly transmitted into the storage unit.

In step 10, step 2 to step 4 are repeated, and an output result of an output layer of the neural network in a generator model is a creation result.

According to the requirement of the function, the count of sampling points and audio duration of an output created audio (in other words the count of neurons of the final output layer of the artificial neural network), training data (input training features) and a network parameter updating manner (random gradient descent, an Adam algorithm and the like) are required to be preset in an adaptive training stage.

An embodiment of the disclosure further provides electronic equipment, which may include the abovementioned processing device for performing the GAN.

The electronic equipment may include, but is not limited to, a robot, a computer, a printer, a scanner, a tablet computer, an intelligent terminal, a mobile phone, an automobile data recorder, a navigator, a sensor, a webcam, a cloud server, a camera, a video camera, a projector, a watch, an earphone, a mobile storage, wearable equipment, a transportation means, a household electrical appliance and/or medical equipment.

The transportation means may include an airplane, a ship and/or a vehicle; the household electrical appliance may include a television, an air conditioner, a microwave oven, a refrigerator, an electric rice cooker, a humidifier, a washing machine, an electric lamp, a gas cooker and a range hood;

and the medical equipment may include a nuclear magnetic resonance spectrometer, a B-ultrasonic scanner and/or an electrocardiograph.

Each functional unit/module/submodule/subunit in the disclosure may be hardware. For example, the hardware may be a circuit, including a digital circuit, an analogue circuit and the like. Physical implementation of a hardware structure may include, but is not limited to, a physical device, and the physical device may include, but not limited to, a transistor, a memristor and the like. The computation module in the computation device may be any proper hardware processor, for example, a CPU, a GPU, an FPGA, a DSP and an ASIC. The storage unit may also be any proper magnetic storage medium or magneto-optical storage medium, for example, an RRAM, a DRAM, an SRAM, an EDRAM, an HBM and an HMC.

Those skilled in the art may clearly know that, for convenient and brief description, descriptions are only made with division of each of the abovementioned functional modules as an example and the abovementioned functions may be allocated to different functional modules for realization according to a requirement during a practical application, in other words, an internal structure of the device is divided into different functional modules to realize all or part of the functions described above.

The purposes, technical solutions and beneficial effects of the disclosure are further described above with the specific embodiments in detail. It should be understood that the above is only the specific embodiment of the disclosure and not intended to limit the disclosure. Any modifications, equivalent replacements, improvements and the like made within the spirit and principle of the disclosure shall fall within the scope of protection of the disclosure.

What is claimed:

1. A data sharing system, comprising:
   a first processing module that includes a first internal storage unit; and
   a second processing module configured to transmit, to the first processing module, a request signal that includes a data address in the first internal storage unit,
      wherein the first processing module is configured to:
         retrieve, upon receiving the request signal, data at the data address in the first internal storage unit, and
         transmit the retrieved data to the second processing module;
      wherein each of the first processing module and the second processing module includes a physical processor that includes an artificial neural network processor configured to perform artificial neural network forward computations,
      wherein the artificial neural network processor includes an instruction caching unit configured to read an instruction from a Direct Memory Access (DMA) and cache the read instruction,
      wherein the artificial neural network processor includes a controlling unit configured to read the instruction from the instruction caching unit and decode the instruction into one or more microinstructions,
      wherein the artificial neural network processor further includes:
         a primary computation module configured to transmit an input neuron vector of a current layer to one or more secondary computation modules via an H tree module for reverse training of each layer of a neural network,
         wherein the H tree module is configured to merge one or more output neuron values from the one or more secondary computation modules into an intermediate result vector, and
         wherein the primary computation module is further configured to generate a final result vector based on the intermediate result vector.

2. The data sharing system of claim 1, wherein the first processing module is further configured to transmit an acknowledge signal to the second processing module upon receiving the request signal.

3. The data sharing system of claim 1, wherein the DMA is further configured to write data into corresponding data caching units of the primary computation module and each secondary computation module from an external address space or read data into the external address space from the data caching units.

4. The data sharing system of claim 1, wherein the artificial neural network processor further includes:
   a primary computation module connected with a branch processing module,
   wherein the branch processing module is further connected to multiple secondary processing modules, and
   wherein the branch processing module is configured to forward data or instructions between the primary computation module and the secondary processing modules.

5. A method for data sharing, comprising:
   transmitting, by a second processing module to a first processing module, a request signal that includes a data address in a first internal storage unit in the first processing module,
      wherein each of the first processing module and the second processing module includes a physical processor that includes an artificial neural network processor configured to perform artificial neural network forward computations and
      wherein the artificial neural network processor includes an instruction caching unit configured to read an instruction from a Direct Memory Access (DMA) and cache the read instruction;
   retrieving, by the first processing module, upon receiving the request signal, data at the data address in the first internal storage unit;
   transmitting, by the first processing module, the retrieved data to the second processing module;
   reading, by a controlling unit of the artificial neural network processor, the instruction from the instruction caching unit and decode the instruction into one or more microinstructions;
   transmitting, by a primary computation module of the artificial neural network processor, an input neuron vector of a current layer to one or more secondary computation modules via an H tree module for reverse training of each layer of a neural network;
   merging, by the H tree module, one or more output neuron values from the one or more secondary computation modules into an intermediate result vector; and
   generating, by the primary computation module, a final result vector based on the intermediate result vector.

6. The method of claim 5, further comprising transmitting, by the first processing module,
   an acknowledge signal to the second processing module upon receiving the request signal.

7. The method of claim 5, further comprising writing, by the DMA, data into corresponding data caching units of the primary computation module and each secondary computation module from an external address space.

8. The method of claim 5, further comprising reading, by the DMA, data into the external address space from the data caching units.

9. The method of claim 5, wherein the artificial neural network processor further includes a primary computation module connected with a branch processing module, wherein the branch processing module is further connected to multiple secondary processing modules.

10. The method of claim 9, further comprising: forwarding, by the branch processing module, data or instructions between the primary computation module and the secondary processing modules.

* * * * *